(12) United States Patent
Yoshida et al.

(10) Patent No.: US 12,119,227 B2
(45) Date of Patent: Oct. 15, 2024

(54) SEMICONDUCTOR APPARATUS AND MANUFACTURING METHOD OF SEMICONDUCTOR APPARATUS

(71) Applicant: FUJI ELECTRIC CO., LTD., Kawasaki (JP)

(72) Inventors: Kosuke Yoshida, Matsumoto (JP); Takashi Yoshimura, Matsumoto (JP); Hiroshi Takishita, Matsumoto (JP); Misaki Uchida, Matsumoto (JP); Michio Nemoto, Matsumoto (JP); Nao Suganuma, Matsumoto (JP); Motoyoshi Kubouchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 332 days.

(21) Appl. No.: 17/456,382

(22) Filed: Nov. 24, 2021

(65) Prior Publication Data

US 2022/0084828 A1   Mar. 17, 2022

Related U.S. Application Data

(63) Continuation of application No. PCT/JP2020/046167, filed on Dec. 10, 2020.

(30) Foreign Application Priority Data

| Dec. 18, 2019 | (JP) | ................................ | 2019-228409 |
| May 19, 2020 | (JP) | ................................ | 2020-087349 |
| Nov. 12, 2020 | (JP) | ................................ | 2020-189026 |

(51) Int. Cl.
*H01L 29/36* (2006.01)
*H01L 21/265* (2006.01)
(Continued)

(52) U.S. Cl.
CPC ........ *H01L 21/26513* (2013.01); *H01L 22/10* (2013.01); *H01L 29/36* (2013.01); *H01L 29/7397* (2013.01)

(58) Field of Classification Search
CPC .............. H01L 21/26513; H01L 22/10; H01L 29/7397; H01L 22/12; H01L 21/26506;
(Continued)

(56) References Cited

U.S. PATENT DOCUMENTS

| 5,505,157 | A | * | 4/1996 | Hara | ....................... | C30B 29/06 |
| | | | | | | 257/E21.321 |
| 2008/0315364 | A1 | * | 12/2008 | Nemoto | .................. | H01L 29/32 |
| | | | | | | 257/E29.328 |

(Continued)

FOREIGN PATENT DOCUMENTS

| CN | 107004723 A | 8/2017 |
| CN | 107408581 A | 11/2017 |

(Continued)

OTHER PUBLICATIONS

International Search Report and (ISA/237) Written Opinion of the International Search Authority for International Patent Application No. PCT/JP2020/046167, mailed by the Japan Patent Office on Mar. 2, 2021.

(Continued)

*Primary Examiner* — Shahed Ahmed

(57) ABSTRACT

Provided is a semiconductor apparatus including: a first peak of a hydrogen chemical concentration disposed on the lower surface side of the semiconductor substrate; and a flat portion disposed on the upper surface side of the semiconductor substrate with respect to the first peak, containing a hydrogen donor, and having a substantially (almost) flat donor concentration distribution in a depth direction. An oxygen contribution ratio indicating a ratio of an oxygen chemical concentration contributing to generation of the (Continued)

hydrogen donor in the oxygen chemical concentration of the oxygen ranges from $1\times10^{-5}$ to $7\times10^{-4}$. A concentration of the oxygen contributing to generation of the hydrogen donor in the flat portion is lower than the hydrogen chemical concentration. A hydrogen donor concentration in the flat portion ranges from $2\times10^{12}/cm^3$ to $5\times10^{14}/cm^3$.

13 Claims, 46 Drawing Sheets

(51) Int. Cl.
*H01L 21/66* (2006.01)
*H01L 29/739* (2006.01)

(58) Field of Classification Search
CPC ........... H01L 29/66348; H01L 29/0619; H01L 29/0638; H01L 29/0696; H01L 29/0834; H01L 29/404; H01L 29/36–365; H01L 29/04–045; H01L 21/02433; H01L 21/02675–02686; H01L 29/30–34
See application file for complete search history.

(56) References Cited

U.S. PATENT DOCUMENTS

| | | |
|---|---|---|
| 2009/0224284 A1 | 9/2009 | Nemoto |
| 2013/0249058 A1 | 9/2013 | Neidhart |
| 2014/0217407 A1 | 8/2014 | Mizushima |
| 2015/0050754 A1 | 2/2015 | Ploss |
| 2015/0179441 A1 | 6/2015 | Onozawa |
| 2015/0214347 A1 | 7/2015 | Falck |
| 2015/0270132 A1 | 9/2015 | Laven |
| 2015/0357229 A1 | 12/2015 | Schulze |
| 2015/0371858 A1 | 12/2015 | Laven |
| 2016/0141399 A1 | 5/2016 | Jelinek |
| 2016/0172438 A1 | 6/2016 | Jelinek |
| 2016/0329398 A1 | 11/2016 | Weber |
| 2016/0329401 A1 | 11/2016 | Laven |
| 2016/0372541 A1 | 12/2016 | Onozawa |
| 2017/0005163 A1 | 1/2017 | Schwagmann |
| 2017/0062568 A1 | 3/2017 | Caspary |
| 2017/0271447 A1 | 9/2017 | Tamura |
| 2018/0005829 A1 | 1/2018 | Takishita |
| 2018/0005831 A1 | 1/2018 | Schulze |
| 2018/0019306 A1 | 1/2018 | Laven |
| 2018/0122895 A1 | 5/2018 | Jelinek |
| 2019/0067462 A1 | 2/2019 | Tamura |
| 2020/0194562 A1 | 6/2020 | Yoshimura |
| 2021/0082702 A1 | 3/2021 | Agata |
| 2021/0104407 A1 | 4/2021 | Meguro |

FOREIGN PATENT DOCUMENTS

| | | |
|---|---|---|
| JP | 2009188336 A | 8/2009 |
| JP | 6109432 B2 | 4/2017 |
| WO | 2014065080 A1 | 5/2014 |
| WO | 2016042954 A1 | 3/2016 |
| WO | 2016157935 A1 | 10/2016 |
| WO | 2016204227 A1 | 12/2016 |
| WO | 2017047276 A1 | 3/2017 |
| WO | 2018092788 A1 | 5/2018 |
| WO | 2019181152 A1 | 9/2019 |
| WO | 2019181852 A1 | 9/2019 |
| WO | 2020080295 A1 | 4/2020 |
| WO | 2020138218 A1 | 7/2020 |

OTHER PUBLICATIONS

Office Action issued for related Chinese Application 202080038918.9, issued by The State Intellectual Property Office of People's Republic of China on Jul. 27, 2024.

* cited by examiner

SEMICONDUCTOR APPARATUS AND MANUFACTURING METHOD OF SEMICONDUCTOR APPARATUS

The contents of the following Japanese and PCT patent applications are incorporated herein by reference:
NO. 2019-228409 filed in JP on Dec. 18, 2019,
No. 2020-087349 filed in JP on May 19, 2020,
No. 2020-189026 filed in JP on Nov. 12, 2020 and
No. PCT/JP2020/046167 filed on Dec. 10, 2020.

BACKGROUND

1. Technical Field

The present invention relates to a semiconductor apparatus and a manufacturing method.

2. Related Art

Conventionally, there is known a technique of forming a donor by implanting hydrogen into a predetermined depth of a semiconductor substrate and diffusing the hydrogen to adjust substrate resistance (for example, Patent Literature 1).
Patent Literature 1: Specification of US Patent Application Publication No. 2018/0019306

Problems to be Solved

The donor concentration of the semiconductor substrate is preferably adjusted with high accuracy.

General Disclosure

In order to solve the above problem, a first aspect of the present invention provides a semiconductor apparatus including a semiconductor substrate having an upper surface and a lower surface and containing oxygen. The semiconductor apparatus may include a first peak of a hydrogen chemical concentration disposed on the lower surface side of the semiconductor substrate. The semiconductor apparatus may include a flat portion which is disposed on the upper surface side of the semiconductor substrate with respect to the first peak, contains a hydrogen donor, and has a substantially (almost) flat donor concentration distribution in a depth direction of the semiconductor substrate. An oxygen contribution ratio indicating a ratio of an oxygen chemical concentration contributing to generation of the hydrogen donor to the oxygen chemical concentration of the oxygen may range from $1\times10^{-5}$ to $7\times10^{-4}$. A concentration of the oxygen contributing to generation of the hydrogen donor in the flat portion may be lower than the hydrogen chemical concentration. A hydrogen donor concentration in the flat portion may range from $1\times10^{12}/cm^3$ to $5\times10^{14}/cm^3$.

The oxygen contribution ratio may be $5\times10^{-4}$ or less.
The oxygen contribution ratio may be $1\times10^{-4}$ or more.
The semiconductor substrate may contain a bulk donor. A donor concentration of the flat portion may be higher than a bulk donor concentration.

The semiconductor apparatus may include a second peak of the chemical concentration of hydrogen or helium disposed on the upper surface side of the semiconductor substrate. The flat portion may be disposed on the lower surface side of the semiconductor substrate with respect to the second peak. A hydrogen contribution ratio indicating a ratio of the hydrogen chemical concentration contributing to generation of the hydrogen donor in the hydrogen chemical concentration may range from 0.001 to 0.3. A vacancy concentration of the flat portion may range from $1\times10^{11}/cm^3$ to $1\times10^{14}/cm^3$.

The hydrogen chemical concentration of the first peak may be higher than the hydrogen chemical concentration of the second peak.

An oxygen chemical concentration in the flat portion may be $1\times10^{17}$ atoms/cm$^3$ or more.

A carbon chemical concentration in the flat portion may range from $1\times10^{13}$ atoms/cm$^3$ to $1\times10^{16}$ atoms/cm$^3$.

A sum of a value obtained by multiplying the oxygen chemical concentration in the flat portion by the oxygen contribution ratio and the vacancy concentration of the flat portion may be defined as a first value of the hydrogen donor concentration. A difference obtained by subtracting the bulk donor concentration from the donor concentration of the flat portion may be defined as a second value of the hydrogen donor concentration. A ratio of the first value of the hydrogen donor concentration to the second value of the hydrogen donor concentration may range from 0.1 to 10.

A second aspect of the present invention provides a semiconductor apparatus including a semiconductor substrate having an upper surface and a lower surface and containing oxygen. The semiconductor apparatus may include a first peak of a hydrogen chemical concentration disposed on the lower surface side of the semiconductor substrate. The semiconductor apparatus may include a flat portion which is disposed on the upper surface side of the semiconductor substrate with respect to the first peak, contains a hydrogen donor, and has a substantially (almost) flat donor concentration distribution in a depth direction of the semiconductor substrate. The semiconductor substrate may contain a bulk donor. A donor concentration of the flat portion may be higher than a bulk donor concentration. A sum of a value obtained by multiplying an oxygen chemical concentration in the flat portion by an oxygen contribution ratio indicating a ratio of the oxygen chemical concentration contributing to generation of the hydrogen donor in the oxygen chemical concentration of the oxygen and a vacancy concentration of the flat portion may be defined as a first value of the hydrogen donor concentration. A difference obtained by subtracting the bulk donor concentration from the donor concentration of the flat portion may be defined as a second value of the hydrogen donor concentration. A ratio of the first value of the hydrogen donor concentration to the second value of the hydrogen donor concentration may range from 0.1 to 10.

A third aspect of the present invention provides a semiconductor apparatus including a semiconductor substrate having an upper surface and a lower surface and containing oxygen and carbon. The semiconductor apparatus may include a first peak of a hydrogen chemical concentration disposed on the lower surface side of the semiconductor substrate. The semiconductor apparatus may include a flat portion which is disposed on the upper surface side of the semiconductor substrate with respect to the first peak, contains a hydrogen donor, and has a substantially (almost) flat donor concentration distribution in a depth direction of the semiconductor substrate. The semiconductor substrate may contain a bulk donor. A donor concentration of the flat portion may be higher than a bulk donor concentration. A sum of a value obtained by multiplying an oxygen chemical concentration in the flat portion by an oxygen contribution ratio indicating a ratio of the oxygen chemical concentration contributing to generation of the hydrogen donor in the oxygen chemical concentration of the oxygen, a value obtained by multiplying a carbon chemical concentration in the flat portion by a carbon contribution ratio indicating a ratio of the carbon chemical concentration contributing to generation of the hydrogen donor in the carbon chemical concentration of the carbon, and a vacancy concentration of the flat portion may be defined as a third value of a hydrogen donor concentration. A difference obtained by subtracting the bulk donor concentration from the donor concentration of the flat portion may be defined as a second value of the hydrogen donor concentration. A ratio of the third value of the hydrogen donor concentration to the second value of the hydrogen donor concentration may range from 0.1 to 10.

A fourth aspect of the present invention provides a manufacturing method of a semiconductor apparatus. The manufacturing method may include measuring an oxygen chemical concentration of a semiconductor substrate having an upper surface and a lower surface. The manufacturing method may include implanting a charged particle beam from the lower surface of the semiconductor substrate so as to pass through half or more of a thickness of the semiconductor substrate in a depth direction. The manufacturing method may include performing heat treatment on the semiconductor substrate after implanting the charged particle beam. At least one of an implantation condition of the charged particle beam in the implanting of the charged particle beam and a heat treatment condition in the performing of heat treatment may be adjusted according to the oxygen chemical concentration.

In the measuring, a carbon chemical concentration of the semiconductor substrate may be further measured. In the implanting of the charged particle beam, the implantation condition of the charged particle beam may be adjusted according to the oxygen chemical concentration and the carbon chemical concentration.

At a predetermined depth position of the semiconductor substrate, when a concentration of hydrogen donors to be generated by the manufacturing method is $N_{VOH1}$, a concentration of the hydrogen donors actually generated is $N_{VOH2}$, a vacancy concentration formed by the implanting of the charged particle beam is $N_V$, an oxygen chemical concentration is $C_{OX}$, a carbon chemical concentration is $C_C$, an oxygen contribution ratio indicating a ratio of the oxygen chemical concentration contributing to generation of the hydrogen donor in the oxygen chemical concentration is $\xi$, and a carbon contribution ratio indicating a ratio of the carbon chemical concentration contributing to generation of the hydrogen donor in the carbon chemical concentration is $\eta$, the following relationships may be satisfied:

$$N_{VOH1} = N_V + \xi C_{OX} + \eta C_C; \text{ and}$$

$$0.1 \leq N_{VOH1}/N_{VOH2} \leq 10.$$

In the implanting, hydrogen ions may be implanted as the charged particle beam.

The manufacturing method may include implanting hydrogen ions into the lower surface side of the semiconductor substrate before the performing of heat treatment.

The manufacturing method may include introducing oxygen into the semiconductor substrate.

The implantation condition of hydrogen ions in the implanting of hydrogen may be adjusted on the basis of the oxygen chemical concentration of the semiconductor substrate.

The implantation condition of hydrogen ions in the implanting of hydrogen and the heat treatment condition in the performing of heat treatment may be adjusted on the basis of the implantation depth of the charged particle beam in the implanting of the charged particle beam.

Introducing oxygen into the semiconductor substrate may be included.

At least one of the implantation condition of the charged particle beam in the implanting of the charged particle beam and the heat treatment condition in the performing of heat treatment may be adjusted further on the basis of the bulk donor concentration of the semiconductor substrate.

The manufacturing method may include grinding the semiconductor substrate. The manufacturing method may include measuring the thickness of the semiconductor substrate after grinding. At least one of the implantation condition of the charged particle beam in the implanting of the charged particle beam and the heat treatment condition in the performing of heat treatment may be adjusted further on the basis of the thickness of the semiconductor substrate.

The implantation condition may be adjusted for each of a plurality of semiconductor substrates in the implanting of the charged particle beam. The heat treatment condition may be adjusted in common for the plurality of semiconductor substrates in the performing of heat treatment.

The implantation condition of hydrogen ions in the implanting of hydrogen may be adjusted on the basis of the thickness of the semiconductor substrate.

The thickness of the semiconductor substrate in an edge termination structure portion of the semiconductor substrate may be measured in the measuring of the thickness of the semiconductor substrate.

In a fifth aspect of the present invention, a manufacturing method of a semiconductor apparatus is provided. The manufacturing method may include acquiring an impurity concentration of a semiconductor substrate having an upper surface and a lower surface. The manufacturing method may include implanting a charged particle beam from the lower surface of the semiconductor substrate so as to pass through half or more of a thickness of the semiconductor substrate in a depth direction. The manufacturing method may include performing heat treatment on the semiconductor substrate after implanting the charged particle beam. An implantation depth of the charged particle beam may be adjusted according to the impurity concentration in the implanting of the charged particle beam.

At least one of a bulk donor concentration, an oxygen chemical concentration, and a carbon chemical concentration of the semiconductor substrate may be acquired in the acquiring of the impurity concentration.

In the implanting of the charged particle beam, the implantation depth of the charged particle beam may be adjusted on the basis of at least one of an oxygen contribution ratio $\xi$ indicating a ratio of the oxygen chemical concentration contributing to generation of a hydrogen donor in the oxygen chemical concentration and a carbon contribution ratio $\eta$ indicating a ratio of a carbon chemical concentration contributing to generation of a hydrogen donor in the carbon chemical concentration.

The summary clause does not necessarily describe all necessary features of the embodiments of the present invention. The present invention may also be a sub-combination of the features described above.

DESCRIPTION OF EXEMPLARY EMBODIMENTS

Figure 1:
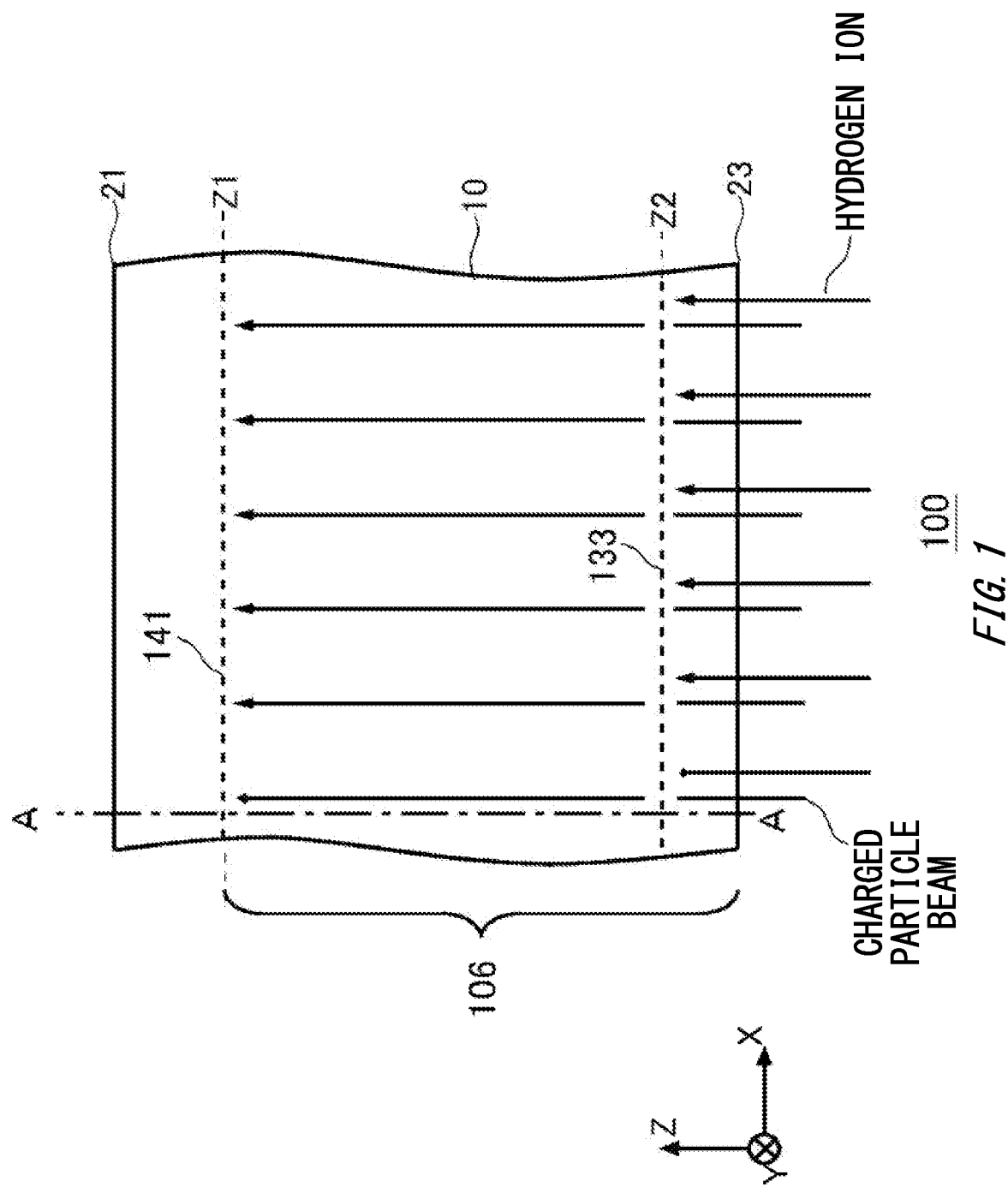
FIG. 1 is a sectional view illustrating an example of a semiconductor apparatus 100.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to the depth direction of the semiconductor substrate is referred to as "upper", and the other side is referred to as "lower". One of two main surfaces of a substrate, a layer, or another member is referred to as an upper surface, and the other surface is referred to as a lower surface. The "upper" and "lower" directions are not limited to the gravity direction or the direction at the time of mounting the semiconductor apparatus.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not exclusively indicate the height direction with respect to the ground. The +Z axis direction and the −Z axis direction are opposite to each other. In a case where the positive and negative are not described and described as the Z axis direction, it means a direction parallel to the +Z axis and the −Z axis.

In the present specification, orthogonal axes parallel to the upper surface and the lower surface of the semiconductor substrate are defined as an X axis and a Y axis. An axis perpendicular to the upper surface and the lower surface of the semiconductor substrate is defined as a Z axis. In the present specification, the Z axis direction may be referred to as a depth direction. In addition, in the present specification, a direction parallel to the upper surface and the lower surface of the semiconductor substrate including the X axis and the Y axis may be referred to as a horizontal direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, the term "same" or "equal" may include a case where there is an error due to manufacturing variation or the like. The error is, for example, within 10%.

In the present specification, the conductivity type of the doping region doped with impurities is described as a P type or N type. In the present specification, the impurity may particularly mean either an N type donor or a P type acceptor, and may be described as a dopant. In the present specification, doping means introducing a donor or an acceptor into a semiconductor substrate to form a semiconductor exhibiting an N type conductivity type or a semiconductor exhibiting a P type conductivity type.

In the present specification, the doping concentration means the concentration of donors or the concentration of the acceptors in the thermal equilibrium state. In the present specification, the net doping concentration means the net concentration obtained by adding the donor concentration as the concentration of positive ions and the acceptor concentration as the concentration of negative ions including the polarity of charges. As an example, if the donor concentration is $N_D$ and the acceptor concentration is $N_A$, the net doping concentration at an arbitrary position is $N_D-N_A$. In the present specification, the net doping concentration may be simply referred to as a doping concentration.

The donor has a function of supplying electrons to the semiconductor. The acceptor has a function of receiving electrons from the semiconductor. The donor and acceptor are not limited to the impurities themselves. For example, a VOH defect in which vacancies (V), oxygen (O), and hydrogen (H) are bonded in a semiconductor functions as a donor for supplying electrons. In the present specification, the VOH defect may be referred to herein as a hydrogen donor.

In the present specification, when described as a P+ type or N+ type, it means that the doping concentration is higher than that of a P type or N type, and when described as a P− type or N− type, it means that the doping concentration is lower than that of the P type or N type. In addition, in the present specification, the description of the P++ type or N++ type means that the doping concentration is higher than that of the P+ type or N+ type. The unit system in the present specification is an SI unit system unless otherwise specified. The unit of length may be expressed in cm, but various calculations may be performed after conversion into meters (m).

In the present specification, the chemical concentration refers to the atomic density of impurities measured regardless of the state of electrical activation. The chemical concentration can be measured by, for example, secondary ion mass spectrometry (SIMS). The above-described net doping concentration can be measured by a voltage-capacitance measurement method (CV method). In addition, the carrier concentration measured by a spread resistance measurement method (SR method) may be a net doping concentration. The carrier concentration measured by the CV method or the SR method may be a value in a thermal equilibrium state. In addition, since the donor concentration is sufficiently larger than the acceptor concentration in the N type region, the carrier concentration in the region may be used as the donor concentration. Similarly, in the P type region, the carrier concentration in the region may be set as the acceptor concentration. In the present specification, the doping concentration of the N type region may be referred to as a donor concentration, and the doping concentration of the P type region may be referred to as an acceptor concentration.

In addition, in a case where the concentration distribution of the donor, acceptor, or net doping has a peak, the peak value may be the concentration of donors, acceptors, or net doping in the region. In a case where the concentration of donors, acceptors, or the net doping is substantially (almost) uniform or the like, an average value of the concentration of donors, acceptors, or the net doping in the corresponding region may be used as the concentration of donors, acceptors, or the net doping. In the present specification, atoms/$cm^3$ or/$cm^3$ is used for concentration display per unit volume. This unit is used for the donor or acceptor concentration or the chemical concentration in the semiconductor substrate. The expression of atoms may be omitted. Each concentration in the present invention may be a value at room temperature. As the value at room temperature, a value at 300 K (Kelvin) (about 26.9° C.) may be used as an example.

The carrier concentration measured by the SR method may be lower than the concentration of donors or acceptors. In a range where the current flows when measuring a spreading resistance, there is a case where the carrier mobility of the semiconductor substrate is lower than the value of the crystal state. The decrease in carrier mobility occurs by disorder of the crystal structure caused by a lattice defect or the like to make the carrier scatter.

The concentration of donors or acceptors calculated from the carrier concentration measured by the CV method or the SR method may be lower than the chemical concentration of elements indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen.

FIG. 1 is a sectional view illustrating an example of a semiconductor apparatus 100. The semiconductor apparatus 100 includes a semiconductor substrate 10. The semiconductor substrate 10 is a substrate formed of a semiconductor material. As an example, the semiconductor substrate 10 is a silicon substrate.

At least one of a transistor device such as an insulated gate bipolar transistor (IGBT) and a diode device such as a freewheeling diode (FWD) is formed on the semiconductor substrate 10. In FIG. 1, each electrode of the transistor device and the diode device and each region provided inside the semiconductor substrate 10 are omitted.

In the semiconductor substrate 10 of this example, bulk donors of an N type are distributed throughout. The bulk donor is a dopant donor approximately uniformly contained in an ingot during the production of the ingot from which the semiconductor substrate 10 is made. The bulk donor of this example is an element other than hydrogen. The dopant of the bulk donor is, for example, an element of Group V or Group VI, and is, for example, but not limited to, phosphorus, antimony, arsenic, selenium, or sulfur. The bulk donor in this example is phosphorus. The bulk donor is also contained in the P type region. The semiconductor substrate 10 may be a wafer cut out from a semiconductor ingot, or may be a chip obtained by dicing the wafer into individual pieces. The semiconductor ingot may be manufactured by either a Chokralski method (CZ method), a magnetic field applied Chokralski method (MCZ method), or a float zone method (FZ method). The ingot in this example is manufactured by the MCZ method.

The oxygen chemical concentration contained in the substrate manufactured by the MCZ method is, for example, $1 \times 10^{17}$ to $7 \times 10^{17}$ atoms/cm$^3$. The oxygen chemical concentration contained in the substrate manufactured by the FZ method is, for example, $1 \times 10^{15}$ to $5 \times 10^{16}$ atoms/cm$^3$. The bulk donor concentration may use a chemical concentration of bulk donors distributed throughout the semiconductor substrate 10, and may be a value between 90% and 100% of the chemical concentration. In the semiconductor substrate doped with dopants of groups V and VI such as phosphorus, the bulk donor concentration may range from $1 \times 10^{11}$/cm$^3$ to $3 \times 10^{13}$/cm$^3$. The bulk donor concentration of the semiconductor substrate doped with the dopants of groups V and VI ranges from preferably $1 \times 10^{12}$/cm$^3$ to $1 \times 10^{13}$/cm$^3$. As the semiconductor substrate 10, a non-doped substrate not containing a dopant such as phosphorus may be used. In that case, the bulk donor concentration ($N_{B0}$) of the non-doped substrate ranges from, for example, $1 \times 10^{10}$/cm$^3$ to $5 \times 10^{12}$/cm$^3$. The bulk donor concentration ($N_{B0}$) of the non-doped substrate is preferably $1 \times 10^{11}$/cm$^3$ or more. The bulk donor concentration ($N_{B0}$) of the non-doped substrate is preferably $5 \times 10^{12}$/cm$^3$ or less.

The semiconductor substrate 10 has an upper surface 21 and a lower surface 23. The upper surface 21 and the lower surface 23 are two main surfaces of the semiconductor substrate 10. In the present specification, an orthogonal axis in a plane parallel to the upper surface 21 and the lower surface 23 is defined as an X axis and a Y axis, and an axis perpendicular to the upper surface 21 and the lower surface 23 is defined as a Z axis.

A charged particle beam is implanted from the lower surface 23 into the semiconductor substrate 10 at a predetermined depth position Z1. In the present specification, the distance in the Z axis direction from the lower surface 23 may be referred to as a depth position. The depth position Z1 is a position where the distance in the Z axis direction from the lower surface 23 is Z1. The depth position Z1 is disposed on the upper surface 21 side of the semiconductor substrate 10. Implantation of the charged particle beam into the depth position Z1 means that an average distance (also referred to as a range) of charged particles passing through the inside of the semiconductor substrate 10 is Z1. The charged particles are accelerated by acceleration energy corresponding to the predetermined depth position Z1 and introduced into the semiconductor substrate 10.

A region where the charged particles have passed through the inside of the semiconductor substrate 10 is defined as a pass-through region 106. In the example of FIG. 1, a region from the lower surface 23 of the semiconductor substrate 10 to the depth position Z1 is the pass-through region 106. The charged particles are particles capable of forming lattice defects in the pass-through region 106. The charged particles are, for example, hydrogen ions, helium ions, or electrons. The charged particles may be implanted into the entire surface of the semiconductor substrate 10 in the XY plane, or may be implanted into only a partial region.

The semiconductor substrate 10 has a second peak 141 of the charged particle concentration at the depth position Z1. In this example, the charged particles are hydrogen. That is, the semiconductor substrate 10 of this example has the second peak 141 of the hydrogen chemical concentration at the depth position Z1. The second peak 141 is a peak in the hydrogen chemical concentration distribution in the depth direction (Z axis direction). The second peak may be a peak in the helium chemical concentration distribution.

In the pass-through region 106 through which the charged particles have passed in the semiconductor substrate 10, lattice defects mainly including vacancies such as monovacancies (V) and divacancies (VV) are formed by the charged particles passing therethrough. Atoms adjacent to the vacancies have dangling bonds. Lattice defects include interstitial atoms, dislocations, and the like, and may include donors and acceptors in a broad sense. However, in the present specification, lattice defects mainly including vacancies may be referred to as vacant-type lattice defects, vacant-type defects, or simply lattice defects. In addition, since many lattice defects are formed by implantation of charged particles into the semiconductor substrate 10, the crystallinity of the semiconductor substrate 10 may be strongly disturbed. In the present specification, this disturbance of crystallinity may be referred to as disorder.

In addition, oxygen is contained in the entire semiconductor substrate 10. The oxygen is introduced intentionally or unintentionally at the time of manufacturing a semiconductor ingot. Hydrogen is contained in at least a partial region of the pass-through region 106. The hydrogen may be intentionally implanted into the semiconductor substrate 10.

In this example, hydrogen ions are implanted into a depth position Z2 from the lower surface 23. The hydrogen ions in this example are protons. The semiconductor substrate 10 of this example has a first peak 133 of hydrogen chemical concentration at the depth position Z2. In FIG. 1, the second peak 141 and the first peak 133 are schematically indicated by broken lines. The depth position Z2 may be included in the pass-through region 106. The depth position Z2 in this example is disposed on the lower surface 23 side of the semiconductor substrate 10. Hydrogen implanted at the depth position Z1 may be diffused into the pass-through region 106, or hydrogen may be introduced into the pass-through region 106 by another method. In these cases, hydrogen ions may not be implanted into the depth position Z2.

After the pass-through region 106 is formed in the semiconductor substrate 10 and hydrogen ions are implanted into the semiconductor substrate 10, hydrogen (H), vacancies (V), and oxygen (O) are bonded inside the semiconductor substrate 10, and VOH defects are formed. In addition, the heat treatment of the semiconductor substrate 10 makes hydrogen diffuse to promote the formation of VOH defects. In addition, since hydrogen can be bonded to the vacancies by heat treatment after forming the pass-through region 106, it is possible to suppress release of hydrogen to the outside of the semiconductor substrate 10.

The VOH defect functions as a donor that supplies electrons. In the present specification, VOH defects may be referred to simply as hydrogen donors. In the semiconductor substrate 10 of this example, a hydrogen donor is formed in the pass-through region 106. The doping concentration of the hydrogen donor at each location is lower than the chemical concentration of hydrogen at each location. The ratio of the chemical concentration of hydrogen contributing to the doping concentration of hydrogen donors (VOH defects) to the chemical concentration of hydrogen is defined as a hydrogen contribution ratio. The hydrogen contribution ratio may be considered as a ratio of the concentration of hydrogen atoms constituting the VOH defect among the concentrations of all hydrogen atoms in a predetermined region (for example, the depth position from the lower surface or the upper surface). The hydrogen contribution ratio may be a value of 0.1% to 30% (that is, ranging from 0.001 to 0.3). In this example, the hydrogen contribution ratio is 1% to 5%. Note that, unless otherwise specified, in the present specification, VOH defects having a distribution similar to the chemical concentration distribution of hydrogen and VOH defects similar to the distribution of vacancy defects in the pass-through region 106 are also referred to as hydrogen donors or hydrogen as donors.

By forming a hydrogen donor in the pass-through region 106 of the semiconductor substrate 10, the donor concentration in the pass-through region 106 can be made higher than the bulk donor concentration. Usually, it is necessary to prepare the semiconductor substrate 10 having a predetermined bulk donor concentration in accordance with characteristics of an element to be formed on the semiconductor substrate 10, particularly a rated voltage or a breakdown voltage. On the other hand, according to the semiconductor apparatus 100 illustrated in FIG. 1, the donor concentration of the semiconductor substrate 10 can be adjusted by controlling the dose amount of charged particles. Therefore, the semiconductor apparatus 100 can be manufactured using a semiconductor substrate having a bulk donor concentration that does not correspond to the characteristics and the like of the element. The variation in the bulk donor concentration at the time of manufacturing the semiconductor substrate 10 is relatively large, but the dose amount of the charged particles can be controlled with relatively high accuracy. Therefore, the concentration of lattice defects generated by implanting charged particles can also be controlled with high accuracy, and the donor concentration in the pass-through region can be controlled with high accuracy.

The depth position Z1 may be disposed in a range of half or less of the thickness of the semiconductor substrate 10 with respect to the upper surface 21, or may be disposed in a range of ¼ or less of the thickness of the semiconductor substrate 10. The depth position Z2 may be disposed in a range of half or less of the thickness of the semiconductor substrate 10 with respect to the lower surface 23, or may be disposed in a range of ¼ or less of the thickness of the semiconductor substrate 10. However, the depth position Z1 and the depth position Z2 are not limited to these ranges.

Figure 2:
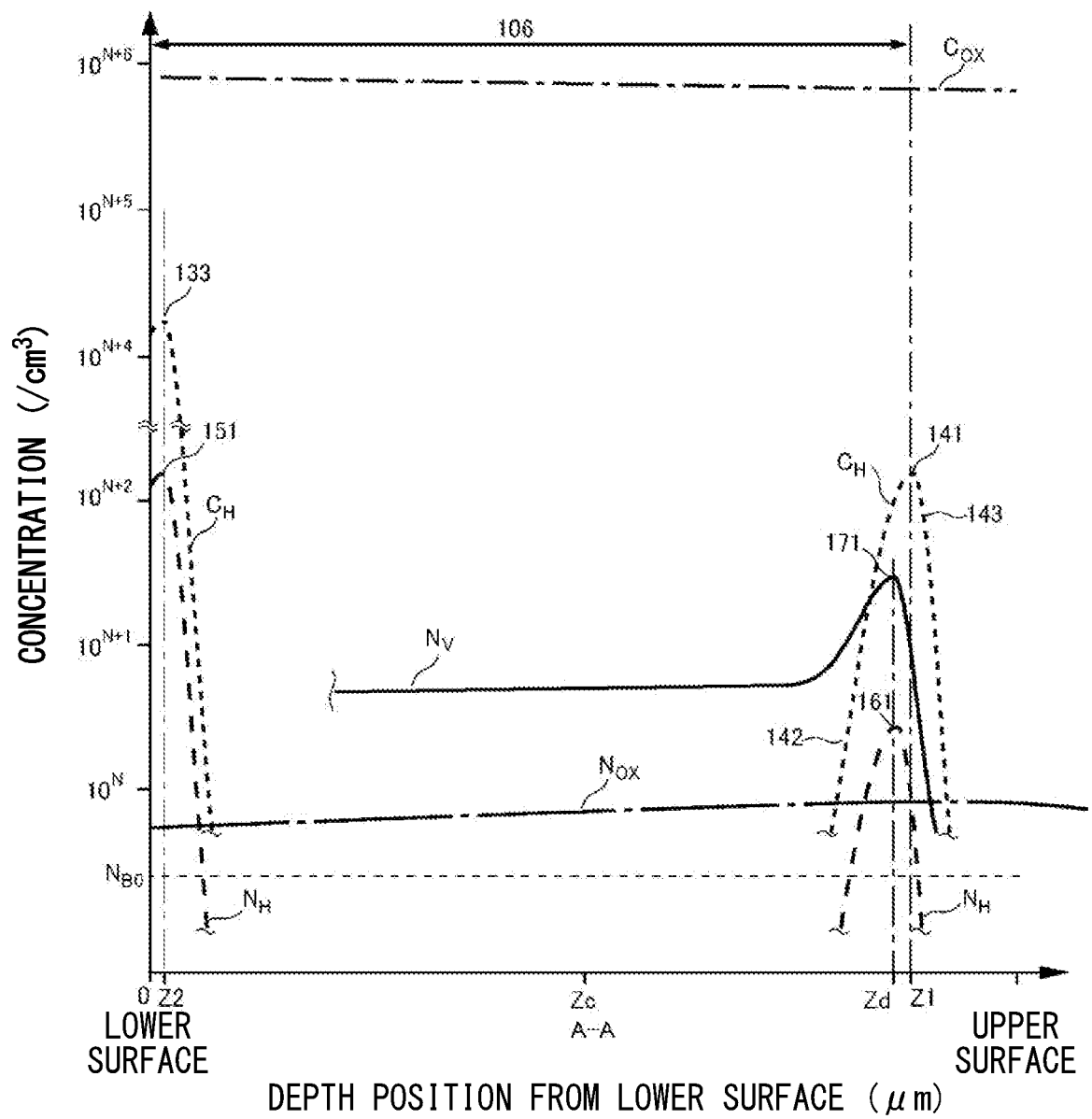
FIG. 2 illustrates a depth direction distribution of a hydrogen chemical concentration $C_H$, an oxygen chemical concentration $C_{OX}$, a vacancy concentration $N_V$, a contributing hydrogen concentration $N_H$, and a contributing oxygen concentration $N_{OX}$ at positions indicated by line A-A in FIG. 1.

FIG. 2 illustrates the depth direction distribution of the hydrogen chemical concentration $C_H$, the oxygen chemical concentration $C_{OX}$, the vacancy concentration $N_V$, the contributing hydrogen concentration $N_H$, and the contributing oxygen concentration $N_{OX}$ at positions indicated by the line A-A in FIG. 1. FIG. 2 illustrates each distribution immediately after the charged particles and hydrogen ions are implanted. That is, FIG. 2 illustrates each distribution after charged particles and hydrogen ions are implanted into the semiconductor substrate 10 and before heat treatment at a temperature higher than room temperature (25° C.) is performed.

In FIG. 2, the horizontal axis represents the depth position from the lower surface 23, and the vertical axis represents each concentration per unit volume on a logarithmic axis. The chemical concentration in FIG. 2 is measured by, for example, a SIMS method. In FIG. 2, the bulk donor concentration $N_{B0}$ is indicated by a broken line. The bulk donor concentration $N_{B0}$ may be uniform throughout the semiconductor substrate 10. Further, a central depth position in the depth direction of the semiconductor substrate 10 is defined as $Z_C$.

The distribution of the hydrogen chemical concentration $C_H$ has the second peak 141 at the depth position Z1 and the first peak 133 at the depth position Z2. The hydrogen chemical concentration $C_H$ shows a local maximum value at each of the depth positions Z1 and Z2. The second peak 141 and the first peak 133 of the hydrogen chemical concentration $C_H$ are 1000 times or more larger than the minimum value of the hydrogen chemical concentration $C_H$. The first peak 133 may be larger than the second peak 141. The first peak 133 may be 10 times or more, or 100 times or more than the second peak 141.

The distribution of the hydrogen chemical concentration $C_H$ has an upper tail 143 in which the hydrogen chemical concentration $C_H$ decreases from the second peak 141 toward the upper surface 21, and a lower tail 142 in which the hydrogen chemical concentration $C_H$ decreases from the second peak 141 toward the lower surface 23. In a case where hydrogen ions are implanted from the lower surface 23, the lower tail 142 is gentler than the upper tail 143. In the present specification, the term "the tail is gentle" means that a position that is a half value of the corresponding peak value is further away from the corresponding peak position.

The contributing hydrogen concentration $N_H$ is the concentration of hydrogen forming VOH defects. Since VOH defects include vacancies and oxygen in addition to hydrogen, the contributing hydrogen concentration $N_H$ may vary depending on the concentration of vacancies and oxygen. The contributing hydrogen concentration $N_H$ may be between 0.1% and 30% of the hydrogen chemical concentration $C_H$.

The distribution of the contributing hydrogen concentration $N_H$ is similar to the distribution of the hydrogen chemical concentration $C_H$. The contributing hydrogen concentration $N_H$ has a first contributing concentration peak 161 at or near the depth position Z1 and a second contributing concentration peak 151 at or near the depth position Z2.

Oxygen is often introduced at the time of manufacturing an ingot, and is often uniformly distributed inside the semiconductor substrate 10. The oxygen chemical concentration $C_{OX}$ may be uniform throughout the semiconductor substrate 10. In another example, the oxygen chemical concentration $C_{OX}$ may monotonically increase or monotonically decrease from the lower surface 23 toward the upper surface 21 of the semiconductor substrate 10. In addition, oxygen in the vicinity of the upper surface 21 or the lower surface 23 of the semiconductor substrate 10 may be released to the outside of the semiconductor substrate 10. The oxygen chemical concentration $C_{OX}$ may monotonously decrease toward the upper surface 21 and the lower surface 23 in the vicinity of the upper surface 21 and the lower surface 23. The vicinity of the upper surface 21 and the lower surface 23 is, for example, a region within a distance of 1 μm from the upper surface 21 or the lower surface 23, but is not limited thereto. Other than in the vicinity of the upper surface 21 and the lower surface 23, the oxygen chemical concentration $C_{OX}$ may be uniform as described above, and may monotonically increase or decrease.

The oxygen chemical concentration $C_{OX}$ may range from $3 \times 10^{15}$ atoms/cm$^3$ to $2 \times 10^{18}$ atoms/cm$^3$. Note that, in the present specification, in a case where the oxygen chemical concentration $C_{OX}$ of the semiconductor substrate 10 is defined, the whole between the second peak 141 and the first peak 133 satisfies the definition of the oxygen concentration unless otherwise specified. The whole between the second peak 141 and the lower surface 23 may satisfy the definition of the oxygen concentration, and the whole of the semiconductor substrate 10 may satisfy the definition of the oxygen concentration. The oxygen chemical concentration $C_{OX}$ may be $1 \times 10^{16}$ atoms/cm$^3$ or more, or $1 \times 10^{17}$ atoms/cm$^3$ or more. The oxygen chemical concentration $C_{OX}$ may be $1 \times 10^{18}$ atoms/cm$^3$ or less, or $1 \times 10^{17}$ atoms/cm$^3$ or less.

The contributing oxygen concentration $N_{OX}$ refers to the concentration of oxygen that forms VOH defects. Since VOH defects include vacancies and hydrogen in addition to oxygen, the contributing oxygen concentration $N_{OX}$ may vary depending on the concentration of vacancies and hydrogen. In the present specification, the ratio between the contributing oxygen concentration $N_{OX}$ and the oxygen chemical concentration $C_{OX}$ is defined as an oxygen contribution ratio $\xi$. That is, $=N_{OX}/C_{OX}$. The oxygen contribution ratio $\xi$ may be considered as a ratio of the concentration of oxygen atoms constituting the VOH defect among the concentrations of all oxygen atoms in a predetermined region (for example, the lower surface or the depth position from the upper surface). $\xi$ ranges from 0 to 1. The unit of the oxygen contribution ratio is a dimensionless amount.

The distribution of the contributing oxygen concentration $N_{OX}$ may be similar to the distribution of the oxygen chemical concentration $C_{OX}$. For example, the contributing oxygen concentration $N_{OX}$ may be uniform in the depth direction of the semiconductor substrate 10, and may monotonically increase or decrease. Alternatively, the contributing oxygen concentration $N_{OX}$ may have a concentration distribution having a peak at a predetermined depth position.

The vacancy concentration $N_V$ has a vacancy peak 171 at a depth position Zd. The depth position Zd may be the same as the depth position Z1, and may be disposed slightly closer to the lower surface 23 than the depth position Z1. The contributing hydrogen concentration $N_H$ may have the first contributing concentration peak 161 at the same depth position as the vacancy concentration $N_V$.

If charged particles are implanted into the semiconductor substrate 10, damage is introduced into a region from the implantation surface of the semiconductor substrate 10 to a range portion of the charged particles. The damage refers to disturbance of a crystal lattice, and may be in an amorphous state in addition to vacancies and dislocations. The vacancy concentration $N_V$ may also have a peak at the depth position Z2. The vacancy concentration $N_V$ may be substantially (almost) uniform, monotonically increasing, or monotonically decreasing between the two peaks. In a case where the charged particles are electrons, the vacancy concentration $N_V$ may be substantially (almost) uniform from the upper surface to the lower surface of the semiconductor substrate 10, may increase monotonically, may decrease monotonically, or may have a gentle distribution having a peak at a predetermined depth position. The vacancy concentration $N_V$ can be calculated using, for example, software known as Transport of Ions in Matter (TRIM) (see, for example, http://www.srim.org/. In http://srim.org/SRIM/SRIM %2008.pdf and http://srim.org/SRIM/SRIM %2009.pdf, a TRIM manual is disclosed. Part 2 of the manual describes a method for calculating the vacancy concentration). It is considered that most of the vacancies are not terminated with hydrogen before the heat treatment.

Figure 3:
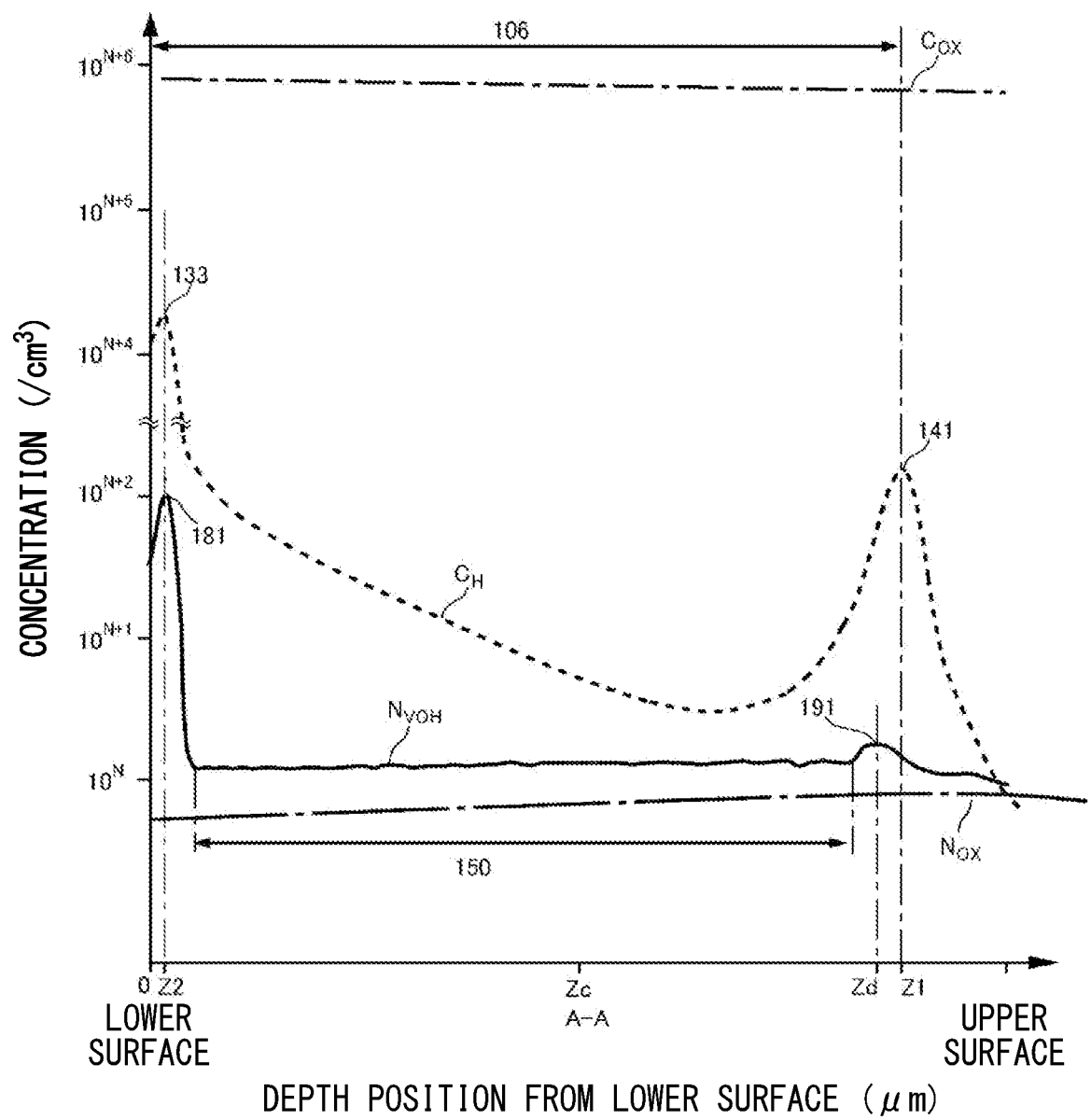
FIG. 3 illustrates a depth direction distribution of the hydrogen chemical concentration $C_H$, the oxygen chemical concentration $C_{OX}$, the contributing oxygen concentration $N_{OX}$, and a VOH defect concentration $N_{VOH}$ after heat treatment.

FIG. 3 illustrates the depth direction distributions of the hydrogen chemical concentration $C_H$, the oxygen chemical concentration $C_{OX}$, the contributing oxygen concentration $N_{OX}$, and the VOH defect concentration $N_{VOH}$ after the heat treatment. By the heat treatment, hydrogen diffuses from the second peak 141 and the first peak 133 to the upper surface 21 side and the lower surface 23 side. Even after the heat treatment, the magnitude relationship, ratio, value, and the like of the concentration of each peak and the oxygen chemical concentration may be the same as those before the heat treatment illustrated in FIG. 2. As a result, the hydrogen chemical concentration $C_H$ between the second peak 141 and the first peak 133 increases. In this example, since the high concentration first peak 133 is provided, more hydrogen is diffused from the first peak 133. Therefore, in the region from the depth position Z2 toward the depth position Z1, the hydrogen chemical concentration $C_H$ monotonously decreases over half or more of the length. The hydrogen chemical concentration $C_H$ may monotonously decrease from the depth position Z2 to the upper surface 21 side of the depth position $Z_C$.

By the heat treatment, hydrogen terminates at dangling bonds in the vacancies. As a result, the donors of VOH defects (termination dangling bonds) are formed. The VOH defect concentration $N_{VOH}$ depends on the contributing hydrogen concentration $N_H$, the contributing oxygen concentration $N_{OX}$, and the vacancy concentration $N_V$. The VOH defect concentration $N_{VOH}$ in this example has a first VOH peak 191 in the vicinity of the depth position Z1 and a second VOH peak 181 in the vicinity of the depth position Z2. The first VOH peak 191 may be disposed at the depth position Zd. In this example, the second VOH peak 181 is at a higher concentration than the first VOH peak 191.

In addition, the semiconductor substrate 10 has a flat portion 150 between the depth position Z1 and the depth position Z2. The flat portion 150 is a region where the distribution of the VOH defect concentration $N_{VOH}$ is substantially (almost) flat. The flat portion 150 may be provided over half or more of the length between the depth position Z1 and the depth position Z2, or may be provided over a length of 75% or more.

In the flat portion 150, the contributing oxygen concentration $N_{OX}$ is smaller than the hydrogen chemical concentration $C_H$. In this case, as the hydrogen chemical concentration $C_{OX}$, a minimum value in the flat portion 150 may be used. The contributing oxygen concentration $N_{OX}$ may be 10% or less of the hydrogen chemical concentration $C_{OX}$.

Figure 4:
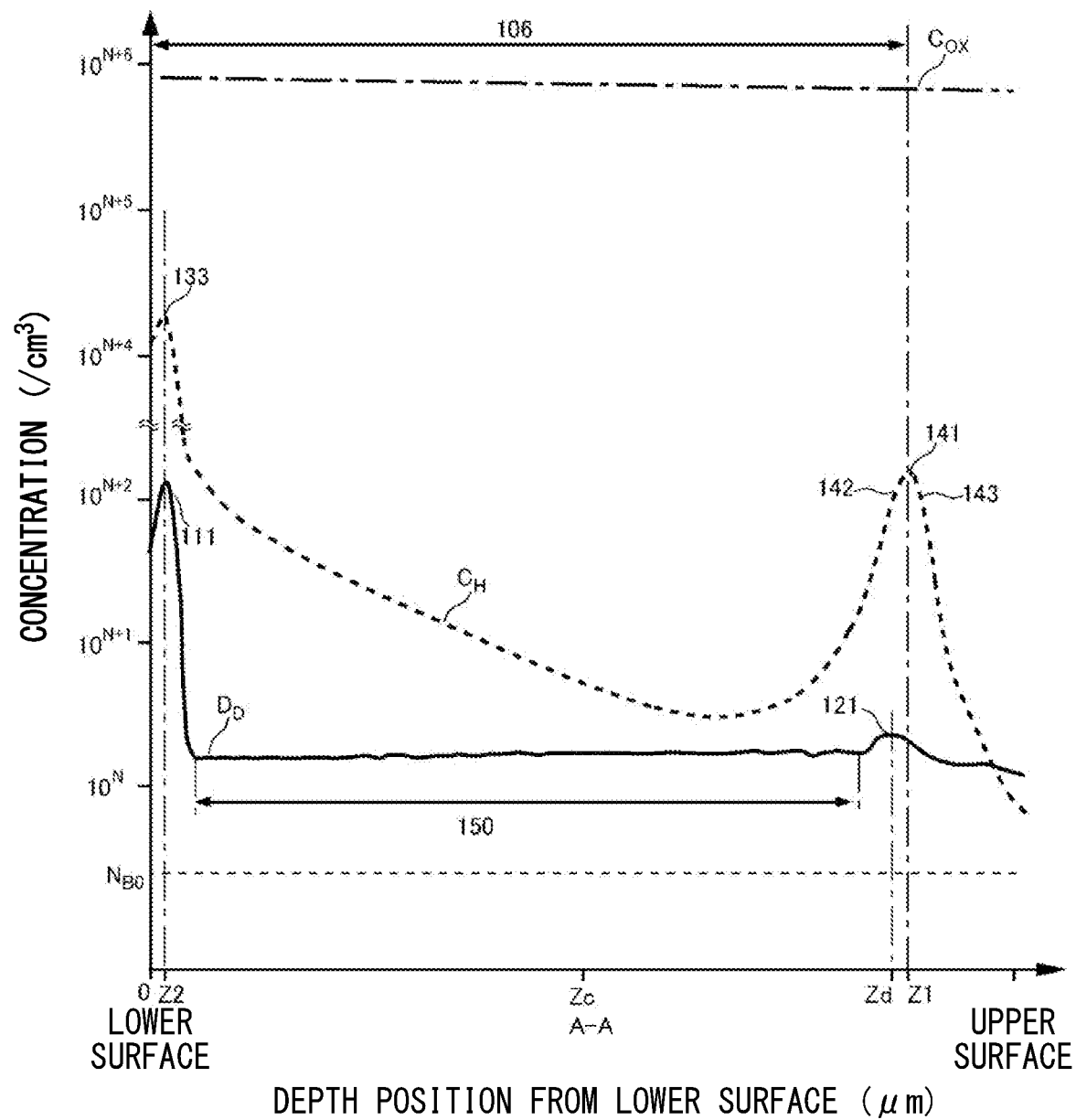
FIG. 4 is a diagram illustrating an example of the distribution of a donor concentration $D_D$ after heat treatment.

FIG. 4 is a diagram illustrating an example of the distribution of the donor concentration $D_D$ after the heat treatment. In FIG. 4, the hydrogen chemical concentration $C_H$, the oxygen chemical concentration $C_{OX}$, and the bulk donor concentration $N_{B0}$ are illustrated together. The hydrogen chemical concentration $C_H$ and the oxygen chemical concentration $C_{OX}$ are the same as in the example of FIG. 3. The bulk donor concentration $N_{B0}$ is the same as in the example of FIG. 2.

The donor concentration $D_D$ in this example is a concentration obtained by adding the VOH defect concentration $N_{VOH}$ to the bulk donor concentration $N_{B0}$. The donor concentration $D_D$ has a first donor peak 121 at the depth position Zd and a second donor peak 111 at the depth position Z2. In this example, the second donor peak 111 is at a higher concentration than the first donor peak 121. In addition, in the flat portion 150, the donor concentration $D_D$ is substantially (almost) flat. The donor concentration $D_D$ of the flat portion 150 is higher than the bulk donor concentration $N_{B0}$.

Figure 5A:
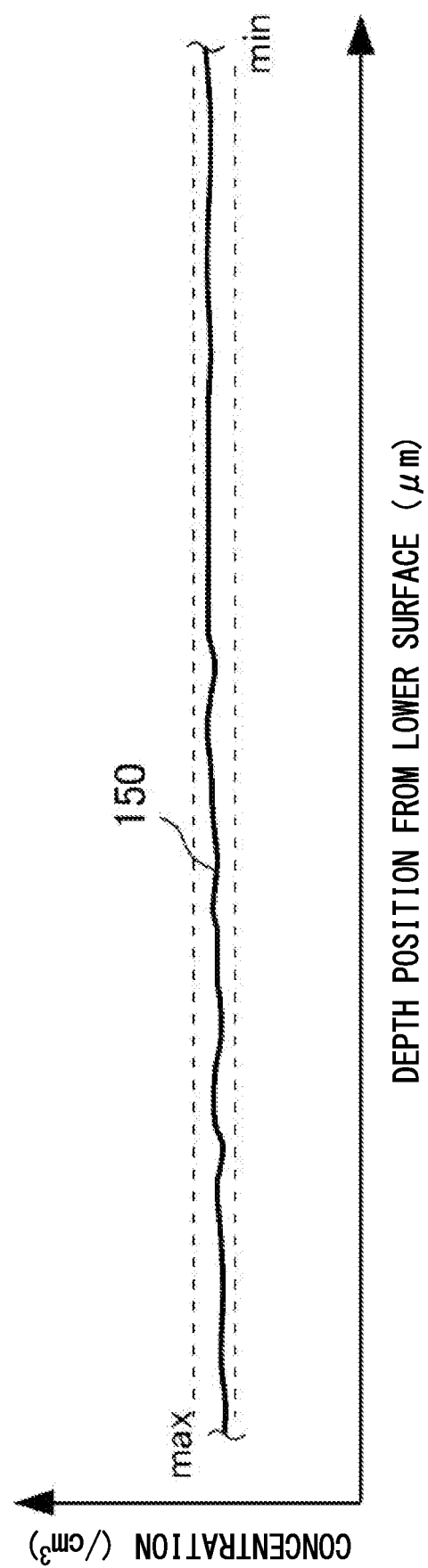
FIG. 5A is a diagram for explaining a flat portion 150.

FIG. 5A is a diagram for explaining the flat portion 150. The flat portion 150 is a portion where a region where the donor concentration $D_D$ is between a predetermined maximum value max and a predetermined minimum value min is continuous in the depth direction. As the maximum value max, the maximum value of the donor concentration in the region may be used. The minimum value min may be a value of 50%, a value of 70%, or a value of 90% of the maximum value max.

Alternatively, with respect to the average concentration of the donor concentration distribution in a predetermined range in the depth direction, the value of the donor concentration distribution may be within ±50%, within ±30%, or within ±10% of the average concentration of the donor concentration distribution. As described above, the VOH defect concentration $N_{VOH}$ in the flat portion 150 is also substantially (almost) flat like the donor concentration $D_D$.

Figure 5B:
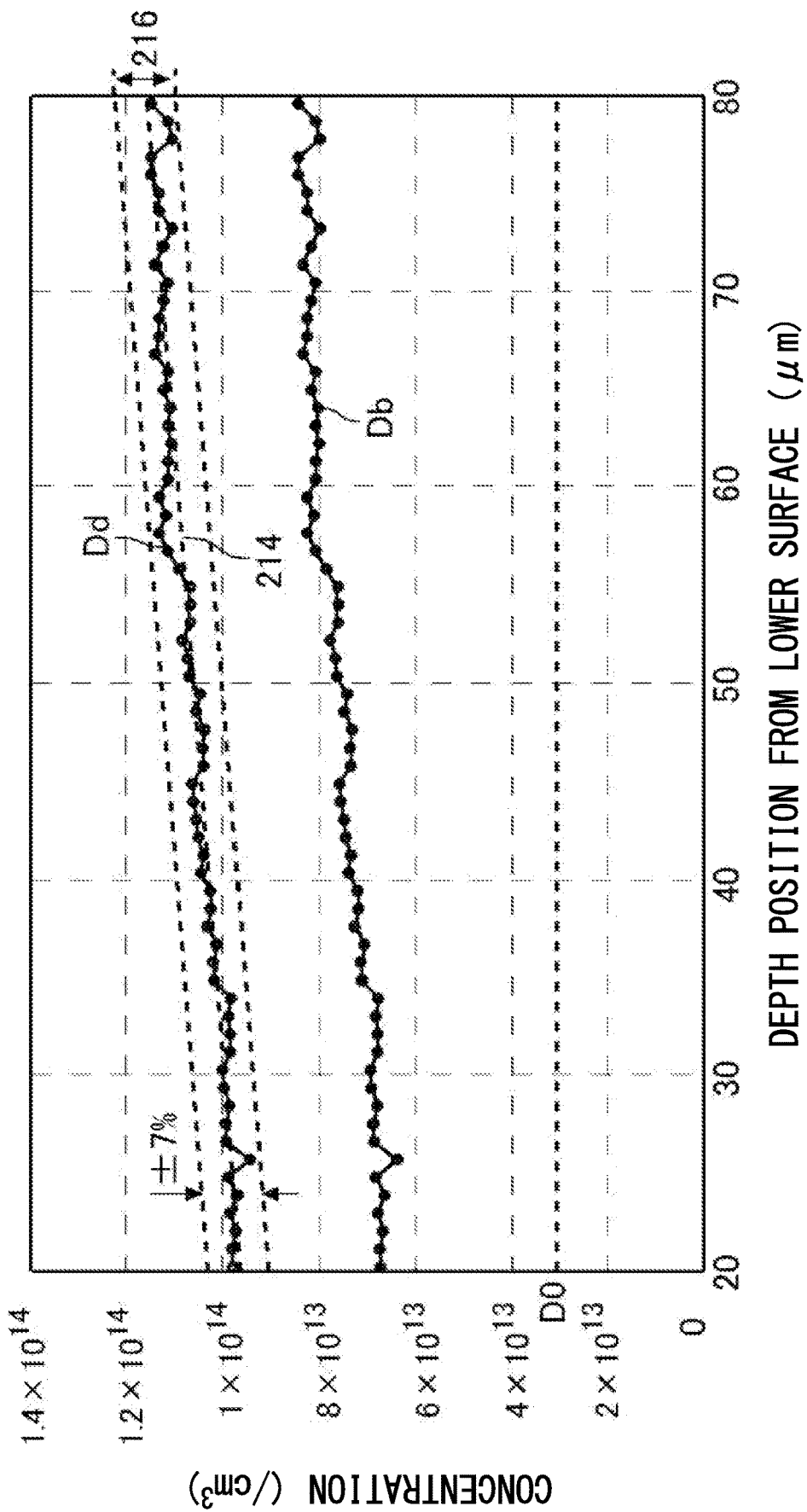
FIG. 5B is another distribution example of a bulk donor concentration D0, a hydrogen donor concentration Db, and a donor concentration Dd in the flat portion 150.

FIG. 5B is another distribution example of the bulk donor concentration D0, the hydrogen donor concentration Db, and the donor concentration Dd in the flat portion 150. This example is different from the example of FIG. 5A in that the flat portion 150 has a slope in the depth direction. The thickness of the semiconductor substrate 10 of this example is 120 μm. The vertical axis in this drawing is a linear scale. The depth of from 20 μm to 80 μm from the hydrogen ion-implanted surface is defined as a predetermined region. The predetermined region is a region through which hydrogen ions penetrate and in which there is no local peak in the donor concentration Dd. The thickness of the predetermined region in this example is 50% of the thickness of the semiconductor substrate 10. The bulk donor concentration D0 in this example is $3.1 \times 10^{13}/cm^3$, corresponding to 150 Ωcm. The sum of the bulk donor concentration D0 at each depth and the value of the hydrogen donor Db is the donor concentration Dd.

A distribution obtained by connecting the concentrations at both ends of the predetermined region with a straight line may be a linear approximation distribution. The linear approximation distribution may be a straight line obtained by fitting the concentration in the predetermined region with a linear function. In addition, the linear approximation distribution may be a straight line obtained by fitting a distribution excluding local peaks of each concentration distribution by a linear function. Further, a range of a band shape having a width of 30% of the value of the linear approximation distribution around the linear approximation distribution is referred to as a band-shaped range. The monotonically increasing or decreasing concentration distribution in a predetermined region refers to a state in which the concentration values at both ends of the predetermined region are different and the concentration distribution is included in the band-shaped range described above. The band-shaped range may have a width of 20% or 10% of the value of the linear approximation distribution.

The linear approximation distribution 214 of the donor concentration Dd is a distribution in which the concentration increases as the distance from the implantation surface increases. The concentration of vacancies formed in a predetermined region through which the hydrogen ions penetrate has a distribution in which the concentration increases as the distance from the implantation surface increases. Diffused hydrogen terminates at the dangling bond present in the formed vacancies, whereby a hydrogen donor concentration distribution according to the vacancy concentration distribution is formed. In this example, in a predetermined region through which hydrogen ions penetrate, the value of the donor concentration Dd varies by about ±7% with respect to the linear approximation distribution 214. The variation of the donor concentration Dd is defined as a band-shaped range 216. That is, the width of the band-shaped range 216 in this example is ±7% of the value of the linear approximation distribution 214. In a predetermined region having a thickness of 30% or more of the thickness of the semiconductor substrate 10, in a case where the distribution of the donor concentration Db exists within the band-shaped range 216, the distribution of the donor concentration Db may be a flat distribution. That is, this predetermined region may be a hydrogen donor flat region. The linear approximation distribution 214 of the donor concentration Dd may be a distribution in which the concentration decreases as the distance from the implantation surface increases.

Figure 5C:
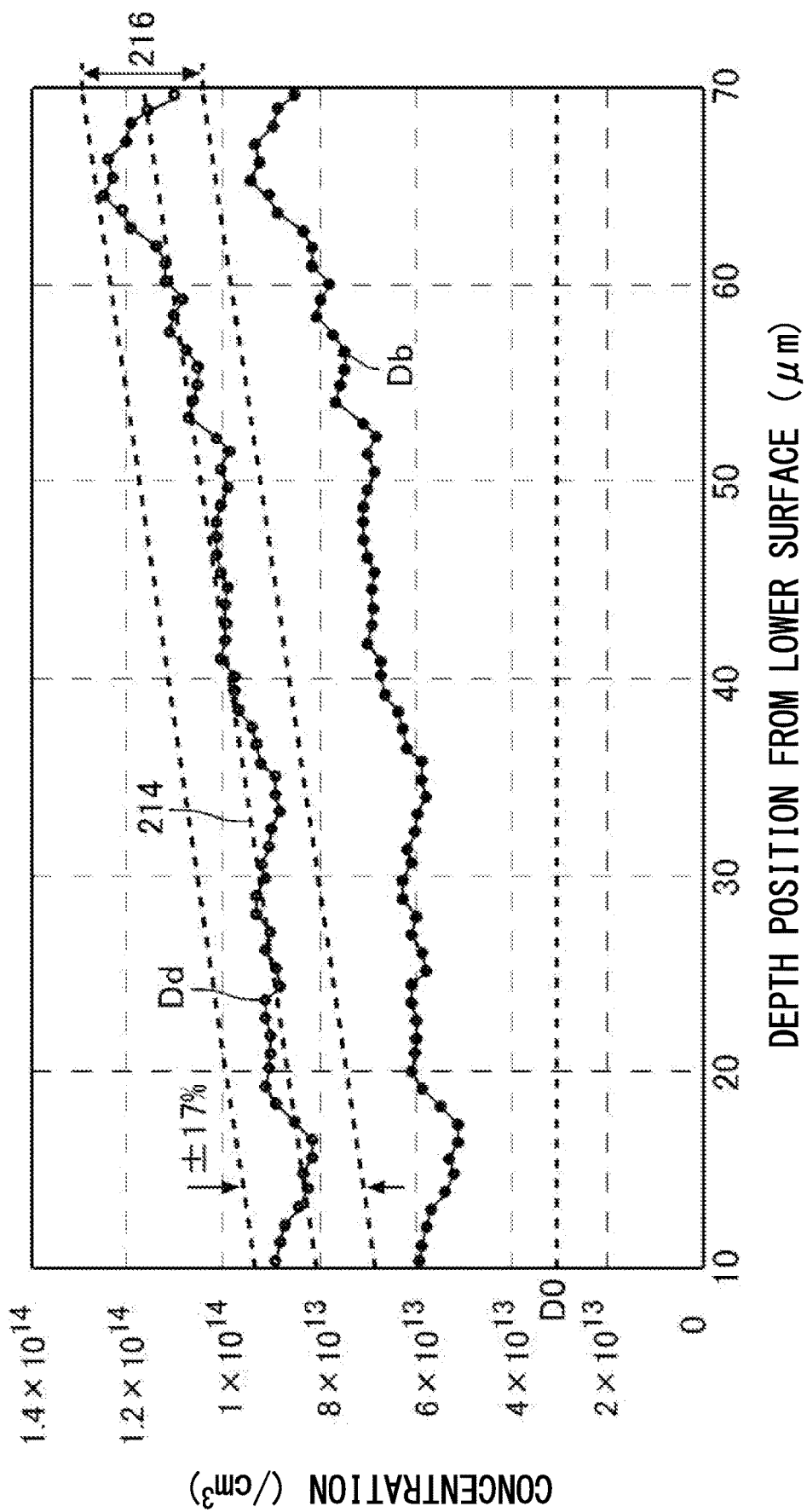
FIG. 5C is another distribution example of the bulk donor concentration D0, the hydrogen donor concentration Db, and the donor concentration Dd in the flat portion 150.

FIG. 5C is another example of the distribution of bulk donor concentration D0, hydrogen donor concentration Db, and donor concentration Dd. This example is different from the example of FIG. 5B in that the slope of the flat portion 150 is larger. In this example, a region in the depth of from 10 μm to 70 μm from the hydrogen ion-implanted surface is defined as a predetermined region. Also in this example, the thickness of the predetermined region with respect to the thickness (120 μm) of the semiconductor substrate 10 is 50%, which is the same as in the example of FIG. 5B.

The linear approximation distribution 214 of the donor concentration Dd is a distribution in which the concentration increases as the distance from the implantation surface increases. However, the linear approximation distribution 214 of this example has a larger slope of increase than the linear approximation distribution 214 of FIG. 5B. In addition, in the predetermined region, the value of the donor concentration Dd varies by about ±17% with respect to the linear approximation distribution 214. The variation of the donor concentration Dd is defined as a band-shaped range 216. The width of the band-shaped range 216 is ±17% of the value of the linear approximation distribution 214. Therefore, in a predetermined region having a thickness of 30% or more of the thickness of the semiconductor substrate 10, in a case where the distribution of the donor concentration Db exists within the band-shaped range 216, the distribution of the donor concentration Db may be a flat distribution. That is, this predetermined region may be a hydrogen donor flat region.

The hydrogen donor flat region may be provided in a range of from 20% to 80% of the thickness of the semiconductor substrate. The absolute value of the slope of the linear approximation distribution 214 in the hydrogen donor flat region may range from $0/(cm^3 \cdot \mu m)$ to $2 \times 10^{12}/(cm^3 \cdot \mu m)$, and may be larger than $0/(cm^3 \, \mu m)$ and $1 \times 10^{12}/(cm^3 \cdot \mu m)$ or less with respect to the depth ($\mu m$). Further, the absolute value of the slope of the linear approximation distribution 214 in the hydrogen donor flat region may range from $1 \times 10^{10}/(cm^3 \cdot \mu m)$ to $1 \times 10^{12}/(cm^3 \cdot \mu m)$, and may range from $1 \times 10^{10}/(cm^3 \cdot \mu m)$ to $5 \times 10^{11}/(cm^3 \cdot \mu m)$ with respect to the depth ($\mu m$). Here, $5 \times 10^{11}/(cm^3 \cdot \mu m)$ is the same slope (equivalent) as $5 \times 10^{15}/cm^4$.

A semi-logarithmic slope may be used as another index of the slope of the linear approximation distribution 214. The position of one end of the predetermined region is defined as $x1$ (cm), and the position of the other end is defined as $x2$ (cm). The concentration at $x1$ is denoted by $N1$ (/$cm^3$), and the concentration at $x2$ is denoted by $N2$ (/$cm^3$). A semi-logarithmic slope $\eta$ (/cm) in a predetermined region is defined as $\eta = (\log_{10}(N2) - \log_{10}(N1))/(x2-x1)$. The absolute value of the semi-logarithmic slope $\eta$ of the linear approximation distribution 214 in the hydrogen donor flat region may range from 0/cm to 50/cm, or may range from 0/cm to 30/cm. Further, the absolute value of the semi-logarithmic slope $\eta$ of the linear approximation distribution 214 in the hydrogen donor flat region may range from 0/cm to 20/cm, or may range from 0/cm to 10/cm.

It is considered that, in a pass-through region through which the hydrogen ions have passed, vacancies (V, VV, etc.) generated by the passage of hydrogen are distributed at substantially (almost) uniform concentrations in the depth direction. In addition, oxygen (O) implanted at the time of manufacturing the semiconductor substrate 10 or the like is also considered to be uniformly distributed in the depth direction. On the other hand, in the process of manufacturing the semiconductor apparatus 100, oxygen may diffuse from the upper surface 21 or the lower surface 23 of the semiconductor substrate 10 to the outside of the semiconductor substrate 10 in the procedure of performing high temperature treatment of 1100° C. or higher. As a result, the oxygen concentration may decrease toward the upper surface 21 or the lower surface 23 of the semiconductor substrate 10.

According to the semiconductor apparatus 100 described with reference to FIG. 1 to FIG. 5C, the vacancy concentration $N_V$ can be controlled by the dose amount of charged particles, and the hydrogen chemical concentration $C_H$ can be controlled by the dose amount of hydrogen ions. Therefore, the donor concentration $D_D$ in the flat portion 150 can be easily controlled. By adjusting the implantation position Z1 of charged particles, the range in which the flat portion 150 is formed can be easily controlled.

Next, the range and the like of the oxygen contribution ratio in the semiconductor substrate 10 will be described. A final doping concentration at an arbitrary position from the depth position Z1 to the depth position Z2 in a state where the semiconductor apparatus 100 is completed is defined as $N_F$. The doping concentration $N_F$ is represented by Expression (1).

$$N_F = N_{B0} + N_{VOH} \qquad \text{Expression (1)}$$

Here, the VOH defect concentration $N_{VOH}$ is the sum of the concentration of vacancies terminated with hydrogen and the contributing oxygen concentration $N_{OX}$ (that is, $\xi C_{OX}$). This is because the concentration of VOH defects in the flat portion 150 is limited by the vacancy concentration terminated with hydrogen and the contributing oxygen concentration. In this example, since the hydrogen chemical concentration $C_H$ is sufficiently high, substantially (almost) all the vacancies from the depth position Z1 to the depth position Z2 are terminated with hydrogen. That is, the vacancy concentration may be the vacancy concentration $N_V$ terminated with hydrogen. Therefore, Expression (2) is obtained.

$$N_{VOH} = N_V + \xi C_{OX} \qquad \text{Expression (2)}$$

Expression (3) is obtained from Expression (1) and Expression (2).

$$N_F = N_{B0} + N_V + \xi C_{OX} \qquad \text{Expression (3)}$$

Here, a case where the semiconductor apparatus 100 is formed using two semiconductor substrates having the same conditions for the hydrogen implantation and heat treatment, the same bulk donor concentration $N_{B0}$, and different oxygen chemical concentrations $C_{OX}$ will be considered. The final doping concentration in the first semiconductor substrate is $N_{F1}$, and the final doping concentration in the second semiconductor substrate is $N_{F2}$. In addition, the oxygen chemical concentration in the first semiconductor substrate is $C_{OX1}$, and the oxygen chemical concentration in the second semiconductor substrate is $C_{OX2}$.

Since the conditions for hydrogen implantation are the same, the vacancy concentrations $N_V$ in the respective semiconductor substrates are the same. Therefore, the oxygen contribution ratio is also the same between the two semiconductor substrates.

Expressions (4) and (5) are obtained from Expression (3).

$$N_{F1} = N_{B0} + N_V + \xi C_{OX1}, \qquad \text{Expression (4)}$$

$$N_{F2} = N_{B0} + N_V + C_{OX2} \qquad \text{Expression (5)}$$

Here, $N_{F2} > N_{F1}$.

The difference in final doping concentration is the difference $\Delta N_{VOH}$ in VOH defect concentration $N_{VOH}$. Therefore, Expression (6) is obtained from Expressions (4) and (5).

$$N_{F2} - N_{F1} = \Delta N_{VOH} = \xi(C_{OX2} - C_{OX1}) \qquad \text{Expression (6)}$$

$$\xi = \Delta N_{VOH} / (C_{OX2} - C_{OX1})$$

In addition, Expression (7) is obtained from Expressions (2) and (6).

$$N_V = \qquad \text{Expression (7)}$$

$$N_{VOH} - \xi C_{OX} = N_{VOH} - (\Delta N_{VOH}/(C_{OX2} - C_{OX1}))C_{OX}$$

If the oxygen contribution ratio $\xi$ is given, the vacancy concentration $N_V$ can be calculated for any VOH defect concentration $N_{VOH}$ and oxygen chemical concentration $C_{OX}$ from Expression (7).

Figure 6:
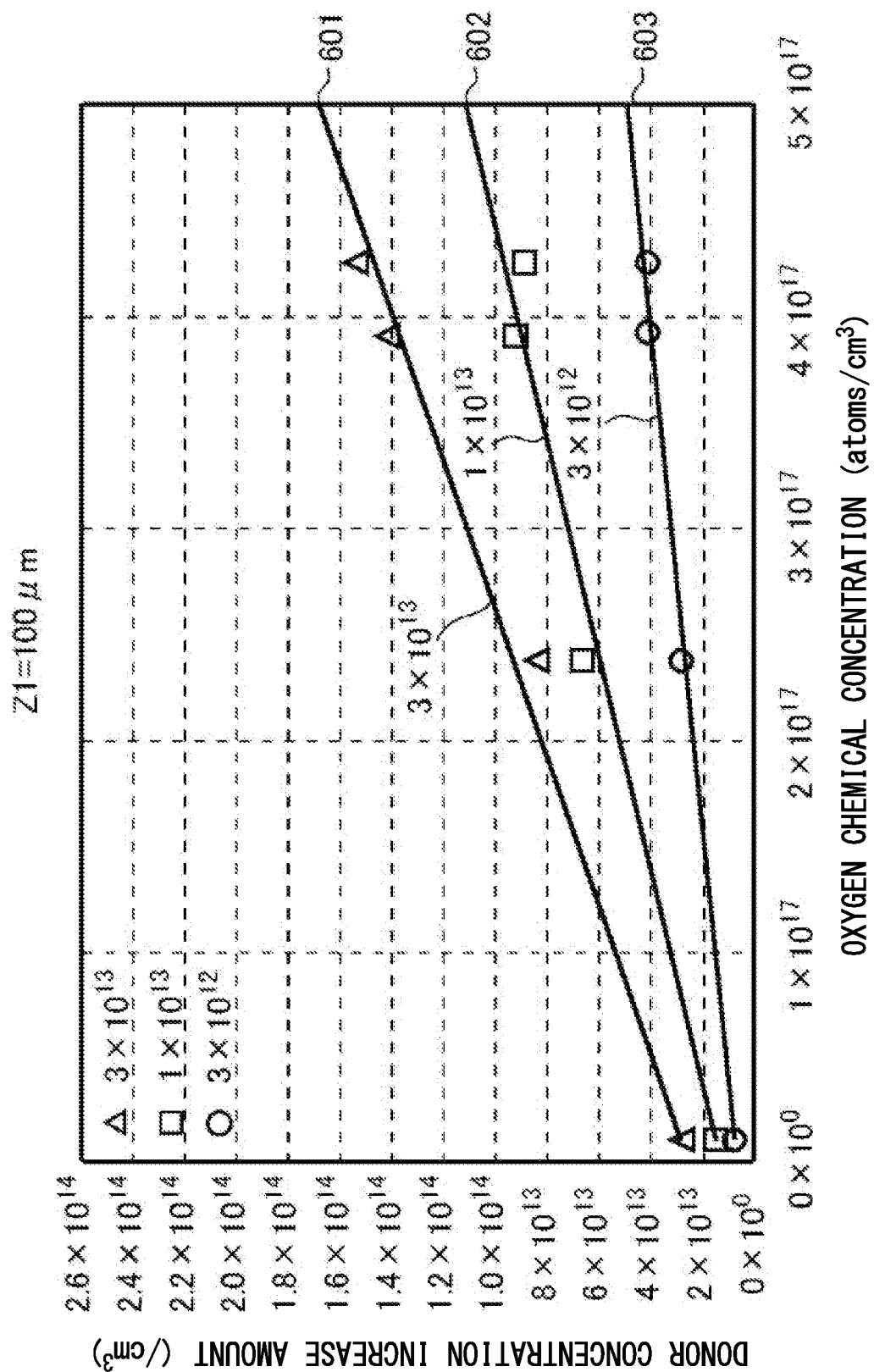
FIG. 6 is a diagram illustrating a relationship between a donor concentration increase amount and the oxygen chemical concentration $C_{OX}$.

FIG. 6 is a diagram illustrating a relationship between the donor concentration increase amount and the oxygen chemical concentration $C_{OX}$. In this example, for two substrates of a semiconductor substrate before charged particles and hydrogen ions are implanted and a semiconductor substrate after charged particles and hydrogen ions are implanted and subjected to heat treatment, each carrier concentration at the depth position Zc is measured by the SR method, and the difference therebetween is taken as the donor concentration increase amount. The donor concentration increase amount corresponds to the VOH defect concentration $N_{VOH}$. In addition, the oxygen chemical concentration $C_{OX}$ of the semiconductor substrate of this example is uniformly distributed in the depth direction.

In FIG. 6, the depth position Z1 is set to 100 μm, and hydrogen ions are implanted into the depth position Z1. In this example, the dose amount of hydrogen ions to the depth position Z1 is shown for three kinds of $3\times10^{12}$ ions/cm$^2$, $1\times10^{13}$ ions/cm$^2$, and $3\times10^{13}$ ions/cm$^2$. As illustrated in FIG. 6, the donor concentration increase amount linearly increases in proportion to the oxygen chemical concentration $C_{OX}$.

In the example of FIG. 6, an approximate expression in which the relationship between the oxygen chemical concentration $C_{OX}$ and the donor concentration increase amount (that is, $N_{VOH}$) is approximated by a straight line is calculated. In FIG. 6, an example in which the dose amount of hydrogen ions is $3\times10^{13}$ ions/cm$^2$ is approximated by a straight line 601, an example in which the dose amount of hydrogen ions is $1\times10^{13}$ ions/cm$^2$ is approximated by a straight line 602, and an example in which the dose amount of hydrogen ions is $3\times10^{12}$ ions/cm$^2$ is approximated by a straight line 603.

Each straight line is represented by Expression (8).

$$N_{VOH}=a\times C_{OX}+b \quad \text{Expression (8)}$$

At this time, the slope a and the intercept b of each straight line are as follows by fitting of the least squares method.

Straight line 601: a=$2.96303\times10^{-4}$, b=$2.18399\times10^{13}$
Straight line 602: a=$1.87895\times10^{-4}$, b=$1.47920\times10^{13}$
Straight line 603: a=$7.58824\times10^{-5}$, b=$6.38380\times10^{12}$ Note that, when Expression (2) and Expression (8) are compared, a=ξ and b=$N_V$.

Figure 7:
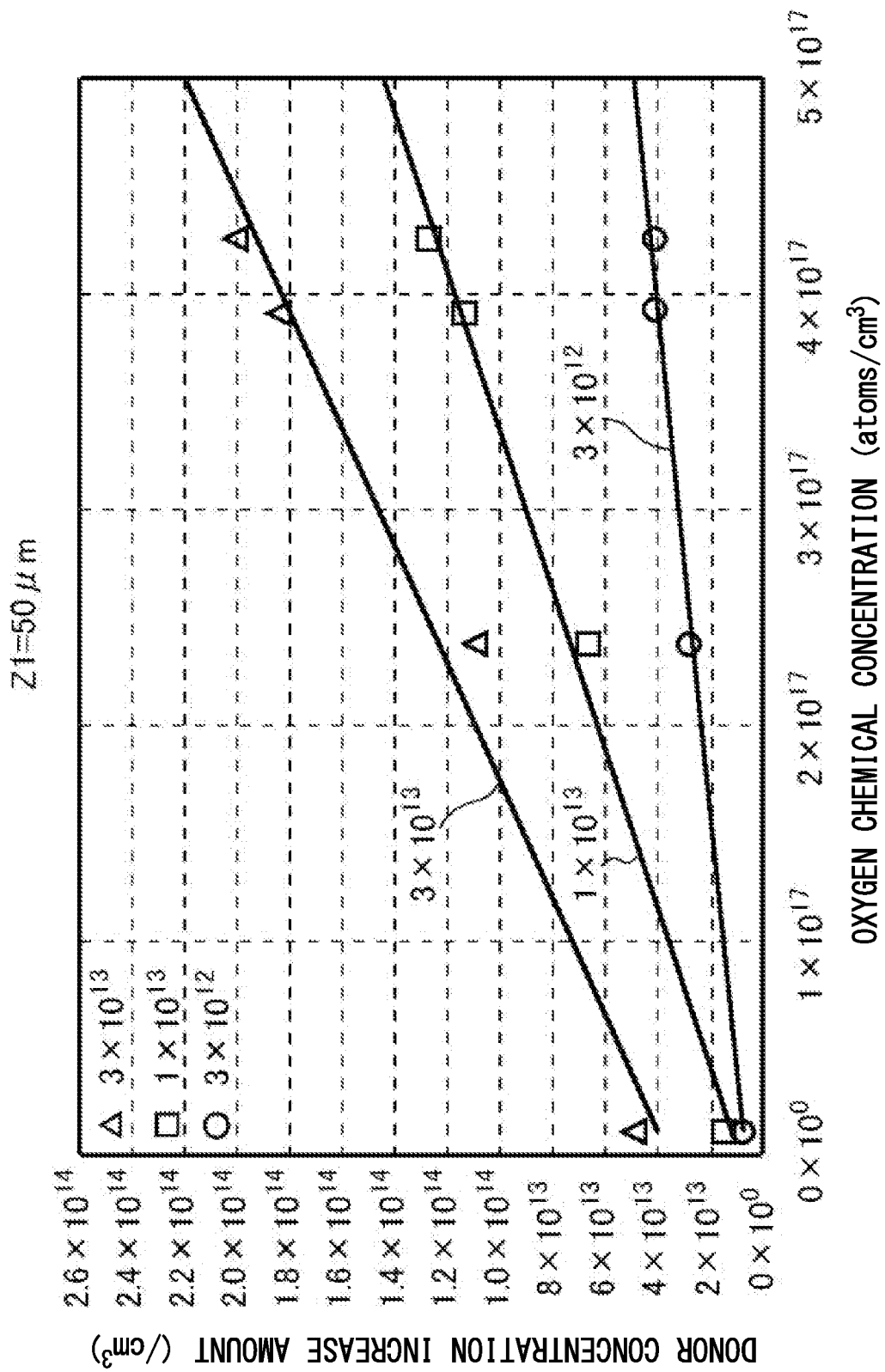
FIG. 7 is a diagram illustrating a relationship between the donor concentration increase amount and the oxygen chemical concentration $C_{OX}$.

FIG. 7 is a diagram illustrating a relationship between the donor concentration increase amount and the oxygen chemical concentration $C_{OX}$. In this example, the depth position Z1 is 50 μm. Other conditions are the same as those in FIG. 6. Also in this example, the donor concentration increase amount linearly increases in proportion to the oxygen chemical concentration $C_{OX}$.

Figure 8:
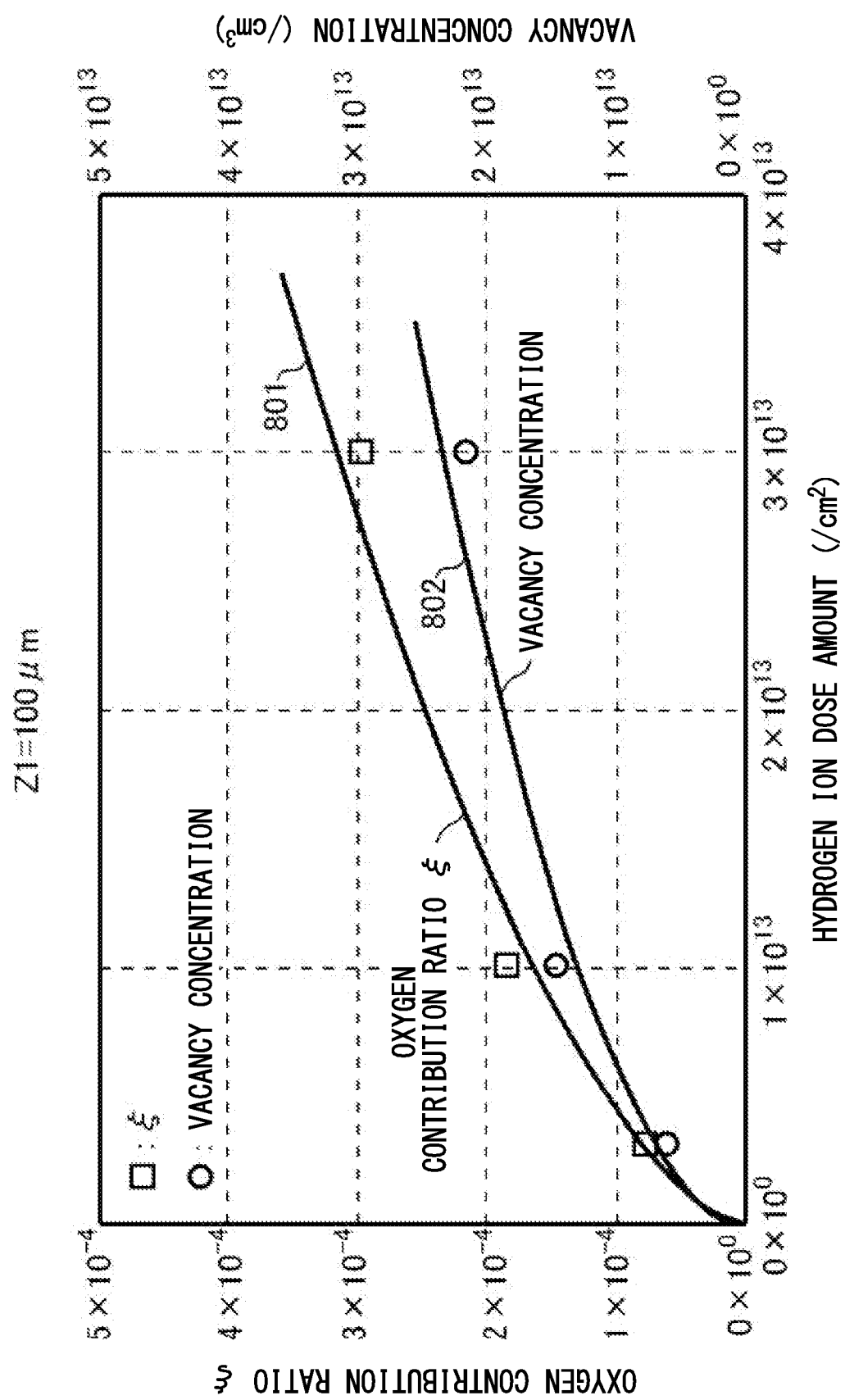
FIG. 8 is a diagram illustrating a relationship among the dose amount of hydrogen ions, an oxygen contribution ratio $\xi$, and a vacancy concentration $N_V$.

FIG. 8 is a diagram illustrating a relationship among the dose amount of hydrogen ions, the oxygen contribution ratio ξ, and the vacancy concentration $N_V$. In FIG. 8, a and b obtained in the example of FIG. 6 are plotted and approximated by a curve. In this example, the oxygen contribution ratio ξ and the vacancy concentration $N_V$ are approximated by power functions with respect to the hydrogen ion dose amount $D_H$ to the depth position Z1. This is because the oxygen contribution ratio ξ is considered to be 0 when the hydrogen ion dose amount $D_H$ approaches 0. If the oxygen contribution ratio is approximated by a logarithmic function, the hydrogen ion dose amount $D_H$ becomes a finite value larger than 0 when the oxygen contribution ratio becomes 0. If the hydrogen ion dose amount $D_H$ further decreases, the oxygen contribution ratio becomes a negative value. The same applies also to the vacancy concentration $N_V$.

In FIG. 8, the relationship between the oxygen contribution ratio ξ and the hydrogen ion dose amount is approximated by a curve 801, and the relationship between the vacancy concentration $N_V$ and the hydrogen ion dose amount is approximated by a curve 802. The curve 801 is represented by Expression (9), and the curve 802 is represented by Expression (10). At this time, the coefficients c to f are as follows by fitting of the least squares method.

$$\xi=c\times(D_H)^d \quad \text{Expression (9)}$$

where c=$3.11503\times10^{-12}$, d=$5.94169\times10^{-1}$ $$N_V=e\times(D_H)^f \quad \text{Expression (10)}$$

where e=$1.36398\times10^6$ and f=$5.36782\times10^{-1}$

If the hydrogen ion dose amount $D_H$ is too small, the VOH defect concentration $N_{VOH}$ decreases. In this case, it is difficult to secure the donor concentration increase amount that can absorb the variation in the bulk donor concentration $N_{B0}$. Therefore, the hydrogen ion dose amount is preferably $1\times10^{11}$ ions/cm$^2$ or more. At this time, the oxygen contribution ratio ξ is $1\times10^{-5}$ or more from Expression (9). In addition, if the hydrogen ion dose amount $D_H$ is too large, the vacancy concentration $N_V$ becomes too high as compared with the VOH defect concentration that can be formed by the oxygen and hydrogen concentrations. Therefore, the number of vacancies that do not become VOH defects increases. The hydrogen ion dose amount is preferably $1.2\times10^{14}$ ions/cm$^2$ or less. At this time, the oxygen contribution ratio ξ is $7\times10^{-4}$ or less from Expression (9). That is, the oxygen contribution ratio ξ may range from $1\times10^{-5}$ to $7\times10^{-4}$. The oxygen contribution ratio ξ may be $1\times10^{-4}$ or more. The oxygen contribution ratio ξ may be $5\times10^{-4}$ or less. Similarly, the vacancy concentration $N_V$ may range from $1\times10^{11}$/cm$^3$ to $1\times10^{14}$/cm$^3$. The vacancy concentration $N_V$ may be $1\times10^{12}$/cm$^3$ or more, or may be $1\times10^{13}$/cm$^3$ or more. The vacancy concentration $N_V$ may be $3\times10^{13}$/cm$^3$ or less. The vacancy concentration $N_V$ may be calculated from a difference ($N_{VOH}-N_{OX}$) between the VOH defect concentration $N_{VOH}$ and the contributing oxygen concentration $N_{OX}$. The VOH defect concentration $N_{VOH}$ may be calculated from a difference ($N_F-N_{B0}$) between the final doping concentration $N_F$ and the bulk donor concentration $N_{B0}$.

As the oxygen chemical concentration $C_{OX}$, a general value of the MCZ substrate is used. That is, $C_{OX}$ is $1\times10^{17}$ to $7\times10^{17}$/cm$^3$. Since $N_{OX}=\xi\times C_{OX}$, the contributing oxygen concentration $N_{OX}$ is $1\times10^{12}$/cm$^3$ to $5\times10^{14}$/cm$^3$. From Expression (2), $N_{VOH}=N_V+N_{OX}$. That is, the VOH defect concentration $N_{VOH}$ may range from $2\times10^{12}$/cm$^3$ to $6\times10^{14}$/cm$^3$. The VOH defect concentration $N_{VOH}$ may be $1\times10^{13}$/cm$^3$ or more. The VOH defect concentration $N_{VOH}$ may be $5\times10^{14}$/cm$^3$ or less.

Figure 9:
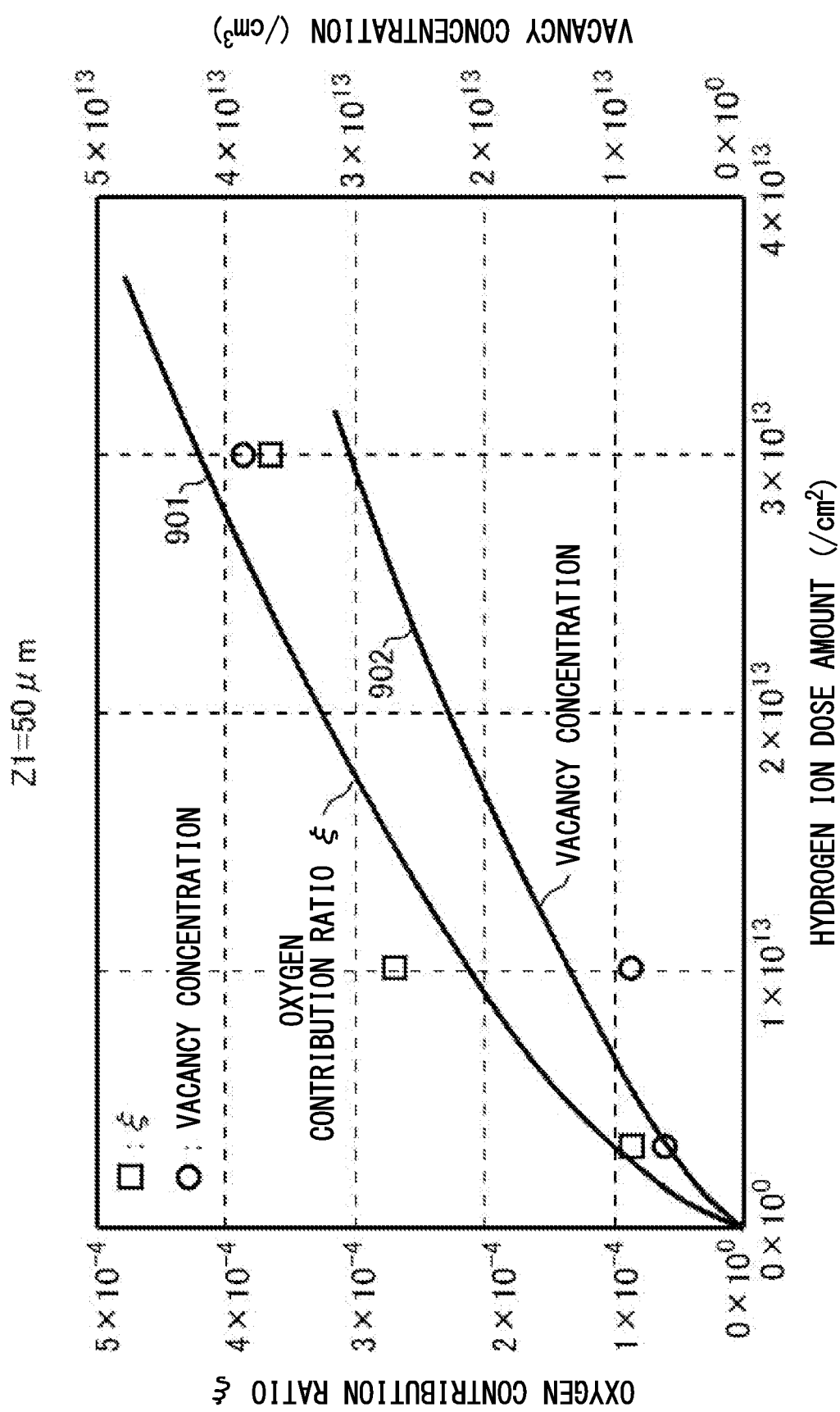
FIG. 9 is a diagram illustrating a relationship among the dose amount of hydrogen ions, the oxygen contribution ratio $\xi$, and the vacancy concentration $N_V$.

FIG. 9 is a diagram illustrating a relationship among the dose amount of hydrogen ions, the oxygen contribution ratio ξ, and the vacancy concentration $N_V$. FIG. 9 corresponds to the example of FIG. 7 (that is, Z1=50 μm). In FIG. 9, the relationship between the oxygen contribution ratio ξ and the hydrogen ion dose amount is approximated by a curve 901, and the relationship between the vacancy concentration $N_V$ and the hydrogen ion dose amount is approximated by a curve 902. The curve 901 is represented by Expression (11), and the curve 902 is represented by Expression (12). At this time, the coefficients c to f are as follows by fitting of the least squares method.

$$\xi=c\times(D_H)^d \quad \text{Expression (11)}$$

where c=$1.53343\times10^{-12}$, d=$6.25800\times10^{-1}$ $$N_V=e\times(D_H)^f \quad \text{Expression (12)}$$

where e=$3.11098\times10^3$ and f=$7.41056\times10^{-1}$

Also in this example, the oxygen contribution ratio ξ may be in the same range as in the example of FIG. 8. The vacancy concentration $N_V$ may also be in the same range as in the example of FIG. 8. The contributing oxygen concentration $N_{OX}$ may also be in the same range as in the example of FIG. 8. The VOH defect concentration may also be in the same range as in the example of FIG. 8.

In the flat portion 150, the ratio between a maximum value $O_{max}$ and a minimum value $O_{min}$ of the oxygen chemical concentration $C_{OX}$ is defined as v. That is, $v=O_{min}/O_{max}$. The ratio v may range from 0.1 to 1. If the ratio v is small, the variation in the depth direction of the VOH defect concentration $N_{VOH}$ increases, and the breakdown voltage of the semiconductor substrate 10 may deteriorate. The ratio v may be 0.3 or more, or may be 0.5 or more. The ratio v may be 0.95 or less, or may be 0.9 or less.

The flat portion 150 may contain carbon. The carbon chemical concentration of the flat portion 150 may range from $1 \times 10^{13}$ atoms/cm$^3$ to $1 \times 10^{16}$ atoms/cm$^3$. The carbon chemical concentration may be $1 \times 10^{14}$ atoms/cm$^3$ or more. The carbon chemical concentration may be $5 \times 10^{15}$ atoms/cm$^3$ or less, or $2 \times 10^{15}$ atoms/cm$^3$ or less. The contribution of the carbon chemical concentration to the VOH defect concentration $N_{VOH}$ will be described later.

Figure 10:
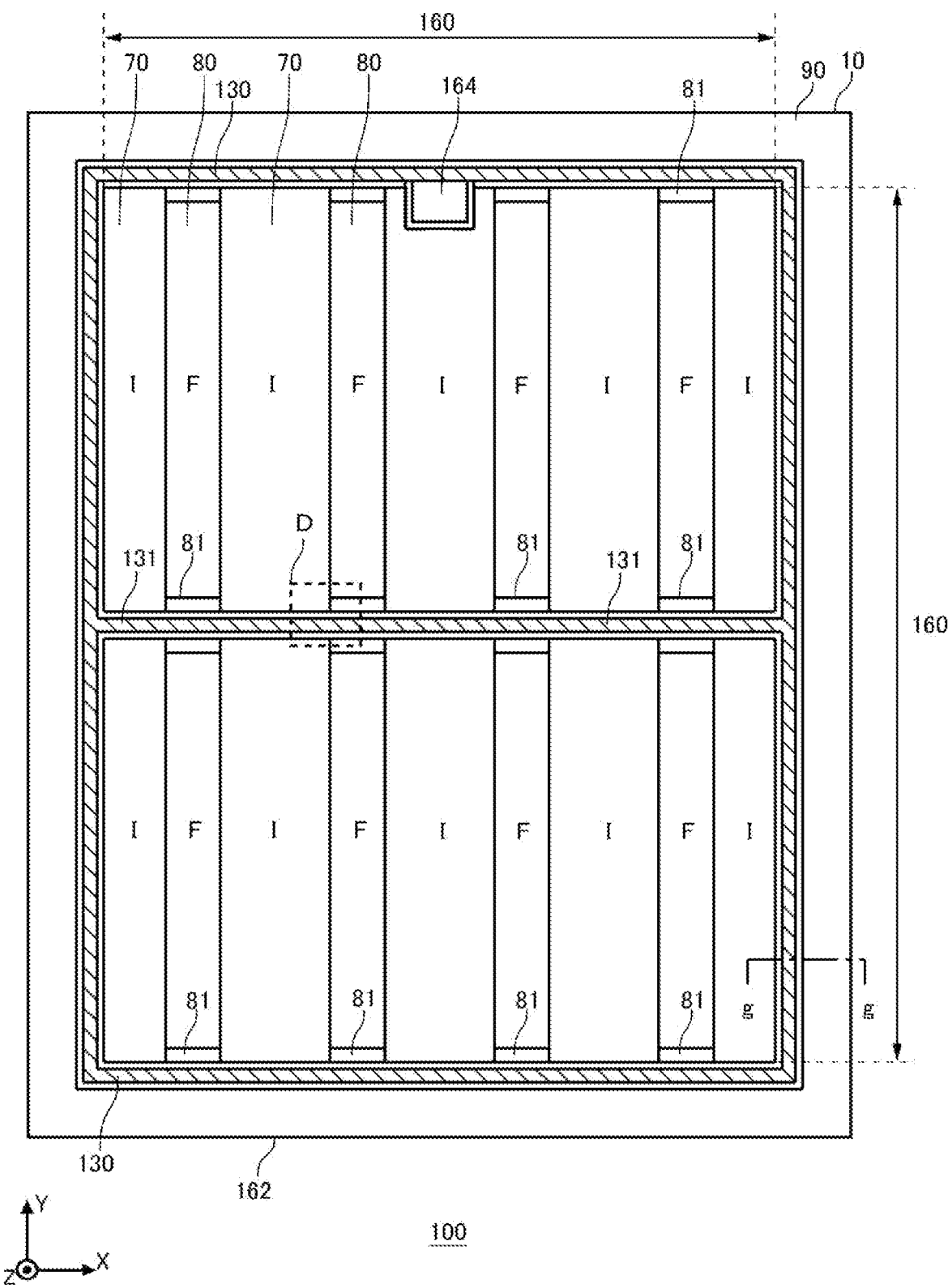
FIG. 10 is a top view illustrating an example of a semiconductor apparatus 100.

FIG. 10 is a top view illustrating an example of the semiconductor apparatus 100. FIG. 10 illustrates a position where each member is projected on the upper surface of the semiconductor substrate 10. In FIG. 10, only some members of the semiconductor apparatus 100 are illustrated, and some members are omitted.

The semiconductor apparatus 100 includes the semiconductor substrate 10. The semiconductor substrate 10 may have the distribution of each concentration described in FIG. 1 to FIG. 9. However, the semiconductor substrate 10 may further have another concentration peak different from each concentration peak described in FIG. 1 to FIG. 9. As in a buffer region 20 to be described later, hydrogen ions may be implanted to form an N type region in the semiconductor substrate 10. In this case, the hydrogen chemical concentration distribution may have a local hydrogen concentration peak in addition to the hydrogen chemical concentration distribution described in FIG. 2 and the like. In addition, as in an emitter region 12 to be described later, an N type impurity such as phosphorus other than hydrogen may be implanted to form an N type region in the semiconductor substrate 10. In this case, the donor concentration distribution may have a local donor concentration peak in addition to the donor concentration distribution described in FIG. 4 and the like.

The semiconductor substrate 10 has an end side 162 in a top view. In the present specification, when simply referred to as a top view, it means viewing from the upper surface side of the semiconductor substrate 10. The semiconductor substrate 10 of this example has two sets of end sides 162 facing each other in a top view. In FIG. 10, the X axis and the Y axis are parallel to one of the end sides 162. The Z axis is perpendicular to the upper surface of the semiconductor substrate 10.

The semiconductor substrate 10 is provided with an active portion 160. The active portion 160 is a region through which a main current flows in the depth direction between the upper surface and the lower surface of the semiconductor substrate 10 in a case where the semiconductor apparatus 100 operates. An emitter electrode is provided above the active portion 160, but is omitted in FIG. 10.

In the active portion 160, there is provided at least one of a transistor portion 70 which includes a transistor device such as an IGBT, and a diode portion 80 which includes a diode device such as a freewheeling diode (FWD). In the example of FIG. 10, the transistor portion 70 and the diode portion 80 are disposed alternately along a predetermined arrangement direction (the X axis direction in this example) in the upper surface of the semiconductor substrate 10. In another example, only one of the transistor portion 70 and the diode portion 80 may be provided in the active portion 160.

In FIG. 10, a region where the transistor portion 70 is disposed is denoted by a symbol "I", and a region where the diode portion 80 is disposed is denoted by a symbol "F". In the present specification, a direction perpendicular to the arrangement direction in a top view may be referred to as an extending direction (Y axis direction in FIG. 10). Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the lower surface of the semiconductor substrate 10. In the present specification, a region where the cathode region is provided is referred to as a diode portion 80. That is, the diode portion 80 is a region overlapping the cathode region in a top view. On the lower surface of the semiconductor substrate 10, a P+ type collector region may be provided in a region other than the cathode region. In the present specification, an extension region 81 obtained by extending the diode portion 80 in the Y axis direction to a gate runner to be described later may also be included in the diode portion 80. A collector region is provided in a lower surface of the extension region 81.

The transistor portion 70 has a P+ type collector region in a region in contact with the lower surface of the semiconductor substrate 10. In the transistor portion 70, a gate structure including an N type emitter region, a P type base region, a gate conductive portion, and a gate insulating film is periodically disposed on the upper surface side of the semiconductor substrate 10.

The semiconductor apparatus 100 may have one or more pads above the semiconductor substrate 10. The semiconductor apparatus 100 of this example includes a gate pad 164. The semiconductor apparatus 100 may have pads such as an anode pad, a cathode pad, and a current detection pad. Each pad is disposed in the vicinity of the end side 162. The vicinity of the end side 162 refers to a region between the end side 162 and the emitter electrode in a top view. At the time of mounting the semiconductor apparatus 100, each pad may be connected to an external circuit via wiring such as a wire.

A gate potential is applied to the gate pad 164. The gate pad 164 is electrically connected to the conductive portion of the gate trench portion of the active portion 160. The semiconductor apparatus 100 includes a gate runner that connects the gate pad 164 and the gate trench portion. In FIG. 10, the gate runner is hatched with oblique lines.

The gate runner of this example includes an outer peripheral gate runner 130 and an active-side gate runner 131. The outer peripheral gate runner 130 is disposed between the active portion 160 and the end side 162 of semiconductor substrate 10 in a top view. The outer peripheral gate runner 130 of this example surrounds the active portion 160 in a top view. A region surrounded by the outer peripheral gate runner 130 in a top view may be the active portion 160. The outer peripheral gate runner 130 is connected to the gate pad 164. The outer peripheral gate runner 130 is disposed above the semiconductor substrate 10. The outer peripheral gate runner 130 may be a metal wiring containing aluminum or the like.

The active-side gate runner 131 is provided in the active portion 160. With the provision of the active-side gate runner 131 in the active portion 160, it is possible to reduce a variation in wiring length from the gate pad 164 in each region of the semiconductor substrate 10.

The active-side gate runner 131 is connected to the gate trench portion of the active portion 160. The active-side gate runner 131 is disposed above the semiconductor substrate 10. The active-side gate runner 131 may be a wiring formed of a semiconductor such as polysilicon doped with impurities.

The active-side gate runner 131 may be connected to the outer peripheral gate runner 130. The active-side gate runner 131 of this example is provided to extend in the X axis direction from one outer peripheral gate runner 130 to the other outer peripheral gate runner 130 so as to cross the active portion 160 at substantially the center in the Y axis direction. In a case where the active portion 160 is divided by the active-side gate runner 131, the transistor portion 70 and the diode portion 80 may be alternately disposed in the X axis direction in each divided region.

In addition, the semiconductor apparatus 100 may be provided with a temperature sense portion (not illustrated) which is a PN junction diode formed of polysilicon or the like, and a current detection portion (not illustrated) which simulates the operation of the transistor portion provided in the active portion 160.

The semiconductor apparatus 100 of this example includes an edge termination structure portion 90 between the active portion 160 and the end side 162 in a top view. The edge termination structure portion 90 of this example is disposed between the outer peripheral gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF annularly provided surrounding the active portion 160.

Figure 11:
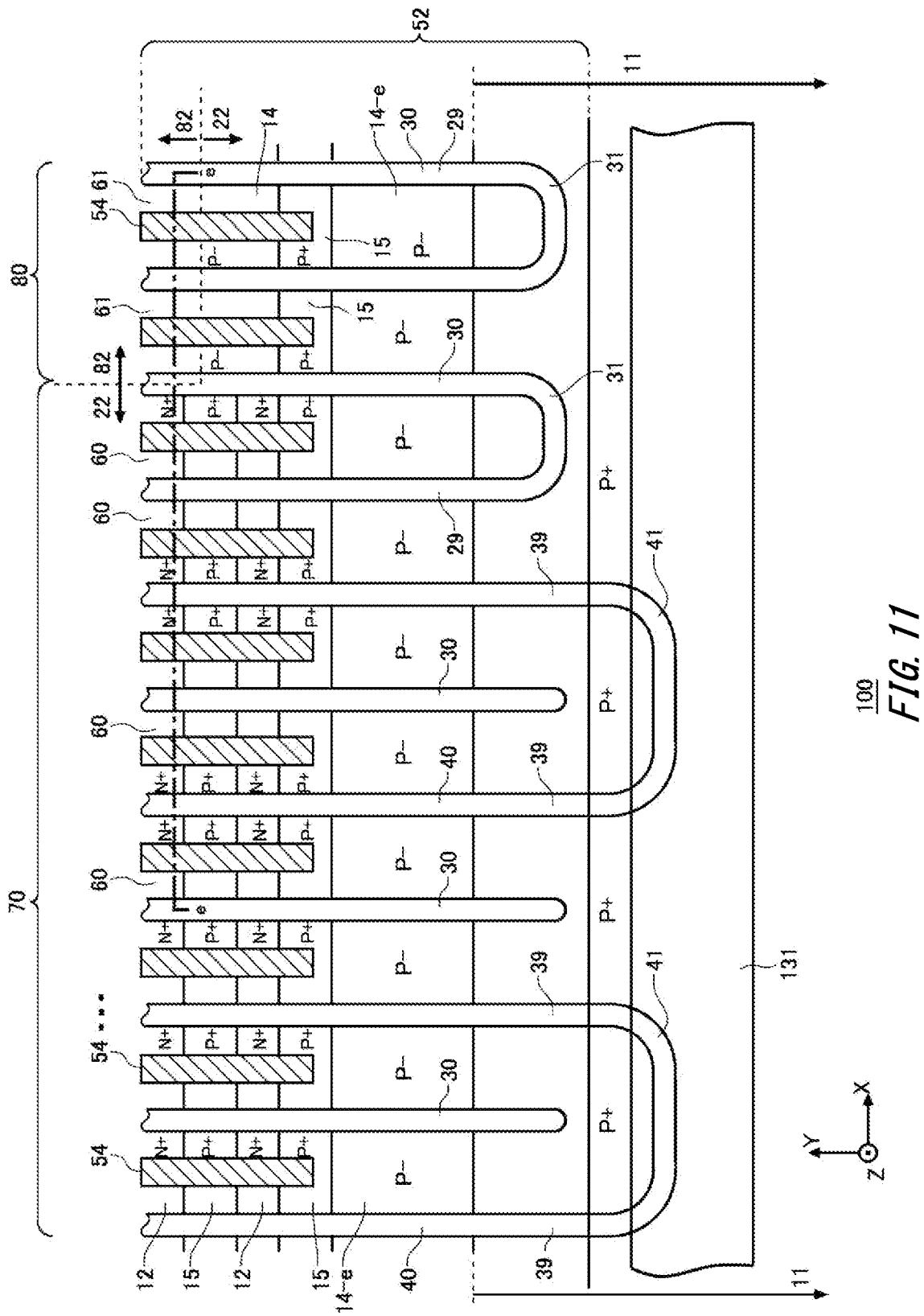
FIG. 11 is an enlarged view of a region D in FIG. 10.

FIG. 11 is an enlarged view of a region D in FIG. 10. The region D is a region including the transistor portion 70, the diode portion 80, and the active-side gate runner 131. The semiconductor apparatus 100 of this example includes a gate trench portion 40, a dummy trench portion 30, a well region 11, an emitter region 12, a base region 14, and a contact region 15 provided inside the upper surface side of the semiconductor substrate 10. Each of the gate trench portion 40 and the dummy trench portion 30 is an example of a trench portion. In addition, the semiconductor apparatus 100 of this example includes an emitter electrode 52 and the active-side gate runner 131 provided above the upper surface of the semiconductor substrate 10. The emitter electrode 52 and the active-side gate runner 131 are provided separately from each other.

An interlayer dielectric film is provided between the emitter electrode 52 and the active-side gate runner 131, and the upper surface of the semiconductor substrate 10, but is omitted in FIG. 11. In the interlayer dielectric film of this example, a contact hole 54 is provided through the interlayer dielectric film. In FIG. 11, each contact hole 54 is hatched with oblique lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10 through the contact hole 54. The emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through a contact hole provided in the interlayer dielectric film. The active-side gate runner 131 may be connected to the gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 11 illustrates a range in which the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in a lower layer of a region formed of aluminum or the like. Further, in the contact hole, there may be provided a plug formed by embedding tungsten or the like so as to be in contact with the barrier metal and aluminum or the like.

The well region 11 is provided to overlap with the active-side gate runner 131. The well region 11 is also provided to extend with a predetermined width in a range not overlapping with the active-side gate runner 131. The well region 11 of this example is provided away from the end of the contact hole 54 in the Y axis direction toward the active-side gate runner 131. The well region 11 is a region of a second conductivity type having a higher doping concentration than the base region 14. The base region 14 in this example is a P− type, and the well region 11 is a P+ type.

Each of the transistor portion 70 and the diode portion 80 has a plurality of trench portions arranged in the arrangement direction. In the transistor portion 70 of this example, one or more gate trench portions 40 and one or more dummy trench portions 30 are alternately provided along the arrangement direction. In the diode portion 80 of this example, a plurality of dummy trench portions 30 are provided along the arrangement direction. The diode portion 80 of this example is not provided with the gate trench portion 40.

The gate trench portion 40 of this example may have two straight portions 39 (portions of the trenches which are straight along the extending direction) extending along the extending direction perpendicular to the arrangement direction and the edge portion 41 connecting the two straight portions 39. The extending direction in FIG. 11 is the Y axis direction.

At least a part of the edge portion 41 is preferably provided in a curved shape in a top view. By connecting the end portions of the two straight portions 39 in the Y axis direction to each other by the edge portion 41, electric field strength at the end portion of the straight portion 39 can be reduced.

In the transistor portion 70, the dummy trench portion 30 is provided between the straight portions 39 of the gate trench portion 40. One dummy trench portion 30 may be provided between the straight portions 39, and a plurality of dummy trench portions 30 may be provided. The dummy trench portion 30 may have a linear shape extending in the extending direction, and may have a linear portion 29 and an edge portion 31 similar to the gate trench portion 40. The semiconductor apparatus 100 illustrated in FIG. 11 includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. As a result, electric field strength at the bottom portion of each trench portion can be reduced.

A mesa portion is provided between the trench portions in the arrangement direction. The mesa portion refers to a region sandwiched between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is provided to extend in the extending direction (Y axis direction) along the trench in the upper surface of the semiconductor substrate 10. In this example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In the base region 14 exposed to the upper surface of the semiconductor substrate 10 in the mesa portion, a region disposed closest to the active-side gate runner 131 is defined as a base region 14-e. In FIG. 11, the base region 14-e disposed at one end portion of each mesa portion in the extending direction is illustrated, but the base region 14-e is also disposed at the other end portion of each mesa portion. In each mesa portion, at least one of the emitter region 12 of the first conductivity type and the contact region 15 of the second conductivity type may be provided in a region sandwiched between the base regions 14-e in a top view. The emitter region 12 in this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion to the other trench portion in the X axis direction. As an example, the contact regions 15 and the emitter regions 12 of the mesa portion 60 are alternately disposed along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched by the emitter region 12.

The emitter region 12 is not provided in the mesa portion 61 of the diode portion 80. The base region 14 and the contact region 15 may be provided on the upper surface of the mesa portion 61. The contact region 15 may be provided in contact with each of the base regions 14-e in a region sandwiched between the base regions 14-e in the upper surface of the mesa portion 61. The base region 14 may be provided in a region sandwiched between the contact regions 15 in the upper surface of the mesa portion 61. The base region 14 may be disposed in the entire region sandwiched by the contact region 15.

The contact hole 54 is provided above each mesa portion. The contact hole 54 is disposed in a region sandwiched between the base regions 14-e. The contact hole 54 of this example is provided above each region of the contact region 15, the base region 14, and the emitter region 12. The contact hole 54 is not provided in a region corresponding to the base region 14-e and the well region 11. The contact hole 54 may be disposed at the center in the arrangement direction (X axis direction) of the mesa portion 60.

In the diode portion 80, an N+ type cathode region 82 is provided in a region adjacent to the lower surface of the semiconductor substrate 10. In the lower surface of the semiconductor substrate 10, a P+ type collector region 22 may be provided in a region where the cathode region 82 is not provided. The cathode region 82 and the collector region 22 are provided between the lower surface 23 of the semiconductor substrate 10 and the buffer region 20. In FIG. 11, the boundary between the cathode region 82 and the collector region 22 is indicated by a dotted line.

The cathode region 82 is disposed away from the well region 11 in the Y axis direction. As a result, a distance between the P type region (well region 11) having a relatively high doping concentration and formed up to a deep position and the cathode region 82 is secured, and the breakdown voltage can be improved. The end portion of the cathode region 82 in the Y axis direction of this example is disposed farther from the well region 11 than the end portion of the contact hole 54 in the Y axis direction. In another example, the end portion of the cathode region 82 in the Y axis direction may be disposed between the well region 11 and the contact hole 54.

Figure 12:
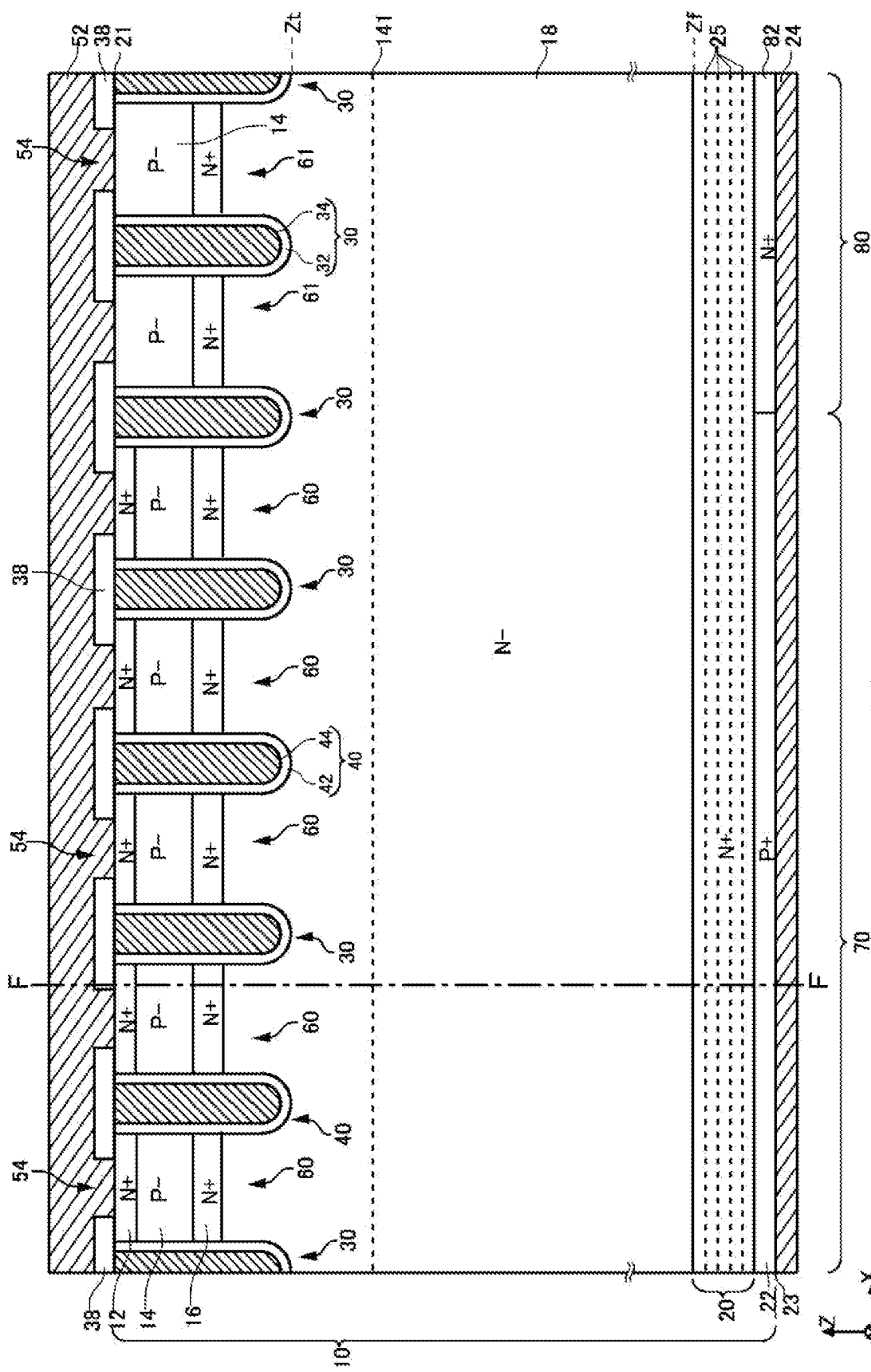
FIG. 12 is a diagram illustrating an example of an e-e cross section in FIG. 11.

FIG. 12 is a diagram illustrating an example of an e-e cross section in FIG. 11. The e-e cross section is an XZ plane passing through the emitter region 12 and the cathode region 82. The semiconductor apparatus 100 of this example includes the semiconductor substrate 10, an interlayer dielectric film 38, the emitter electrode 52, and a collector electrode 24 in the cross section.

The interlayer dielectric film 38 is provided in the upper surface of the semiconductor substrate 10. The interlayer dielectric film 38 is a film including at least one of an insulating film such as silicate glass to which an impurity such as boron or phosphorus is added, a thermal oxide film, and other insulating films. The interlayer dielectric film 38 is provided with the contact hole 54 described in FIG. 11.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are made of a metal material such as aluminum. In the present specification, a direction (Z axis direction) connecting the emitter electrode 52 and the collector electrode 24 is referred to as a depth direction.

The semiconductor substrate 10 has an N type or N− type drift region 18. The drift region 18 is provided in each of the transistor portion 70 and the diode portion 80.

In the mesa portion 60 of the transistor portion 70, an N+ type emitter region 12 and a P− type base region 14 are provided in order from the upper surface 21 side of the semiconductor substrate 10. The drift region 18 is provided below the base region 14. The mesa portion 60 may be provided with an N+ type accumulation region 16. The accumulation region 16 is disposed between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. By providing the high-concentration accumulation region 16 between the drift region 18 and the base region 14, the carrier implantation promotion effect (IE effect) can be enhanced, and the ON voltage can be reduced. The accumulation region 16 may be provided so as to cover the entire lower surface of the base region 14 in each mesa portion 60.

The mesa portion 61 of the diode portion 80 is provided with a P− type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided under the drift region 18. The doping concentration of the buffer region 20 is higher than the doping concentration of the drift region 18. The buffer region 20 has a peak 25 having a higher doping concentration than the drift region 18. The doping concentration of the peak 25 refers to the doping concentration at the local maximum of the peak 25. As the doping concentration of the drift region 18, an average value of the doping concentration in a region where the doping concentration distribution is substantially (almost) flat may be used.

The buffer region 20 of this example has three or more peaks 25 in the depth direction (Z axis direction) of the semiconductor substrate 10. The peak 25 of the buffer region 20 is, for example, a concentration peak of hydrogen (proton) or phosphorus. The buffer region 20 may function as a field stop layer that prevents a depletion layer extending from the lower end of the base region 14 from reaching the P+ type collector region 22 and the N+ type cathode region 82. In the present specification, the depth position of the upper end of the buffer region 20 is defined as Zf. The depth position Zf may be a position where the doping concentration is higher than the doping concentration of the drift region 18.

In the transistor portion 70, the P+ type collector region 22 is provided below the buffer region 20. The acceptor concentration of the collector region 22 is higher than the acceptor concentration of the base region 14. The collector region 22 may contain the same acceptor as the base region 14, and may contain a different acceptor. The acceptor of the collector region 22 is, for example, boron.

In the diode portion 80, the N+ type cathode region 82 is provided below the buffer region 20. The donor concentration of the cathode region 82 is higher than the donor concentration of the drift region 18. The donor of the cathode region 82 is, for example, hydrogen or phosphorus. Elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. In the region where at least one of the emitter region 12, the contact region 15, and the accumulation region 16 is provided, each trench portion also penetrates these doping regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

As described above, the transistor portion 70 is provided with the gate trench portion 40 and the dummy trench portion 30. The diode portion 80 is provided with the dummy trench portion 30 and is not provided with the gate trench portion 40. In this example, the boundary between the diode portion 80 and the transistor portion 70 in the X axis direction is the boundary between the cathode region 82 and the collector region 22.

The gate trench portion 40 includes a gate trench, a gate insulating film 42, and a gate conductive portion 44 provided in the upper surface 21 of the semiconductor substrate 10. The gate insulating film 42 is provided to cover the inner wall of the gate trench. The gate insulating film 42 may be formed by oxidizing or nitriding the semiconductor of the inner wall of the gate trench. The gate conductive portion 44 is provided on the inner side of the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. If a predetermined gate voltage is applied to the gate conductive portion 44, a channel by an inversion layer of electrons is formed in a surface layer of the interface in contact with the gate trench portion 40 in the base region 14.

The dummy trench portion 30 may have the same structure as the gate trench portion 40 in the cross section. The dummy trench portion 30 includes a dummy trench provided on the upper surface 21 of the semiconductor substrate 10, a dummy insulating film 32, and a dummy conductive portion 34. The dummy conductive portion 34 is electrically connected to the emitter electrode 52. The dummy insulating film 32 is provided to cover the inner wall of the dummy trench. The dummy conductive portion 34 is provided inside the dummy trench and is provided on the inner side of the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. Note that the bottom portions of the dummy trench portion 30 and the gate trench portion 40 may have a curved surface shape protruding downward (a curved shape in a cross section). In the present specification, the depth position of the lower end of the gate trench portion 40 is defined as Zt.

The drift region 18 may include the flat portion 150 described in FIG. 4 and the like. That is, the drift region 18 has a donor concentration determined mainly by a bulk donor concentration and a hydrogen donor (VOH defect) concentration. In the drift region 18, the second peak 141 of the hydrogen chemical concentration $C_H$ may be disposed. A dopant is locally implanted in a region other than the drift region 18. Therefore, the doping concentration in these regions is different from the donor concentration $D_D$ described in FIG. 4 and the like.

Figure 13:
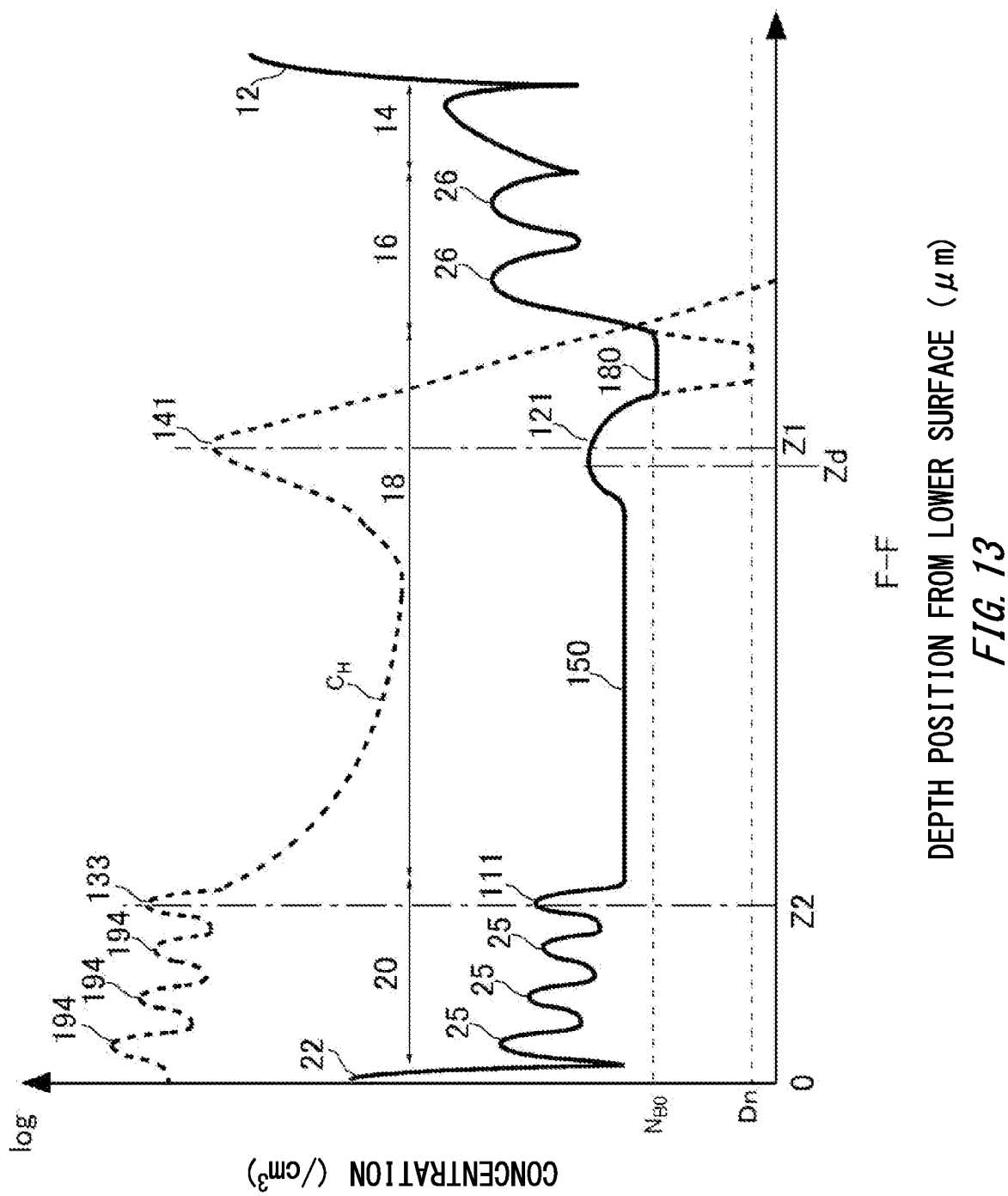
FIG. 13 is a diagram illustrating an example of a carrier concentration distribution in a depth direction at positions of line F-F in FIG. 12.

FIG. 13 is a diagram illustrating an example of the carrier concentration distribution in the depth direction at positions of the line F-F in FIG. 12. In FIG. 13, a part of the distribution of the hydrogen chemical concentration $C_H$ is also shown. The vertical axis in FIG. 13 is a logarithmic axis.

The carrier concentration distribution in the buffer region 20 of this example has a plurality of peaks 25 provided at different positions in the depth direction. The peak 25 is a peak of the donor concentration. The peak 25 may have hydrogen as an impurity. By providing the plurality of peaks 25, it is possible to further suppress the depletion layer from reaching the collector region 22. The second donor peak 111 may function as any peak 25 in the buffer region 20.

As an example, the second donor peak 111 may function as a peak farthest from the lower surface 23 of the semiconductor substrate 10 among the plurality of peaks 25 of the buffer region 20. The flat portion 150 is disposed between the second donor peak 111 included in the buffer region 20 and the first donor peak 121.

The second donor peak 111 may have a higher donor concentration than a peak 25 located farthest away from the lower surface 23 following the second donor peak 111, among the plurality of peaks 25 of the buffer region 20. By increasing the concentration of the second donor peak 111, the flat portion 150 is easily formed. The distribution of the hydrogen chemical concentration $C_H$ may have one or more hydrogen concentration peaks 194 between the depth position Z2 and the lower surface 23. The hydrogen concentration peak 194 may be disposed in the buffer region 20. The hydrogen concentration peak 194 may be disposed at the same depth position as the peak 25.

The accumulation region 16 in this example has a plurality of peaks 26. The peak 26 is a peak of the donor concentration. The first donor peak 121 in this example is disposed closer to the lower surface 23 than the accumulation region 16. A region 180 having a doping concentration lower than that of the flat portion 150 may be provided between the first donor peak 121 and the accumulation region 16. The doping concentration of the region 180 may be the bulk donor concentration $N_{B0}$.

In addition, the semiconductor apparatus 100 may use, as the semiconductor substrate 10, a non-doped substrate in which the entire ingot is not doped with a dopant such as phosphorus (P) at the time of manufacturing the semiconductor ingot. In this case, a base doping concentration Dn of the region 180 is lower than the bulk donor concentration $N_{B0}$. The base doping concentration Dn ranges, for example, from $1\times10^{10}$ atoms/cm$^3$ to $5\times10^{12}$ atoms/cm$^3$. The base doping concentration Dn may be $1\times10^{11}$ atoms/cm$^3$ or more. The base doping concentration Dn may be $5\times10^{12}$ atoms/cm$^3$ or less.

Figure 14:
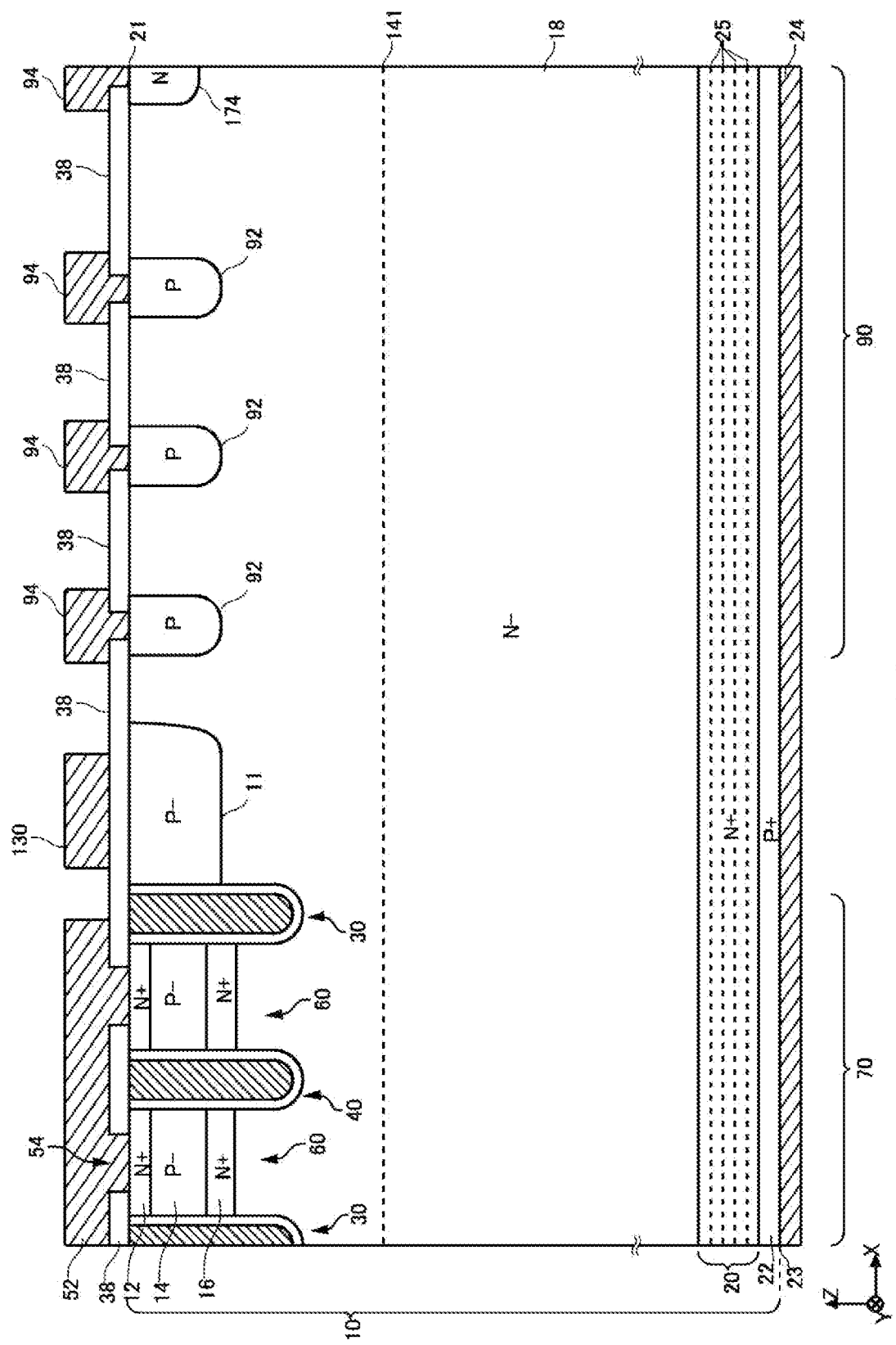
FIG. 14 is a diagram illustrating an example of a g-g cross section in FIG. 10.

FIG. 14 is a diagram illustrating an example of a g-g cross section in FIG. 10. The cross section illustrated in FIG. 14 is an XZ plane including the edge termination structure portion 90 and the transistor portion 70. The outer peripheral gate runner 130 is disposed above the semiconductor substrate 10 between the edge termination structure portion 90 and the transistor portion 70. The outer peripheral gate runner 130 is provided separately from the emitter electrode 52. The well region 11 is disposed in the upper surface 21 of the semiconductor substrate 10 between the edge termination structure portion 90 and the transistor portion 70. The well region 11 of this example is provided in a range shallower than the trench portion. The structure of the transistor portion 70 is similar to that of the transistor portion 70 described in FIG. 10 to FIG. 12.

The edge termination structure portion 90 is provided with a plurality of guard rings 92, a plurality of field plates 94, and a channel stopper 174. In the edge termination structure portion 90, a collector region 22 may be provided in a region in contact with the lower surface 23. Each guard ring 92 may be provided to surround the active portion 160 in the upper surface 21. The plurality of guard rings 92 may have a function of widening the depletion layer generated in the active portion 160 to the outside of the semiconductor substrate 10. As a result, electric field strength inside the semiconductor substrate 10 can be prevented, and the breakdown voltage of the semiconductor apparatus 100 can be improved.

The guard ring 92 of this example is a P type semiconductor region formed by ion implantation in the vicinity of the upper surface 21. The depth of the bottom portion of the guard ring 92 may be shallower than the bottom portions of the gate trench portion 40 and the dummy trench portion 30.

The upper surface of the guard ring 92 is covered with an interlayer dielectric film 38. The field plate 94 is formed of a conductive material such as metal or polysilicon. The field plate 94 may be formed of the same material as the emitter electrode 52. The field plate 94 is provided on the interlayer dielectric film 38. The field plate 94 is connected to the guard ring 92 through a through hole provided in the interlayer dielectric film 38.

The channel stopper 174 is provided to be exposed to the upper surface 21 and the side surface of the end side 162. The channel stopper 174 is an N type region having a doping concentration higher than that of the drift region 18. The channel stopper 174 has a function of terminating the depletion layer generated in the active portion 160 at the end side 162 of the semiconductor substrate 10.

In this example, the second peak 141 of hydrogen chemical concentration is disposed between the bottom portion of the well region 11 and the lower surface 23 of the semiconductor substrate 10. The second peak 141 may also be provided in the edge termination structure portion 90. The second peak 141 may also be provided between the edge termination structure portion 90 and the transistor portion 70. The second peak 141 may be provided in the entire XY plane of the semiconductor substrate 10. The pass-through region 106 illustrated in FIG. 1 and the like is formed from the lower surface 23 of the semiconductor substrate 10 to the second peak 141.

Figure 15:
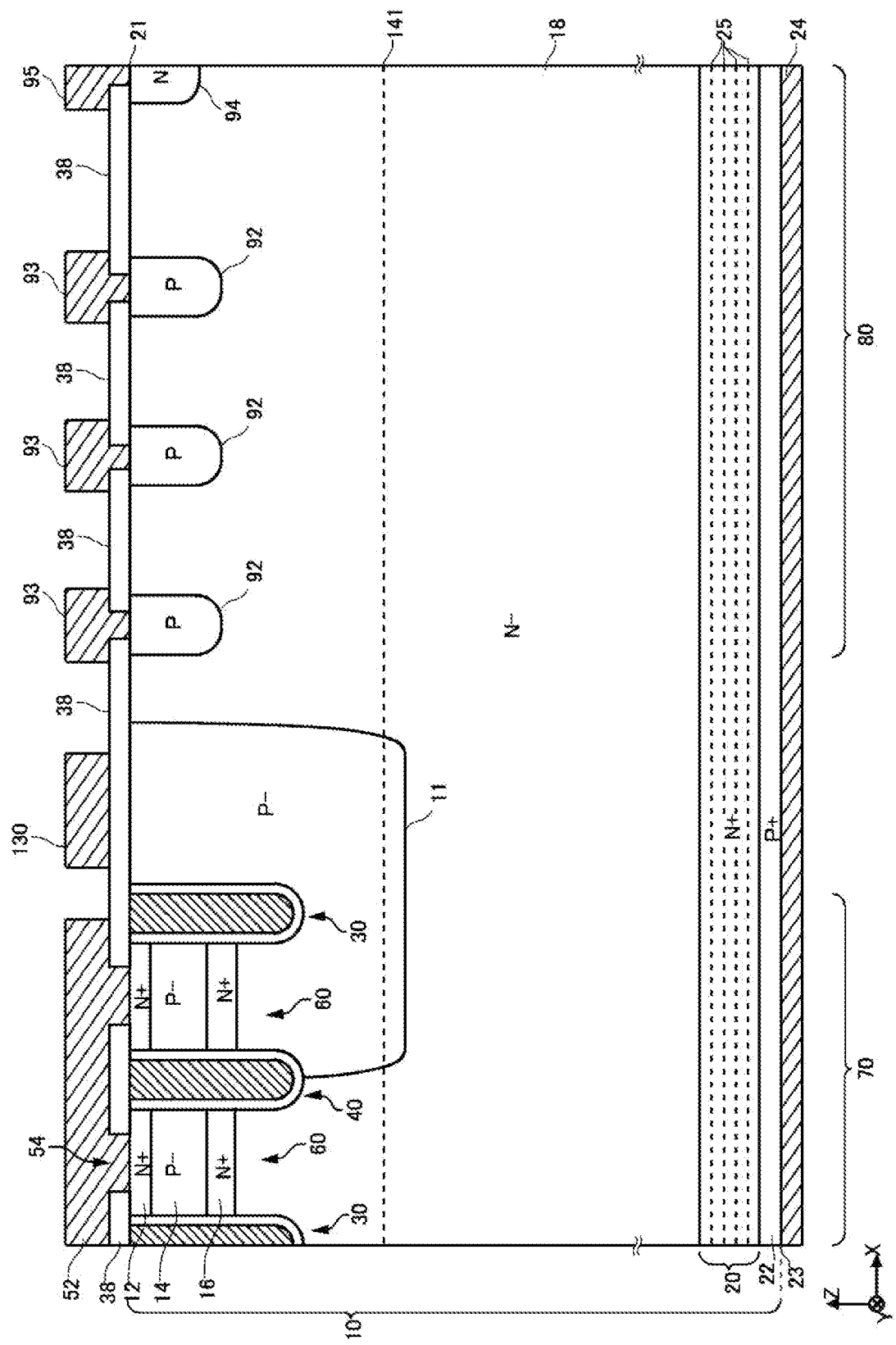
FIG. 15 is a diagram illustrating another example of the g-g cross section in FIG. 10.

FIG. 15 is a diagram illustrating another example of the g-g cross section in FIG. 10. In this example, the well region 11 is provided deeper than the lower ends of the gate trench portion 40 and the dummy trench portion 30. Other structures may be the same as in the example of FIG. 14. At least one trench portion in the cross section may be disposed inside the well region 11. In the example of FIG. 15, one trench portion closest to the edge termination structure portion 90 is disposed inside the well region 11.

The second peak 141 of this example is disposed between the lower end of the well region 11 and the upper surface 21 of the semiconductor substrate 10. In another example, the second peak 141 may be disposed between the lower end of the well region 11 and the lower surface 23 of the semiconductor substrate 10.

Figure 16:
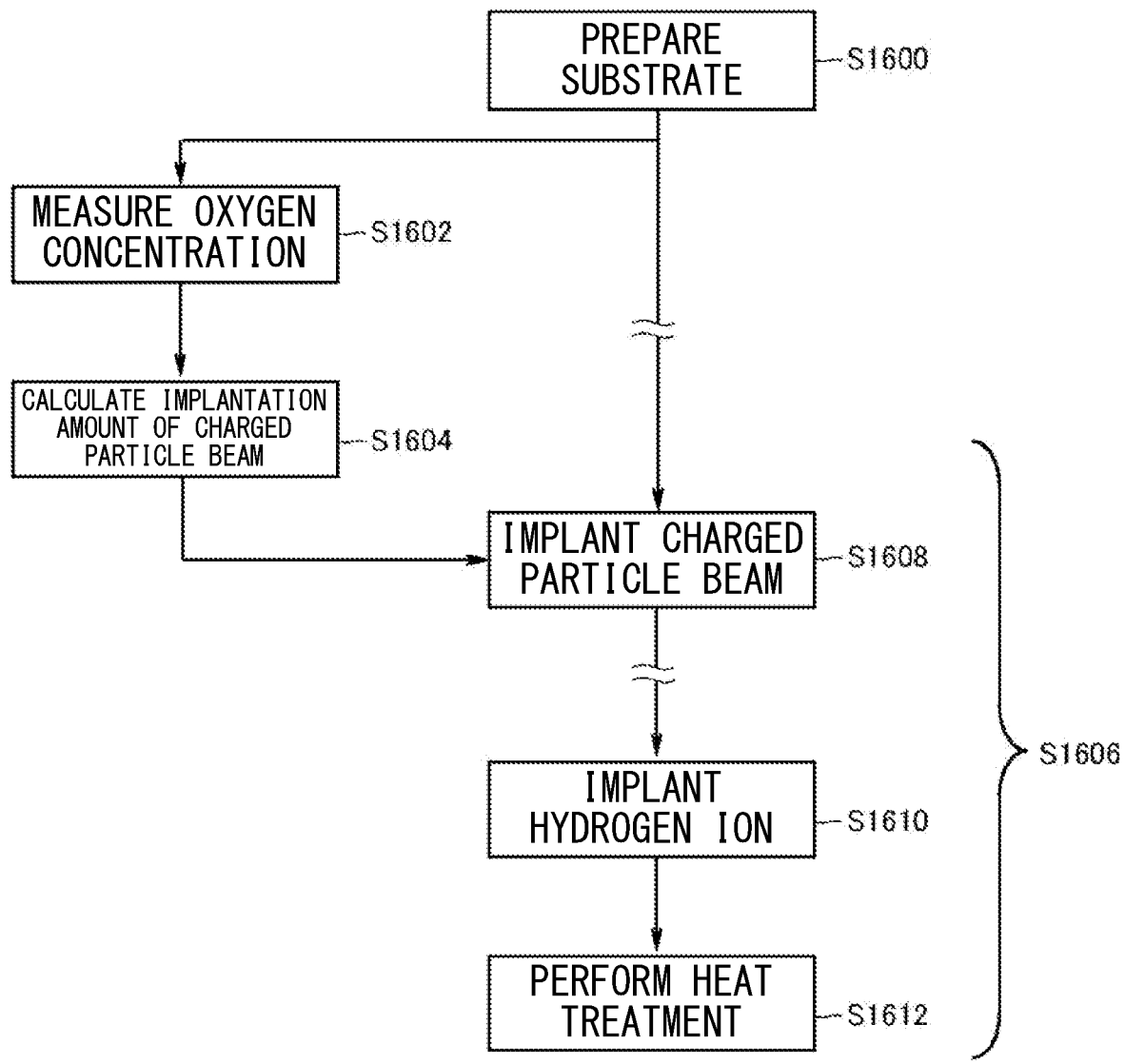
FIG. 16 is a diagram illustrating an example of a manufacturing method of the semiconductor apparatus 100.

FIG. 16 is a diagram illustrating an example of a manufacturing method of the semiconductor apparatus 100. The manufacturing method of this example includes a substrate preparing step S1600, a device manufacturing step S1606, a concentration measuring step S1602, and an implantation amount calculating step S1604.

In the substrate preparing step S1600, the semiconductor substrate 10 is prepared. The semiconductor substrate 10 is, for example, an MCZ substrate. In the concentration measuring step S1602, the oxygen chemical concentration $C_{OX}$ of the semiconductor substrate 10 is measured. In the concentration measuring step S1602, the oxygen chemical concentration may be measured by an FTIR method (infrared absorption spectroscopy). In the concentration measuring step S1602, a substrate resistance value (Ω·cm) of the semiconductor substrate 10 may be further measured.

In the implantation amount calculating step S1604, the implantation amount of the charged particle beam to be implanted to the depth position Z1 is calculated on the basis of the oxygen chemical concentration measured in S1602. As described above, the concentration of VOH defects to be formed can be controlled by the implantation amount of the charged particle beam. In the implantation amount calculating step S1604, the implantation amount of the charged particle beam may be calculated so that the substrate resistance value of the flat portion 150 described in FIG. 4 and the like becomes a predetermined target resistance value. The target resistance value may be set by a manufacturer of the semiconductor apparatus 100. The substrate resistance value of the flat portion 150 corresponds to the donor concentration of the flat portion 150 on a one-to-one basis. Therefore, the donor concentration increase amount is determined such that the substrate resistance value of the flat portion 150 becomes the target resistance value. The relationship among the implantation amount of the charged particle beam, the donor concentration increase amount, and the oxygen chemical concentration can be experimentally acquired in advance as illustrated in FIG. 6 and FIG. 7. In the implantation amount calculating step S1604, the implantation amount of the charged particle beam may be calculated on the basis of the relationship acquired in advance.

By substituting Expressions (11) and (12) described above into Expression (2), Expression (13) is obtained.

$$N_{VOH} = c \times (D_H)^d + e \times (D_H)^f \times C_{OX} \qquad \text{Expression (13)}$$

In addition, Expressions (1) to (13) are represented by Expression (14).

$$N_F - N_{B0} = c \times (D_H)^d + e \times (D_H)^f \times C_{OX} \qquad \text{Expression (14)}$$

The final doping concentration $N_F$ is a set value and the bulk donor concentration $N_{B0}$ is known from the measured value or the specification value of the semiconductor wafer. The oxygen chemical concentration $C_{OX}$ is known from the measurement of S1602. The parameters c, d, e, and f can be acquired experimentally in advance as described above. Therefore, the variable of Expression (14) is only the implantation amount of the charged particles (dose amount $D_H$ of hydrogen ions in this example). By numerically solving Expression (14), the implantation amount of charged particles can be calculated. The implantation amount $D_H$ of the charged particles obtained from Expression (14) may have a width (error) reflecting a variation in the value of each data in the fitting of Expressions (8), (10), and (11). That is, if the implantation amount $D_H$ of the charged particles is, for example, in the range of ±50% with respect to the value obtained from Expression (13) or Expression (14), the implantation amount may be considered as a value obtained from Expression (13) or Expression (14).

The device manufacturing step S1606 of this example has a particle implanting step S1608, a hydrogen implanting step S1610, and a heat treatment step S1612. The device manufacturing step S1606 has a step of forming each configuration described in FIG. 10 to FIG. 12, but is omitted in FIG. 16.

In the particle implanting step S1608, the charged particle beam is implanted from the lower surface 23 of the semiconductor substrate 10 so as to pass through half or more of the thickness of the semiconductor substrate 10 in the depth direction. In S1608, hydrogen ions such as protons may be implanted as the charged particle beam. As a result, the second peak 141 as illustrated in FIG. 2 is formed. In addition, the distribution of the vacancy concentration $N_V$ as illustrated in FIG. 2 is formed. The implantation amount of the charged particle beam in S1608 is adjusted to the implantation amount calculated in the implantation amount calculating step S1604. As a result, it is possible to form vacancies having a concentration such that the flat portion 150 has a target resistance value.

In a case where the charged particle beam is an electron beam, the second peak 141 is not formed. Also in this case, vacancies having a concentration corresponding to the implantation amount of the electron beam are formed. Therefore, by adjusting the implantation amount of the electron beam, it is possible to form vacancies having a concentration such that the flat portion 150 has a target resistance value.

In the hydrogen implanting step S1610, hydrogen ions are implanted into the lower surface 23 side of the semiconductor substrate 10. In S1608, hydrogen ions are implanted into the depth position Z2 described in FIG. 1 and the like. In the hydrogen implanting step S1610, hydrogen ions having a concentration that can sufficiently terminate the vacancies formed in S1608 may be implanted. The particle implanting step S1608 and the hydrogen implanting step S1610 are performed before the heat treatment step S1612.

In the heat treatment step S1612, the semiconductor substrate 10 is subjected to heat treatment. The heat treatment temperature of the heat treatment step S1612 may range from 350° C. to 380° C. By such a method, even if the oxygen chemical concentration of the semiconductor substrate 10 varies, the resistance value of the flat portion 150 can be adjusted to a target value.

Before the particle implanting step S1608, a structure on the upper surface 21 side of the semiconductor substrate 10 in the structure illustrated in FIG. 12 may be formed. The structure on the upper surface 21 side may include each trench portion, the emitter region 12, the base region 14, the accumulation region 16, the interlayer dielectric film 38, and the emitter electrode 52. The cathode region 82 and the collector region 22 may be formed before the particle implanting step S1608. In the particle implanting step S1608, the charged particle beam may be implanted to the depth position Z1 closer to the lower surface 23 side than the lower end of the gate trench portion 40. As a result, it is possible to suppress the influence of the damage due to the implantation of the charged particle beam on the gate insulating film 42.

Figure 17:
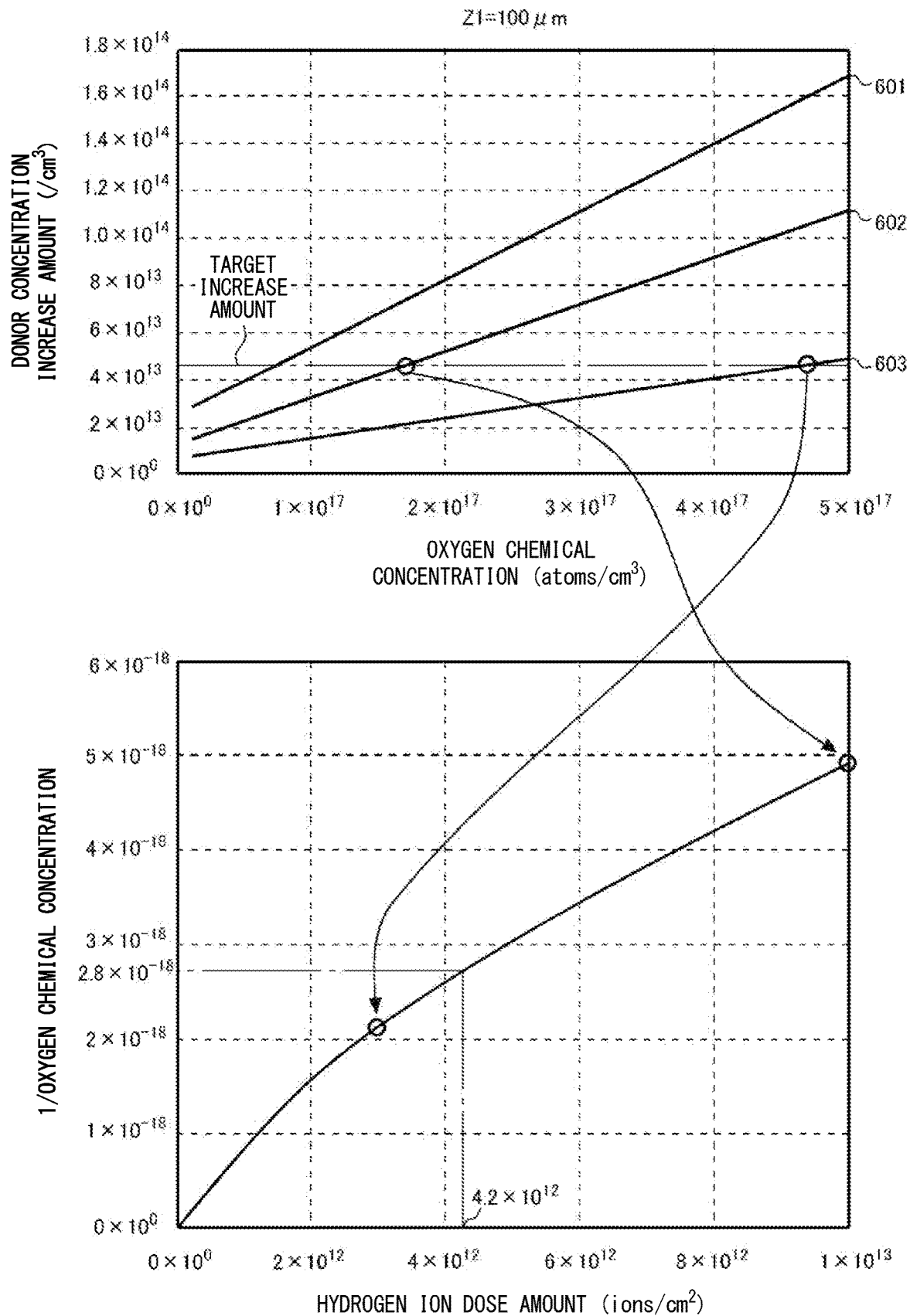
FIG. 17 is a diagram illustrating another example of a calculation method of the implantation amount of a charged particle beam.

FIG. 17 is a diagram illustrating another example of a calculation method of the implantation amount of the charged particle beam. The charged particle beam of this example is hydrogen ions. FIG. 17 includes an upper graph illustrating a relationship between the oxygen chemical concentration and the donor concentration increase amount, and a lower graph illustrating a relationship between the hydrogen ion dose amount and the reciprocal of the oxygen chemical concentration. The upper graph is an enlarged view of a part of the graph of FIG. 6.

In the upper graph, the target value of the donor concentration increase amount is indicated by a chain line. The target increase amount is an increase amount for setting the resistance value of the flat portion 150 to a target value. From the upper graph, the oxygen chemical concentration corresponding to the target increase amount is obtained on the straight lines 602 and 603. The lower graph plots the relationship between the reciprocal of the oxygen chemical concentration obtained from the upper graph and the hydrogen ion dose amount on the straight lines 602 and 603. In the lower graph, the relationship between the reciprocal of the oxygen chemical concentration and the hydrogen ion dose amount is approximated by a curve.

If the relationship illustrated in the lower graph is acquired in advance, the hydrogen ion dose amount to be implanted can be calculated from the oxygen chemical concentration of the semiconductor substrate 10 used for manufacturing the semiconductor apparatus 100. For example, in a case where the oxygen chemical concentration of the semiconductor substrate 10 is $3.7 \times 10^{17}$ atoms/cm$^3$, the reciprocal of the oxygen chemical concentration is $2.8 \times 10^{-18}$. From the relationship in the lower graph, the hydrogen ion dose amount corresponding to $2.8 \times 10^{-18}$ can be calculated as $4.2 \times 10^{12}$ ions/cm$^2$. The relationship in the lower graph changes according to the target increase amount of the donor concentration. Therefore, if the relationship in the upper graph is acquired in advance, the hydrogen ion dose amount to be implanted can be calculated from the target increase amount of the donor concentration and the oxygen chemical concentration.

Figure 18:
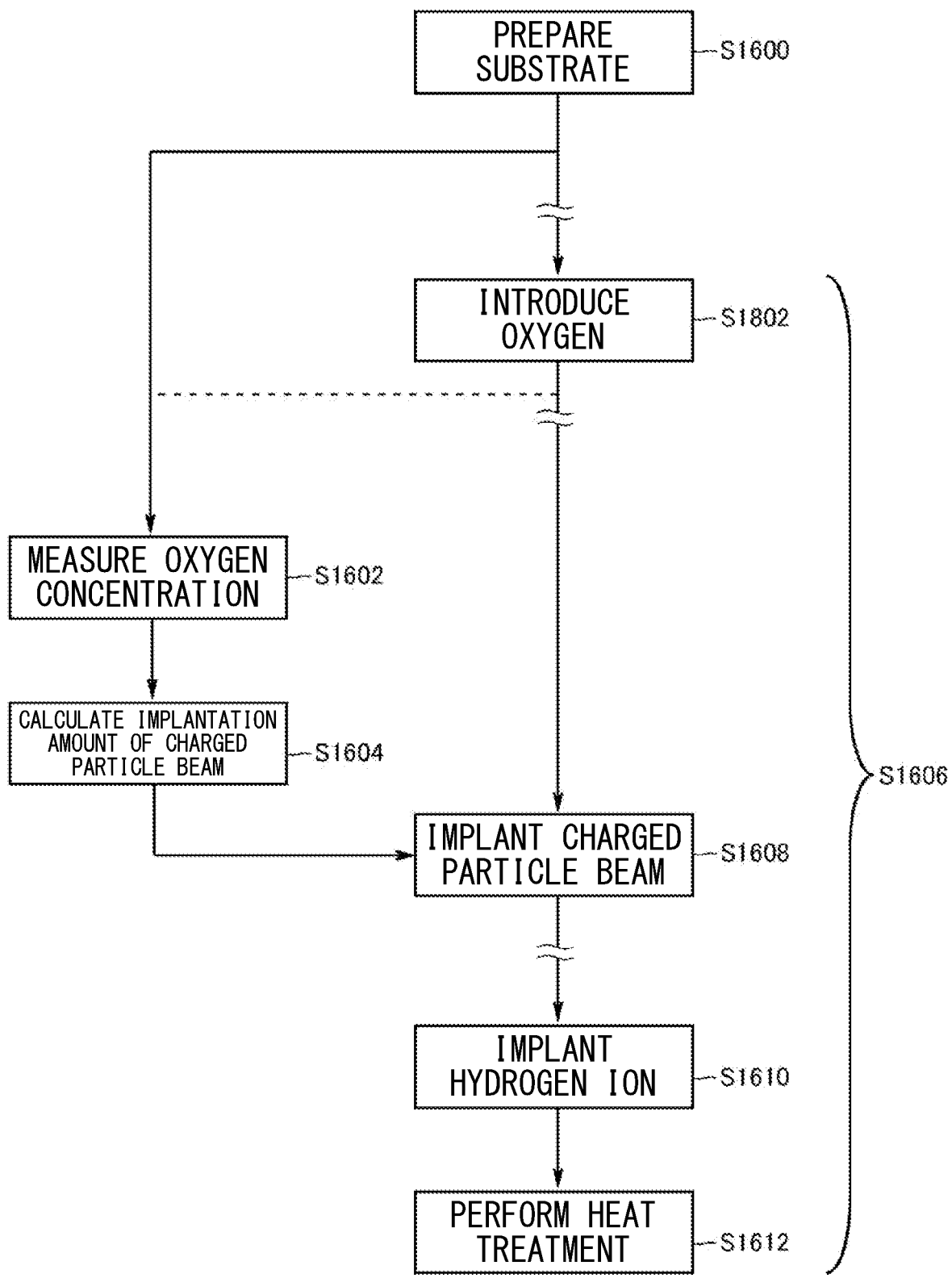
FIG. 18 is a diagram illustrating another example of the manufacturing method of the semiconductor apparatus 100.

FIG. 18 is a diagram illustrating another example of the manufacturing method of the semiconductor apparatus 100. The manufacturing method of this example further includes an oxygen introducing step S1802 as compared with the example illustrated in FIG. 16. The other steps are the same as in the example of FIG. 16. The oxygen introducing step S1802 is performed before the particle implanting step S1608.

In the oxygen introducing step S1802, oxygen is introduced into the semiconductor substrate 10. In the oxygen introducing step S1802, oxygen may be introduced into the semiconductor substrate 10 by performing heat treatment on the semiconductor substrate 10 in an oxygen-containing atmosphere. In the oxygen introducing step S1802, oxygen may be introduced so that the oxygen chemical concentration of the semiconductor substrate 10 falls within a predetermined range. By introducing oxygen into the semiconductor substrate 10, the donor concentration of the flat portion 150 can be easily adjusted. For example, even in a case where the oxygen chemical concentration in the semiconductor substrate 10 prepared in S1600 is low and the VOH defects cannot be sufficiently formed, the oxygen chemical concentration can be increased by introducing oxygen into the semiconductor substrate 10.

The oxygen chemical concentration (referred to as an introduction concentration) introduced in the oxygen introducing step S1802 may be larger than the oxygen chemical concentration (referred to as an original concentration) of the semiconductor substrate 10 before the oxygen introducing step S1802. Since the introduction concentration can be accurately controlled by conditions such as the temperature and time of the heat treatment and the oxygen concentration in the atmosphere described above, the variation in the oxygen chemical concentration of the semiconductor substrate 10 can be reduced by making the ratio of the introduction concentration larger than the original concentration. The introduction concentration may be 2 times or more, 5 times or more, or 10 times or more the original concentration.

In the oxygen introducing step S1802, oxygen may be introduced into the semiconductor substrate 10 according to the oxygen chemical concentration measured in the concentration measuring step S1602. For example, oxygen may be introduced so that the sum of the oxygen chemical concentration introduced in the oxygen introducing step S1802 and the oxygen chemical concentration measured in the concentration measuring step S1602 becomes a predetermined target value. In the concentration measuring step S1602, the oxygen chemical concentration of the semiconductor substrate 10 after the oxygen introducing step S1802 is performed may be measured. In this case, the implantation amount of the charged particle beam can be calculated more accurately.

Figure 19:
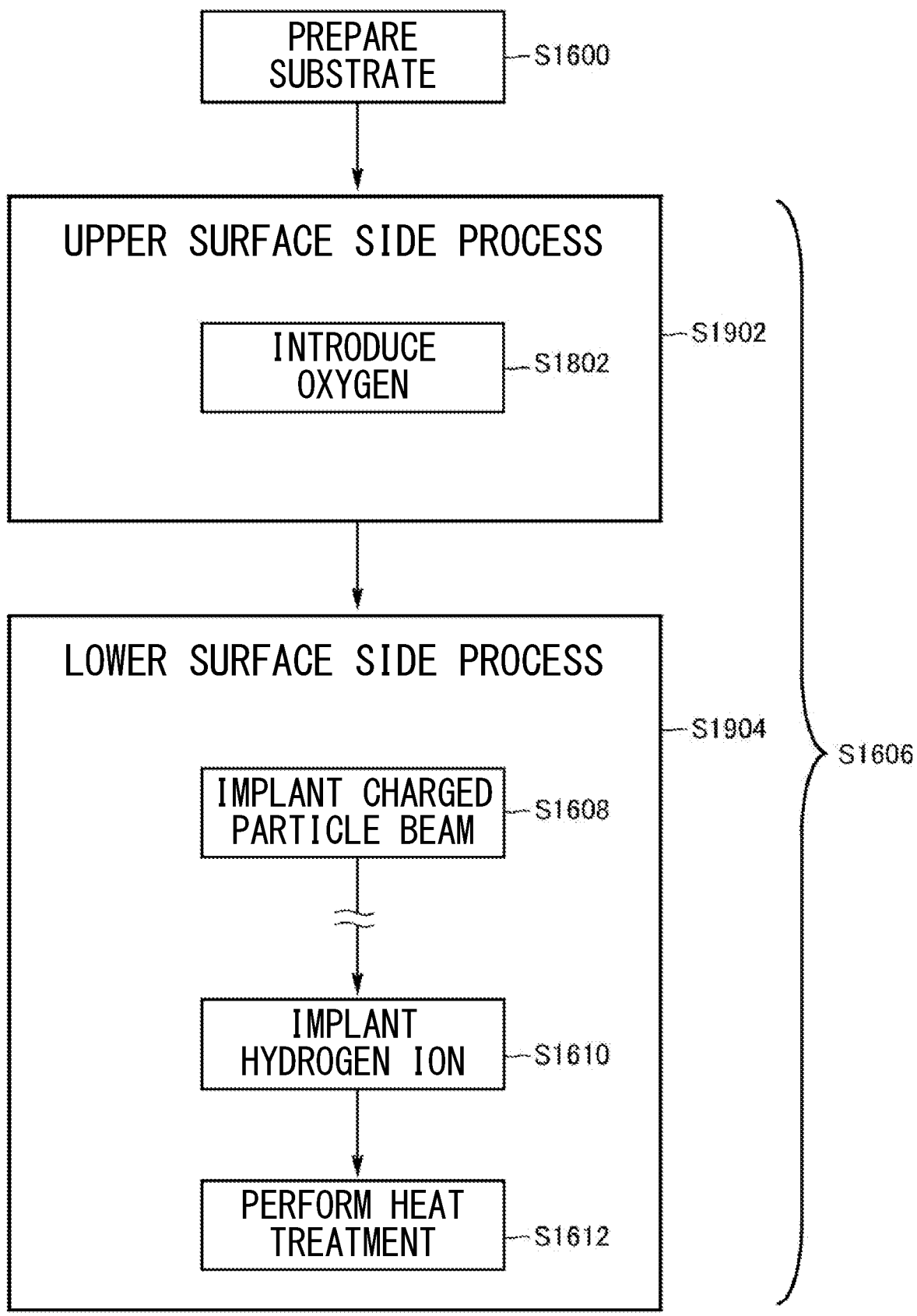
FIG. 19 is a diagram illustrating an example of a device manufacturing step S1606.

FIG. 19 is a diagram illustrating an example of the device manufacturing step S1606. The device manufacturing step S1606 of this example includes an upper surface side process S1902 and a lower surface side process S1904. The upper surface side process S1902 is a step of forming a structure on the upper surface 21 side of the semiconductor substrate 10. The structure on the upper surface 21 side includes, for example, a trench portion, the emitter region 12, the base region 14, the accumulation region 16, the well region 11, the emitter electrode 52, the gate runner, the guard ring 92, the field plate 94, the channel stopper 174, and the interlayer dielectric film 38. The lower surface side process S1904 is a step of forming a structure on the lower surface 23 side of the semiconductor substrate 10. The structure on the lower surface 23 side includes, for example, the cathode region 82, the collector region 22, the buffer region 20, and the collector electrode 24.

In this example, in the upper surface side process S1902, the oxygen introducing step S1802 is performed. The oxygen introducing step S1802 may also serve as a heat treatment step performed to form a structure on the upper surface 21 side. For example, the oxygen introducing step S1802 may be a heat treatment step performed after a dopant is implanted into the emitter region 12, the base region 14, or the accumulation region 16.

In this example, in the lower surface side process S1904, a particle implanting step S1608, a hydrogen implanting step S1610, and a heat treatment step S1612 are performed. The hydrogen implanting step S1610 and the heat treatment step S1612 may be part of the process of forming the buffer region 20. That is, in the hydrogen implanting step S1610, any peak 25 of the buffer region 20 may be formed. The heat treatment step S1612 may be performed after hydrogen ions are implanted into the positions of the plurality of peaks 25 in the buffer region 20.

Figure 20:
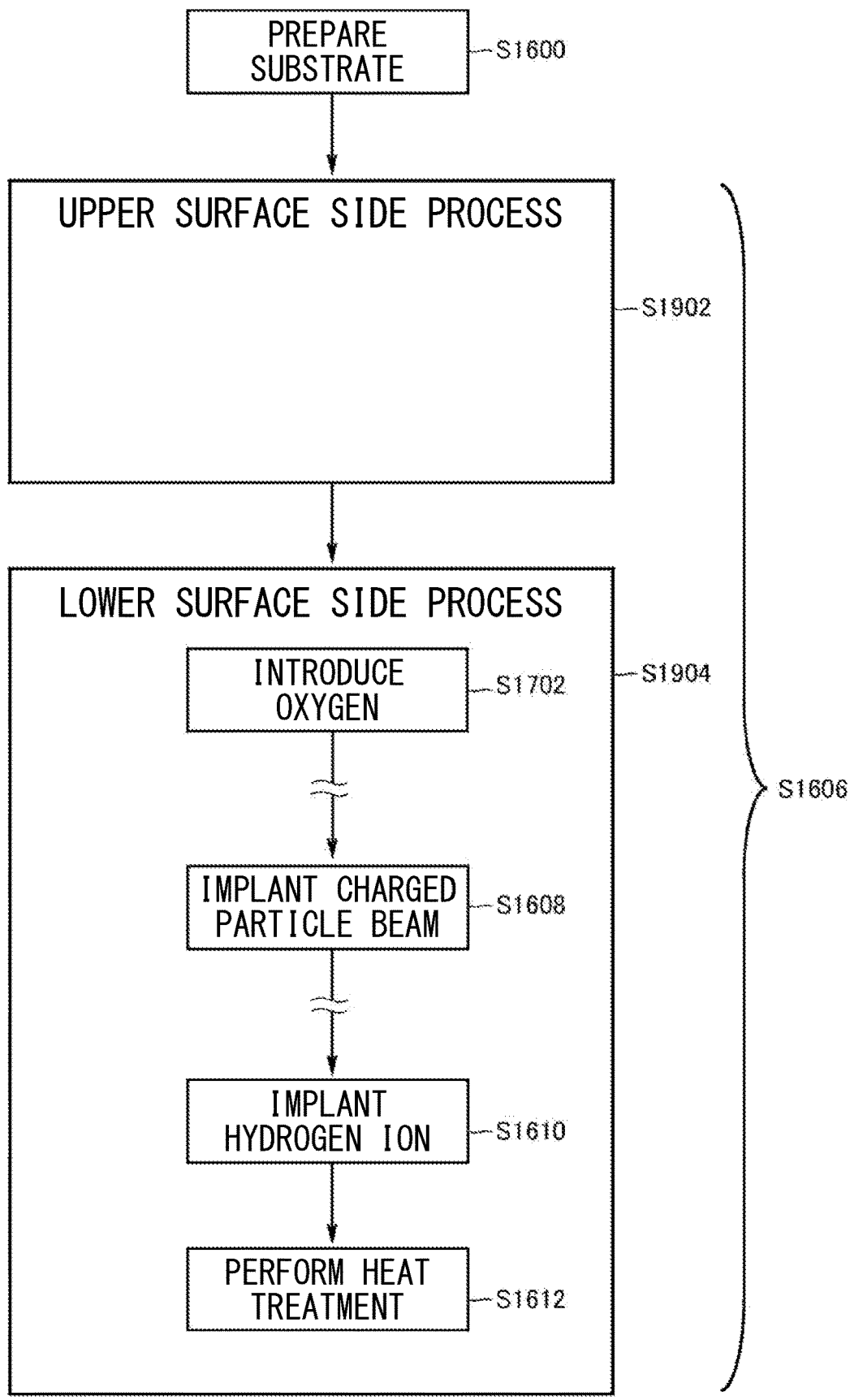
FIG. 20 is a diagram illustrating another example of the device manufacturing step S1606.

FIG. 20 is a diagram illustrating another example of the device manufacturing step S1606. The device manufacturing step S1606 of this example is different from the example of FIG. 19 in that the oxygen introducing step S1802 is performed in the lower surface side process S1904. The other steps are the same as in the example of FIG. 19. The oxygen introducing step S1802 may also serve as a heat treatment step performed to form a structure on the lower surface 23 side. For example, the oxygen introducing step S1802 may be a heat treatment step performed after a dopant is implanted into the collector region 22 or the cathode region 82. Also in this example, the oxygen introducing step S1802 is performed before the hydrogen implanting step S1610. The oxygen introducing step S1802 may be performed before the charged particle implanting step S1608.

Figure 21:
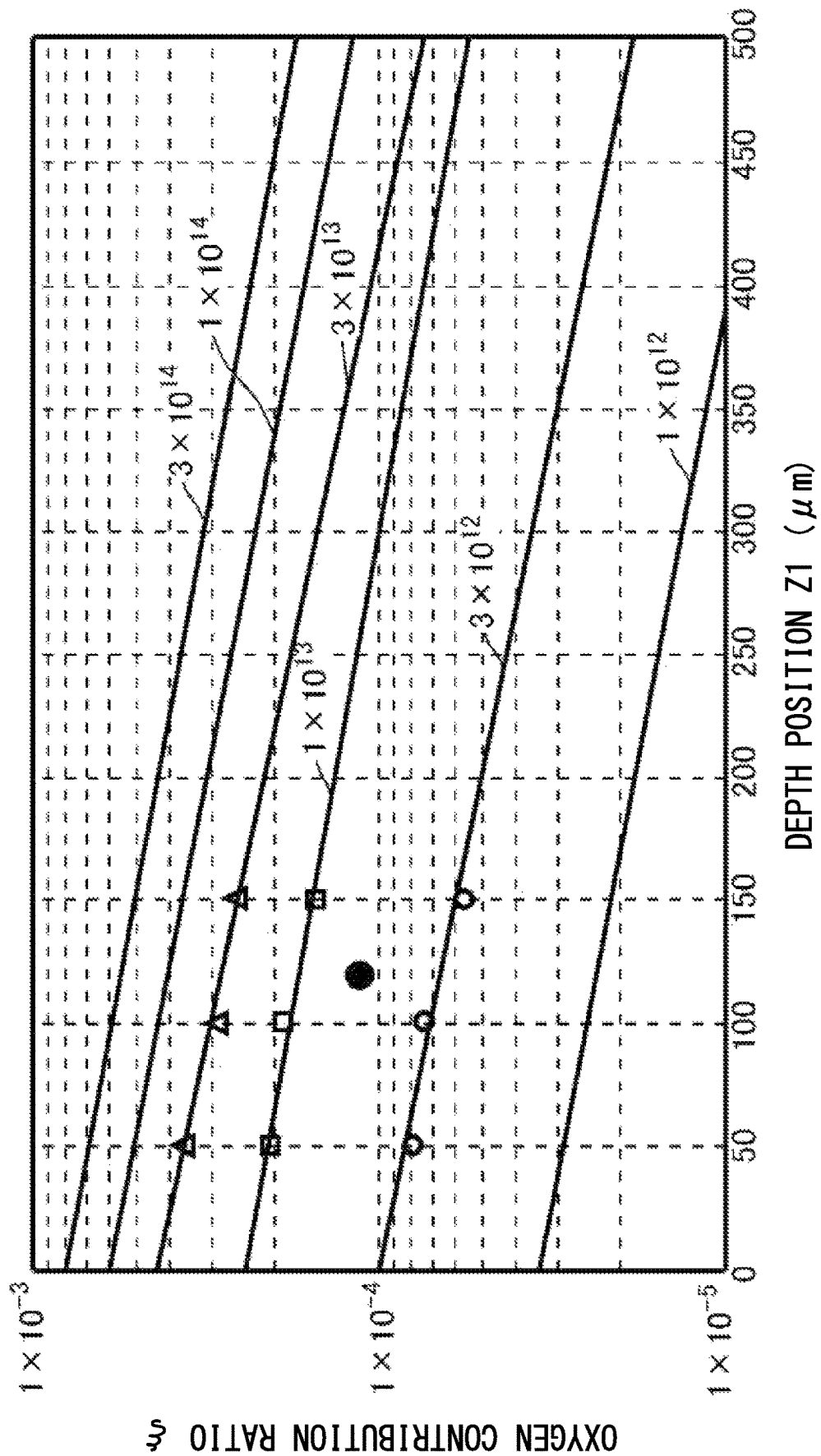
FIG. 21 is a diagram illustrating a relationship between the oxygen contribution ratio $\xi$ and a depth position Z1 at which a second peak 141 is disposed.

FIG. 21 is a diagram illustrating a relationship between the oxygen contribution ratio $\xi$ and the depth position Z1 at which the second peak 141 is disposed. FIG. 21 illustrates the relationship between the oxygen contribution ratio $\xi$ and the depth position Z1 for each of the cases where the hydrogen ion dose amount is $3\times10^{14}$ ions/cm$^2$, $1\times10^{14}$ ions/cm$^2$, $3\times10^{13}$ ions/cm$^2$, $1\times10^{13}$ ions/cm$^2$, $3\times10^{12}$ ions/cm$^2$, or $1\times10^{12}$ ions/cm$^2$.

As illustrated in FIG. 8 and FIG. 9, the oxygen contribution ratio changes depending on the depth position Z1. Each point plotted by a square in FIG. 8 is plotted at a depth position of Z1=100 μm in FIG. 21. Each point plotted by a square in FIG. 9 is plotted at a depth position of Z1=50 μm in FIG. 21. Further, a plot at a depth position of Z1=150 μm is added to FIG. 21. The plots in FIG. 21 are omitted for the hydrogen ion dose amounts of $3\times10^{14}$ ions/cm$^2$, $1\times10^{14}$ ions/cm$^2$, and $1\times10^{12}$ ions/cm$^2$. A line obtained by linearly approximating (the horizontal axis is linear, and the vertical axis is common logarithm) these plots for each hydrogen ion dose amount by the least squares method is indicated by a thick line in FIG. 21. The oxygen contribution ratio may decrease exponentially with respect to the depth position Z1.

The oxygen contribution ratio $\xi$ can be detected from the relationship illustrated in FIG. 21, the dose amount $D_H$ of hydrogen ions with respect to the depth position Z1, and the depth position Z1. The depth position Z1 can be measured from a peak position in the hydrogen chemical concentration distribution of the semiconductor apparatus 100. The dose amount $D_H$ can be measured by integrating the hydrogen chemical concentration in the depth direction with respect to a mountain-shaped peak of the hydrogen chemical concentration having a vertex at the depth position Z1. The integration range may be, for example, the full width (FW 10% M) at 10% of the peak value of the hydrogen chemical concentration. Alternatively, the dose amount $D_H$ may be a value obtained by multiplying the peak value of the hydrogen chemical concentration by the full width at half maximum (FWHM).

For example, a case where the depth position Z1 is 120 μm and the dose amount $D_H$ is $5\times10^{12}$ ions/cm$^2$ is indicated by a black circle in FIG. 21. In this case, the oxygen contribution ratio $\xi$ is approximately $\xi=1.2\times10^{-4}$. The value is defined as $\xi 1$.

Figure 22:
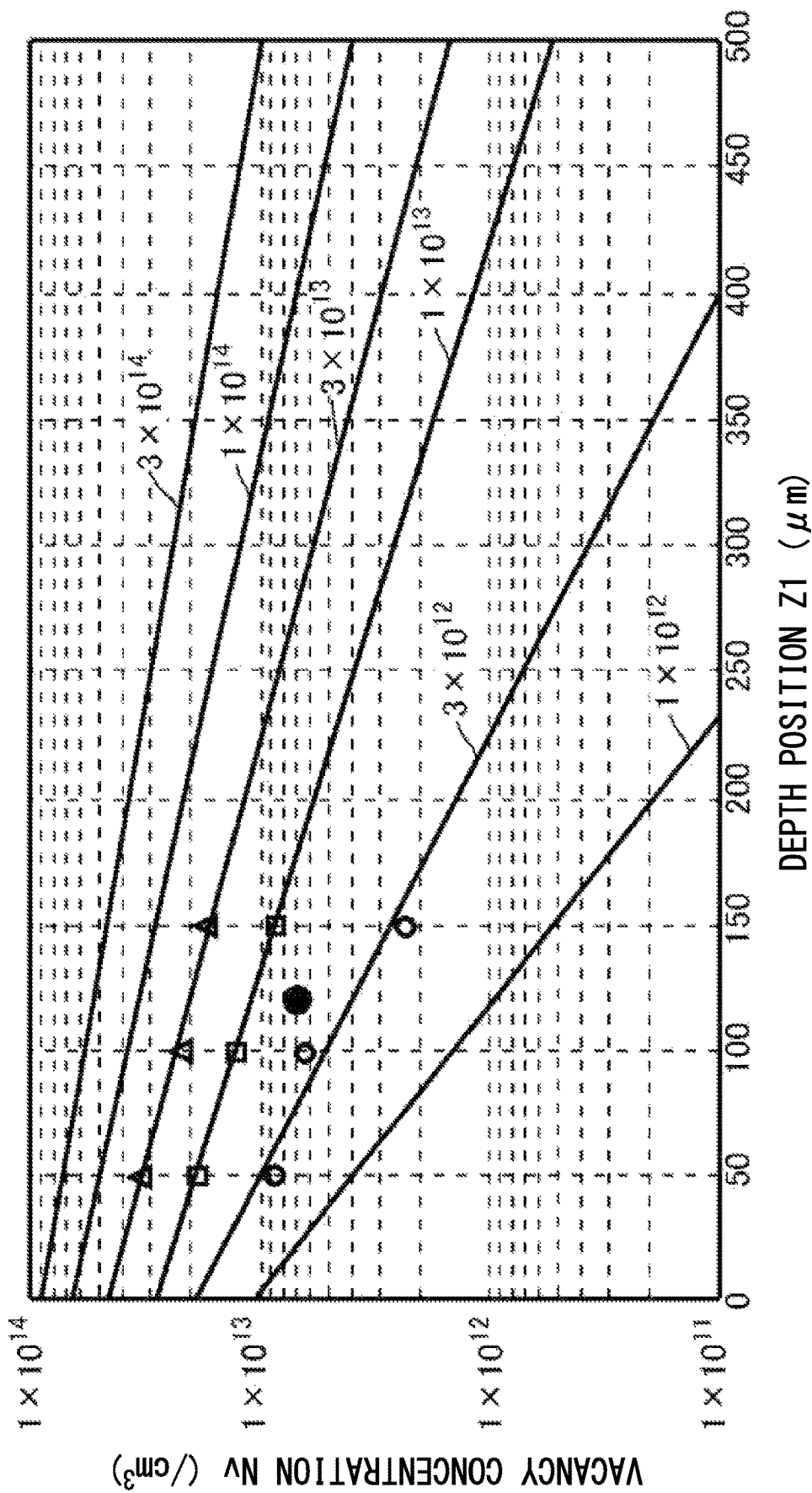
FIG. 22 is a diagram illustrating a relationship between the vacancy concentration $N_V$ and the depth position Z1 at which the second peak 141 is disposed.

FIG. 22 is a diagram illustrating a relationship between the vacancy concentration $N_V$ and the depth position Z1 at which the second peak 141 is disposed. FIG. 21 illustrates the relationship between the oxygen contribution ratio $\xi$ and the depth position Z1 for each of the cases where the hydrogen ion dose amount is $3\times10^{14}$ ions/cm$^2$, $1\times10^{14}$ ions/cm$^2$, $3\times10^{13}$ ions/cm$^2$, $1\times10^{13}$ ions/cm$^2$, $3\times10^{12}$ ions/cm$^2$, or $1\times10^{12}$ ions/cm$^2$. As illustrated in FIG. 8 and FIG. 9, the vacancy concentration $N_V$ also changes depending on the depth position Z1 similar to the oxygen contribution ratio $\xi$. The graph of FIG. 22 is created in the same manner as the graph of FIG. 21. The vacancy concentration $N_V$ may decrease exponentially with respect to the depth position Z1.

The vacancy concentration $N_V$ can be detected from the relationship illustrated in FIG. 22, the dose amount $D_H$ of hydrogen ions with respect to the depth position Z1, and the depth position Z1. The depth position Z1 and the dose amount $D_H$ can be measured from the semiconductor apparatus 100 as described in FIG. 21. For example, a case where the depth position Z1 is 120 μm and the dose amount $D_H$ is $5\times10^{12}$ ions/cm$^2$ is indicated by a black circle in FIG. 22. In this case, the vacancy concentration $N_V$ is approximately $N_V=7\times10^{12}$ ions/cm$^3$. The value is defined as $N_V 1$.

From the calculated oxygen contribution ratio $\xi 1$ and the vacancy concentration $N_V 1$, and the oxygen chemical concentration $C_{OX}$, a VOH defect concentration $N_{VOH1}$ (a first value of the hydrogen donor concentration) can be calculated using Expression (2). That is, the first value $N_{VOH1}$ is the sum of the value obtained by multiplying the oxygen chemical concentration in the flat portion 150 by the oxygen contribution ratio and the vacancy concentration of the flat portion 150. The oxygen chemical concentration $C_{OX}$ may be obtained by measuring the oxygen chemical concentration in the semiconductor apparatus 100. For example, a case where the oxygen chemical concentration $C_{OX}$ is $2\times10^{17}$ atoms/cm$^3$, the VOH defect concentration $N_{VOH1}$ is as follows.

$$N_{VOH1}=7\times10^{12}+1.2\times10^{-4}\times2\times10^{17}=3.1\times10^{13} \text{ (atoms}/cm^3)$$

On the other hand, the VOH defect concentration $N_{VOH}$ can be measured from the characteristics of the semiconductor apparatus 100. For example, the VOH defect concentration $N_{VOH}$ can be measured from the difference ($N_F$−$N_{B0}$) between the final doping concentration $N_F$ and the bulk donor concentration $N_{B0}$. The final doping concentration $N_F$ and the bulk donor concentration $N_{B0}$ can be measured from the semiconductor apparatus 100. The measured VOH defect concentration $N_{VOH}$ is defined as $N_{VOH2}$ (a second value of the hydrogen donor concentration). That is, the second value $N_{VOH2}$ is a difference obtained by subtracting the bulk donor concentration from the donor concentration of the flat portion 150. For example, in a case where the final doping concentration $N_F$ is $7\times10^{13}$ (atoms/cm$^3$) and the bulk donor concentration $N_{B0}$ is $2\times10^{12}$ (atoms/cm$^3$), the VOH defect concentration $N_{VOH2}$ is as follows.

$$N_{VOH2}=7\times10^{13}-2\times10^{12}=6.8\times10^{13} \text{ (atoms}/cm^3)$$

When the calculated $N_{VOH1}$ sufficiently matches the actually measured value $N_{VOH2}$, it can be determined that the calculated oxygen contribution ratio ξ1 and the calculated vacancy concentration $N_V 1$ are substantially correct. That is, if the ratio $N_{VOH1}/N_{VOH2}$ of the first value $N_{VOH1}$ of the hydrogen donor concentration to the second value $N_{VOH2}$ of the hydrogen donor concentration is $0.1 \leq N_{VOH1}/N_{VOH2} \leq 10$, it may be considered that they sufficiently match with each other. In the case of the above example, $N_{VOH1}/N_{VOH2} = (3.1 \times 10^{13})/(6.8 \times 10^{13}) \approx 0.46)$, and the calculated oxygen contribution ratio ξ1 and vacancy concentration $N_V 1$ are correct.

If the calculated $N_{VOH1}$ sufficiently matches the actually measured value $N_{VOH2}$ or the calculated oxygen contribution ratio ξ1 is within a predetermined range, it can be determined that the oxygen contribution ratio ξ of the semiconductor apparatus 100 is within the range. Similarly, if the calculated $N_{VOH1}$ sufficiently matches the actually measured value $N_{VOH2}$, or the calculated vacancy concentration $N_V 1$ falls within a predetermined range, it can be determined that the vacancy concentration $N_V 1$ of the semiconductor apparatus 100 falls within the range.

In the case of $0.2 \leq N_{VOH1}/N_{VOH2} \leq 5$, it may be determined that the calculated $N_{VOH1}$ sufficiently matches the actually measured value $N_{VOH2}$. In the case of $0.3 \leq N_{VOH1}/N_{VOH2} \leq 3$, it may be determined that the calculated $N_{VOH1}$ sufficiently matches the actually measured value $N_{VOH2}$. In the case of $0.5 \leq N_{VOH1}/N_{VOH2} \leq 2$, it may be determined that the calculated $N_{VOH1}$ sufficiently matches the actually measured value $N_{VOH2}$.

In Expression (1), the contribution of oxygen has been taken into account in the generation of hydrogen donors (VOH defects). However, as will be described later, in a case where the depth position Z1 is shallow, a case where the hydrogen ion dose amount is high, or a case where the carbon chemical concentration is high, it is conceivable that the contribution of carbon to the generation of hydrogen donors cannot be ignored. The ratio of the chemical concentration of carbon contributing to the doping concentration of the hydrogen donors to the chemical concentration of carbon is defined as a carbon contribution ratio η. The carbon contribution ratio η may be considered as a ratio of a chemical concentration of carbon atoms contributing to formation of a hydrogen donor among chemical concentrations of all carbon atoms in a predetermined region (for example, a depth position from the lower surface or the upper surface). The carbon contribution ratio η may be a ratio of the increased amount of the concentration of hydrogen donors to the increased amount of the carbon chemical concentration in a case where the carbon chemical concentration is increased. The carbon contribution ratio may be a value from 0.01% to 10% (that is, 0.0001 to 0.1).

Figure 23:
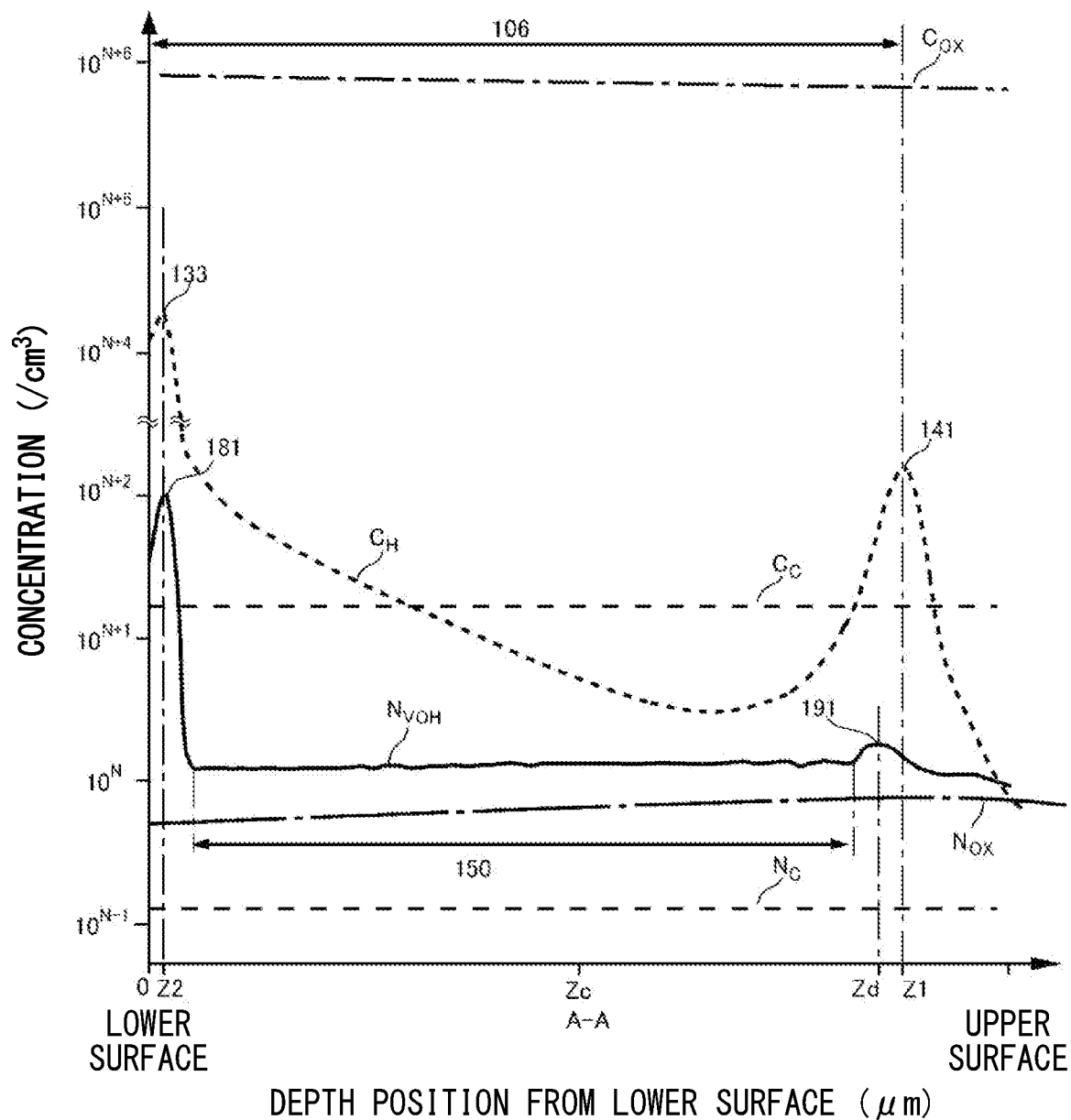
FIG. 23 illustrates a depth direction distribution of a hydrogen chemical concentration $C_H$, an oxygen chemical concentration $C_{OX}$, a carbon chemical concentration $C_C$, a contributing oxygen concentration $N_{OX}$, a contributing carbon concentration $N_C$, and a VOH defect concentration $N_{VOH}$ at positions indicated by line A-A of FIG. 1 after heat treatment.

FIG. 23 illustrates the depth direction distribution of the hydrogen chemical concentration $C_H$, the oxygen chemical concentration $C_{OX}$, the carbon chemical concentration $C_C$, the contributing oxygen concentration $N_{OX}$, the contributing carbon concentration $N_C$, and the VOH defect concentration $N_{VOH}$ at the position indicated by the line A-A in FIG. 1 after the heat treatment. The configuration and the manufacturing method of the semiconductor apparatus 100 of this example other than the carbon chemical concentration $C_C$ and the contributing carbon concentration $N_C$ are similar to those of the semiconductor apparatus 100 described in FIG. 1 to FIG. 22.

Carbon is often introduced at the time of manufacturing an ingot, and is often uniformly distributed inside the semiconductor substrate 10. The carbon chemical concentration $C_C$ may be uniform throughout the semiconductor substrate 10. In another example, the carbon chemical concentration $C_C$ may monotonically increase or monotonically decrease from the lower surface 23 toward the upper surface 21 of the semiconductor substrate 10. In addition, carbon near the upper surface 21 or the lower surface 23 of the semiconductor substrate 10 may be released to the outside of the semiconductor substrate 10. Similar to the oxygen chemical concentration $C_{OX}$, the carbon chemical concentration $C_C$ may monotonously decrease toward the upper surface 21 and the lower surface 23 in the vicinity of the upper surface 21 and the lower surface 23. Other than in the vicinity of the upper surface 21 and the lower surface 23, the carbon chemical concentration $C_C$ may be uniform as described above, and may monotonically increase or decrease.

The carbon chemical concentration $C_C$ in the flat portion 150 may range from $1 \times 10^{13}$ atoms/cm³ to $1 \times 10^{16}$ atoms/cm³. The carbon chemical concentration $C_C$ may be $1 \times 10^{14}$ atoms/cm³ or more. The carbon chemical concentration $C_C$ may be $5 \times 10^{15}$ atoms/cm³ or less, or $2 \times 10^{15}$ atoms/cm³ or less. The carbon chemical concentration $C_C$ may be less than the oxygen chemical concentration $C_{OX}$. The carbon chemical concentration $C_C$ may be 1/100 or less, or 1/1000 or less of the oxygen chemical concentration $C_{OX}$. In a case where the carbon chemical concentration $C_C$ of the semiconductor substrate 10 is defined in the present specification, the whole between the second peak 141 and the first peak 133 satisfies the definition of the carbon chemical concentration unless otherwise specified. The whole between the second peak 141 and the lower surface 23 may satisfy the definition of the carbon chemical concentration, and the whole of the semiconductor substrate 10 may satisfy the definition of the carbon chemical concentration.

The contributing carbon concentration $N_C$ refers to the concentration of carbon that contributes to the formation of VOH defects. It has been experimentally confirmed that the concentration of VOH defects may also change if the carbon chemical concentration $C_C$ changes. In the present specification, the ratio between the contributing carbon concentration $N_C$ and the carbon chemical concentration $C_C$ is defined as a carbon contribution ratio η. That is, $\eta = N_C/C_C$. The carbon contribution ratio η ranges from 0 to 1. The unit of the carbon contribution ratio η is a dimensionless amount.

The distribution of the contributing carbon concentration $N_C$ may be similar to the distribution of the carbon chemical concentration $C_C$. For example, the contributing carbon concentration $N_C$ may be uniform in the depth direction of the semiconductor substrate 10, and may monotonically increase or decrease. The contributing carbon concentration $N_C$ may have a distribution having a peak at a predetermined depth position.

Next, the range and the like of the carbon contribution ratio η in the semiconductor substrate 10 will be described. The VOH defect concentration $N_{VOH}$ in a case where the carbon contribution ratio η is taken into consideration is defined as Expression (2a).

$$N_{VOH} = N_V + \xi C_{OX} + \eta C_C \quad \text{Expression (2a)}$$

The VOH defect concentration $N_{VOH}$ in Expression (2a) is obtained by adding the product of the carbon chemical concentration $C_C$ and the carbon contribution ratio n to the VOH defect concentration $N_{VOH}$ described in Expression (2). That is, the hydrogen donor concentration increased by the presence of carbon is added to the VOH defect concentration $N_{VOH}$ in Expression (2). Incidentally, the hydrogen donor generated by the contribution of carbon is not limited to the VOH defect, but in Expression (2a), the hydrogen donor concentration increased by the presence of carbon is included in the VOH defect concentration $N_{VOH}$.

Figure 24:
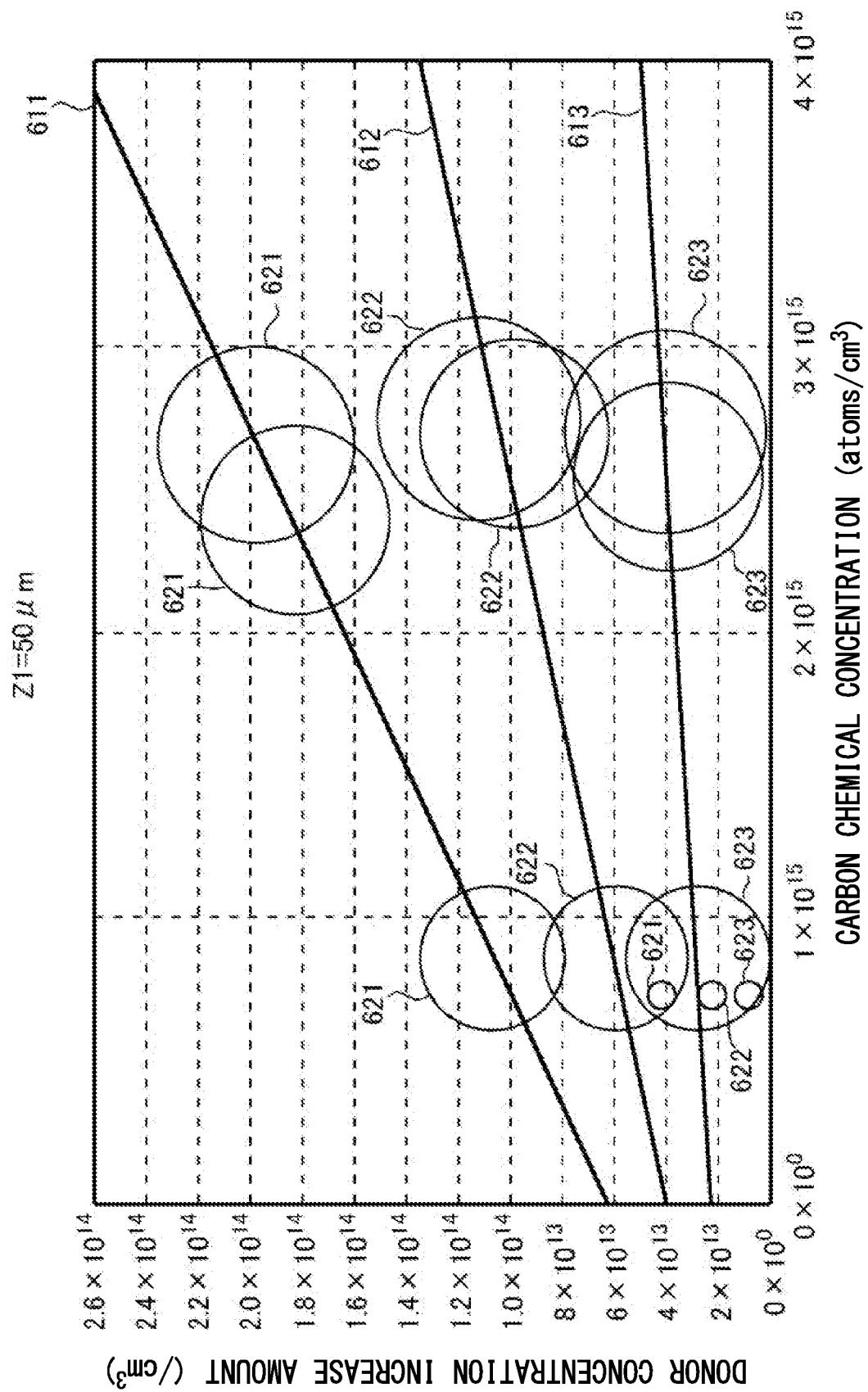
FIG. 24 is a diagram illustrating a relationship between the donor concentration increase amount and the carbon chemical concentration $C_C$.

FIG. 24 is a diagram illustrating a relationship between the donor concentration increase amount and the carbon chemical concentration $C_C$. The method for measuring the donor concentration increase amount in this example is similar to that in the example of FIG. 6. In addition, the carbon chemical concentration $C_C$ of the semiconductor substrate 10 of this example is uniformly distributed in the depth direction.

In FIG. 24, the depth position Z1 is 50 μm. In this example, the dose amount of hydrogen ions to the depth position Z1 is shown for three kinds of $3\times10^{12}$ ions/cm$^2$, $1\times10^{13}$ ions/cm$^2$, and $3\times10^{13}$ ions/cm$^2$. A sample having a dose amount of hydrogen ions of $3\times10^{13}$ ions/cm$^2$ is indicated by a plot 621, a sample having a dose amount of hydrogen ions of $1\times10^{13}$ ions/cm$^2$ is indicated by a plot 622, and a sample having a dose amount of hydrogen ions of $3\times10^{12}$ ions/cm$^2$ is indicated by a plot 623. The size of each plot indicates the size of the oxygen chemical concentration $C_{OX}$. As illustrated in FIG. 24, the donor concentration increase amount increases substantially (almost) linearly in proportion to the carbon chemical concentration $C_C$.

In the example of FIG. 24, an approximate expression in which the relationship between the carbon chemical concentration $C_C$ and the donor concentration increase amount is approximated by a straight line is calculated. In FIG. 24, an example in which the dose amount of hydrogen ions is $3\times10^{13}$ ions/cm$^2$ is approximated by a straight line 611, an example in which the dose amount of hydrogen ions is $1\times10^{13}$ ions/cm$^2$ is approximated by a straight line 612, and an example in which the dose amount of hydrogen ions is $3\times10^{12}$ ions/cm$^2$ is approximated by a straight line 613.

Each straight line is represented by Expression (8a).

$$N_{VOH}=a\times C_C+b \qquad \text{Expression (8a)}$$

At this time, the slope a and the intercept b of each straight line calculated by fitting of the least squares method are as follows.

Straight line 611: a=$5.00851\times10^{-2}$, b=$6.46656\times10^{13}$
Straight line 612: a=$2.35891\times10^{-2}$, b=$4.14509\times10^{13}$
Straight line 613: a=$7.13212\times10^{-3}$, b=$2.26076\times10^{13}$ As illustrated in FIG. 24, in the formation of VOH defects, there is not necessarily a strong correlation between the carbon chemical concentration $C_C$ and the oxygen chemical concentration $C_{OX}$. For example, when comparing the semiconductor substrate 10 having the same carbon chemical concentration $C_C$ on the same order as in a case where the carbon chemical concentration $C_C$ is $6\times10^{14}$ atoms/cm$^3$ and a case where the carbon chemical concentration $C_C$ is $8\times10^{14}$ atoms/cm$^3$, the oxygen chemical concentration $C_{OX}$ (the size of the plot) is $9\times10^{15}$ atoms/cm$^3$ and $2.4\times10^{17}$ atoms/cm$^3$, respectively, and there is a difference of 10 times or more. On the other hand, in semiconductor substrate 10 having a carbon chemical concentration $C_C$ of $2.5\times10^{15}$ atoms/cm$^3$, the carbon chemical concentration $C_C$ is about 3 times higher than that in the above example. However, the oxygen chemical concentration $C_{OX}$ of the semiconductor substrate 10 is $4\times10^{17}$ atoms/cm$^3$, and the difference in the oxygen chemical concentration $C_{OX}$ is not so large.

Figure 25:
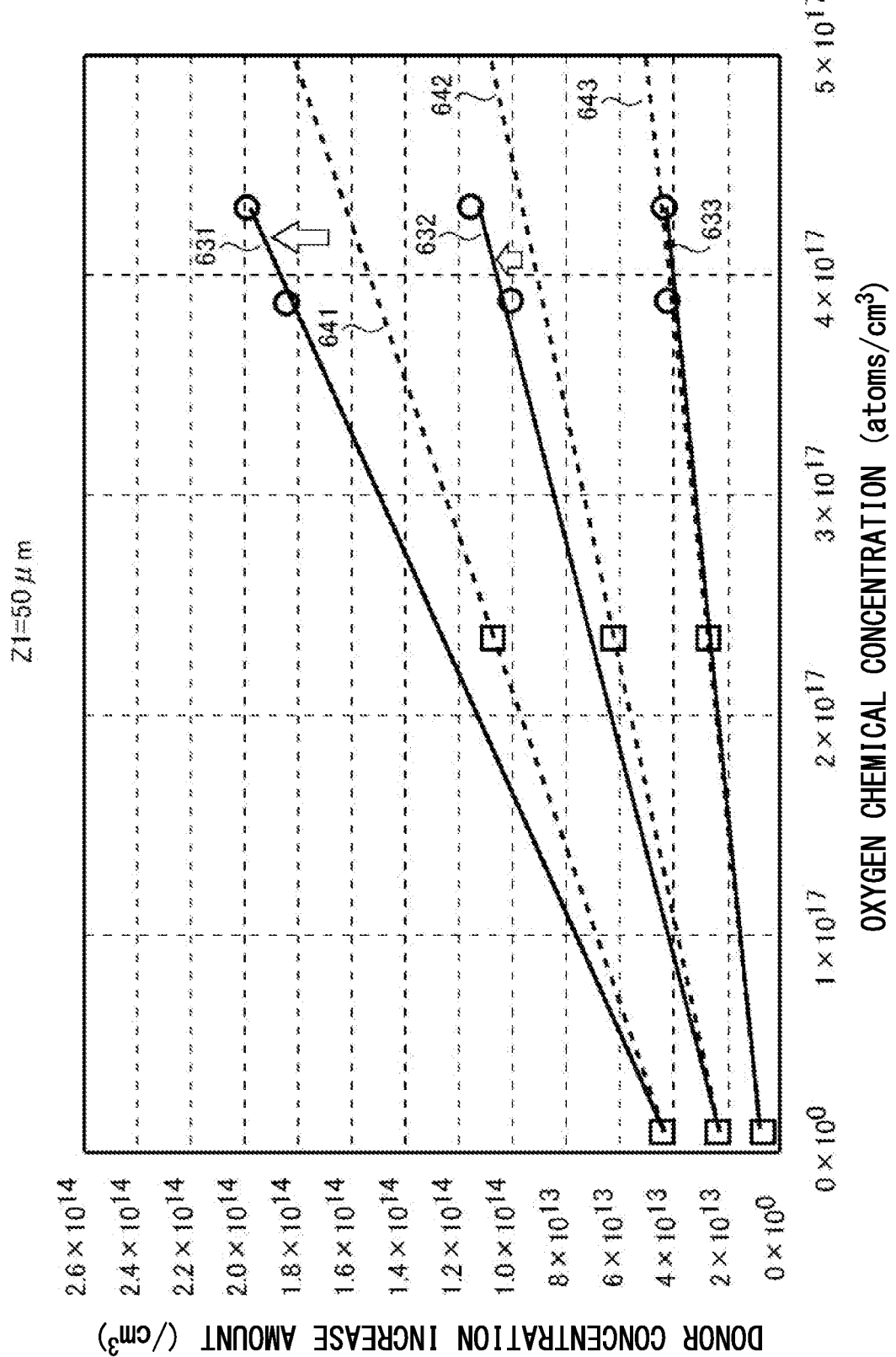
FIG. 25 is a diagram illustrating a relationship between the donor concentration increase amount and the oxygen chemical concentration $C_{OX}$.

FIG. 25 is a diagram illustrating a relationship between the donor concentration increase amount and the oxygen chemical concentration $C_{OX}$. In this example, each plot illustrated in FIG. 24 is divided into a group having a small carbon chemical concentration $C_C$ ($1\times10^{15}$ atoms/cm$^3$ or less) and a group having a large carbon chemical concentration $C_C$ ($2\times10^{15}$ atoms/cm$^3$ or more), and the relationship between the donor concentration increase amount and the oxygen chemical concentration $C_{OX}$ is approximated by a straight line.

In FIG. 25, in a plot in which the dose amount of hydrogen ions is $3\times10^{13}$ ions/cm$^2$, the group having a large carbon chemical concentration $C_C$ is indicated by a straight line 631, and the group having a small carbon chemical concentration $C_C$ is indicated by a straight line 641. In a plot in which the dose amount of hydrogen ions is $1\times10^{13}$ ions/cm$^2$, the group having a large carbon chemical concentration $C_C$ is indicated by a straight line 632, and the group having a small carbon chemical concentration $C_C$ is indicated by a straight line 642. In a plot in which the dose amount of hydrogen ions is $3\times10^{12}$ ions/cm$^2$, the group having a large carbon chemical concentration $C_C$ is indicated by a straight line 633, and the group having a small carbon chemical concentration $C_C$ is indicated by a straight line 643.

In a case where each straight line is represented by Expression (8), the slope a and the intercept b of each straight line are as follows.

Straight line 631: a=$3.64419\times10^{-4}$, b=$4.15739\times10^{13}$
Straight line 641: a=$2.80673\times10^{-4}$, b=$4.15739\times10^{13}$
Straight line 632: a=$2.04534\times10^{-4}$, b=$2.21483\times10^{13}$
Straight line 642: a=$1.67965\times10^{-4}$, b=$2.21483\times10^{13}$
Straight line 633: a=$8.60908\times10^{-5}$, b=$8.32518\times10^{13}$
Straight line 643: a=$8.05915\times10^{-5}$, b=$8.32518\times10^{13}$ In a case where the dose amount of hydrogen ions is equal, the vacancy concentration $N_V$ as the intercept is substantially (almost) the same value. As in the case of oxygen, it is natural to consider that the vacancy concentration $N_V$ converges to a constant value if the carbon chemical concentration approaches 0.

The slope of the straight line of the group having a large carbon chemical concentration $C_C$ is larger than the slope of the straight line of the group having a small carbon chemical concentration $C_C$. That is, as the carbon chemical concentration $C_C$ increases, the donor concentration increase amount increases. Further, as the dose amount of hydrogen ions increases, the donor concentration increase amount increases. That is, the ratio (the slope of the straight line) of the increase amount of the VOH defect concentration $N_{VOH}$ to the increase amount of the oxygen chemical concentration $C_{OX}$ is large.

The slope a of each straight line is the oxygen contribution ratio. It is assumed that the oxygen contribution ratio becomes a times as the carbon chemical concentration $C_C$ increases. Note that α≥1. The VOH defect concentration $N_{VOH}$ is represented by Expression (2b).

$$N_{VOH}=N_V+\alpha\xi C_{OX} \qquad \text{Expression (2b)}$$

Expression (15) is obtained by comparing Expression (2a) with Expression (2b).

$$\xi C_{OX}+\eta C_C=\alpha\xi C_{OX} \qquad \text{Expression (2b)}$$

$$\eta=(\alpha-1)(C_{OX}/C_C)\xi \qquad \text{Expression (15)}$$

As shown in Expression (15), the carbon contribution ratio η is represented by the product of the oxygen chemical concentration $C_{OX}/C_C$ per unit carbon chemical concentration and (α−1) that is an increment of ξ. That is, the carbon contribution ratio η depends on the oxygen chemical concentration $C_{OX}$ and the oxygen contribution ratio ξ.

As illustrated in FIG. 25, if the dose amount of hydrogen ions is the same and the carbon chemical concentration $C_C$ increases, the ratio (the slope ξ of the straight line) of the increase amount of the VOH defect concentration $N_{VOH}$ to the increase amount of the oxygen chemical concentration $C_{OX}$ increases α times, and the contributing carbon concentration $N_C=\eta C_C$ increases. That is, the contributing carbon concentration $N_C$ is increased not only by the increase in the carbon chemical concentration $C_C$ but also by the action of the oxygen chemical concentration $C_{OX}$, and the VOH defect concentration $N_{VOH}$ is increased by the increased contributing carbon concentration $N_C$. This suggests that the donor increased by the contribution of carbon may be a donor separate from the VOH defect. In the present specification, the donor increased by the contribution of carbon may be referred to as a VOH-C defect.

Figure 26:
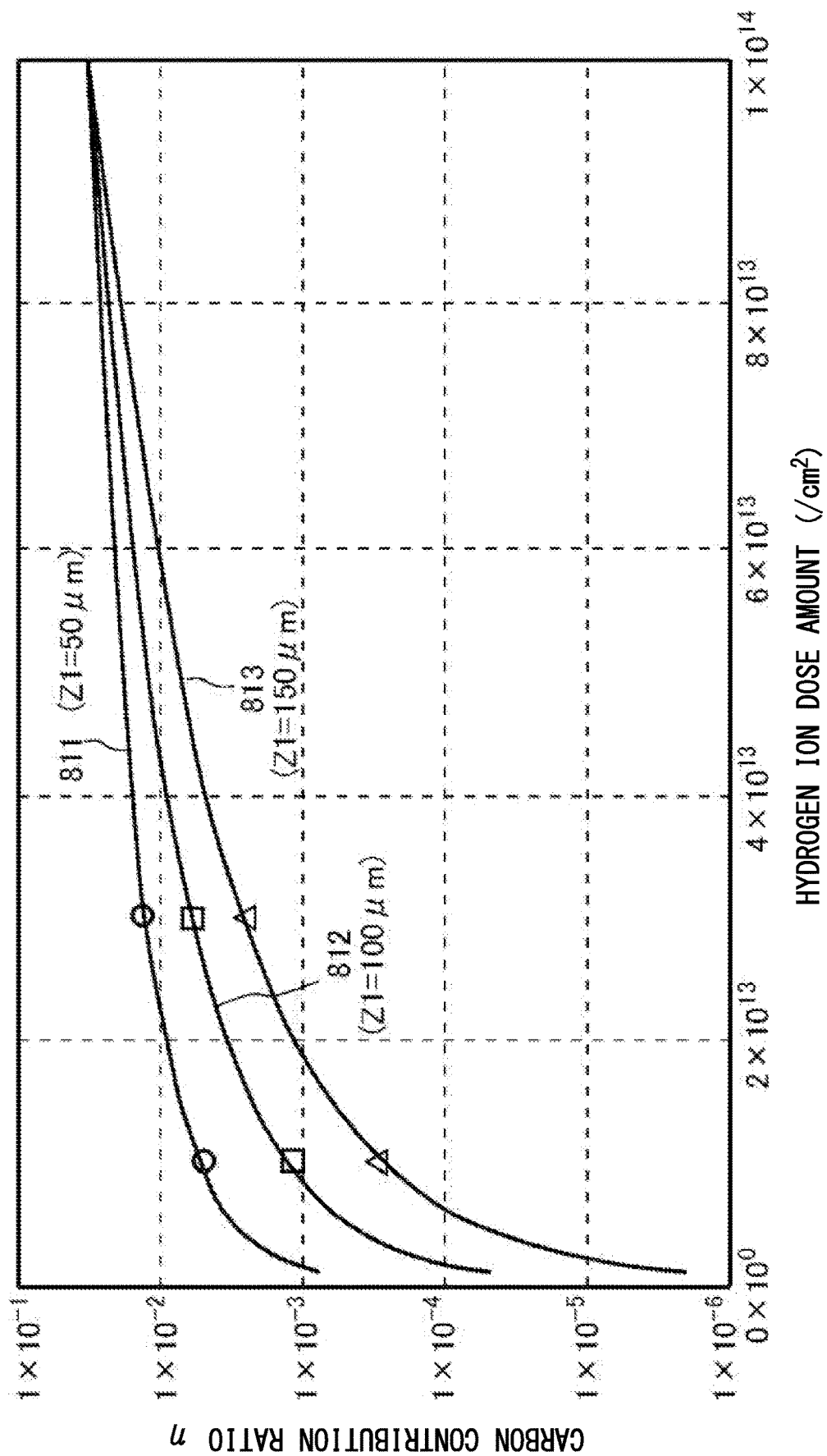
FIG. 26 is a diagram illustrating a relationship between the hydrogen ion dose amount to the depth position Z1 and a carbon contribution ratio $\eta$.

FIG. 26 is a diagram illustrating a relationship between the hydrogen ion dose amount to the depth position Z1 and the carbon contribution ratio η. In FIG. 26, three kinds of characteristics of the semiconductor substrate 10 in which the depth position Z1 is 50 μm, 100 μm, and 150 μm are illustrated. In this example, similar to the oxygen contribution ratio in FIG. 8, the carbon contribution ratio η is approximated by a power function with respect to the hydrogen ion dose amount $D_H$ to the depth position Z1.

In FIG. 26, the relationship between the hydrogen ion dose amount and the carbon contribution ratio η in the case of Z1=50 μm is approximated by a curve 811, the relationship between the hydrogen ion dose amount and the carbon contribution ratio η in the case of Z1=100 μm is approximated by a curve 812, and the relationship between the hydrogen ion dose amount and the carbon contribution ratio η in the case of Z1=150 μm is approximated by a curve 813. Each curve 801 is expressed by Expression (15). At this time, coefficients g and h of each curve are as follows.

$$\eta = g \times (D_H)^h \qquad \text{Expression (15)}$$

Curve 811: g=2.57839×10$^{-13}$, h=7.95528×10$^{-1}$
Curve 812: g=1.35314×10$^{-21}$, h=1.38598
Curve 813: g=3.49381×10$^{-31}$, h=2.07102

Figure 27:
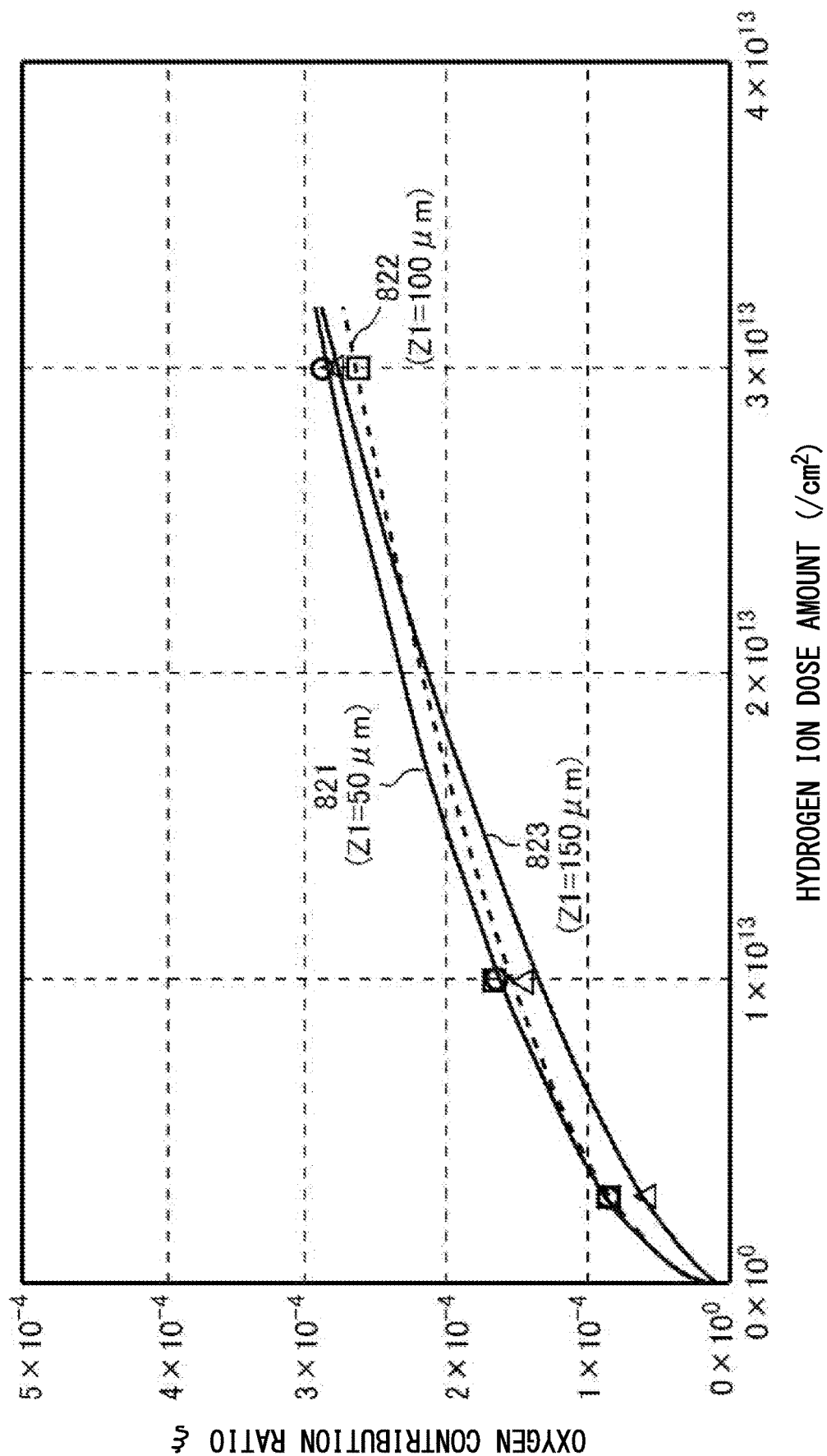
FIG. 27 is a diagram illustrating a relationship between the oxygen contribution ratio $\xi$ and a hydrogen ion dose amount $D_H$ in a group having a small carbon chemical concentration $C_C$.

FIG. 27 is a diagram illustrating a relationship between the oxygen contribution ratio ξ and the hydrogen ion dose amount $D_H$ in the group having a small carbon chemical concentration $C_C$. The group having a small carbon chemical concentration $C_C$ is a group having a carbon chemical concentration $C_C$ of 1×10$^{15}$ atoms/cm$^3$ or less as described in FIG. 25. Since the oxygen contribution ratio ξ is a value in a case where there is no influence of the carbon chemical concentration, the value of the group having a small carbon chemical concentration $C_C$ is used. In FIG. 27, three kinds of characteristics of the semiconductor substrate 10 with the depth positions Z1 of 50 μm, 100 μm, and 150 μm are indicated by a curve 821, a curve 822, and a curve 823, respectively. Each curve is a curve obtained by approximating each plot with a power function, similar to the example of FIG. 8.

Figure 28:
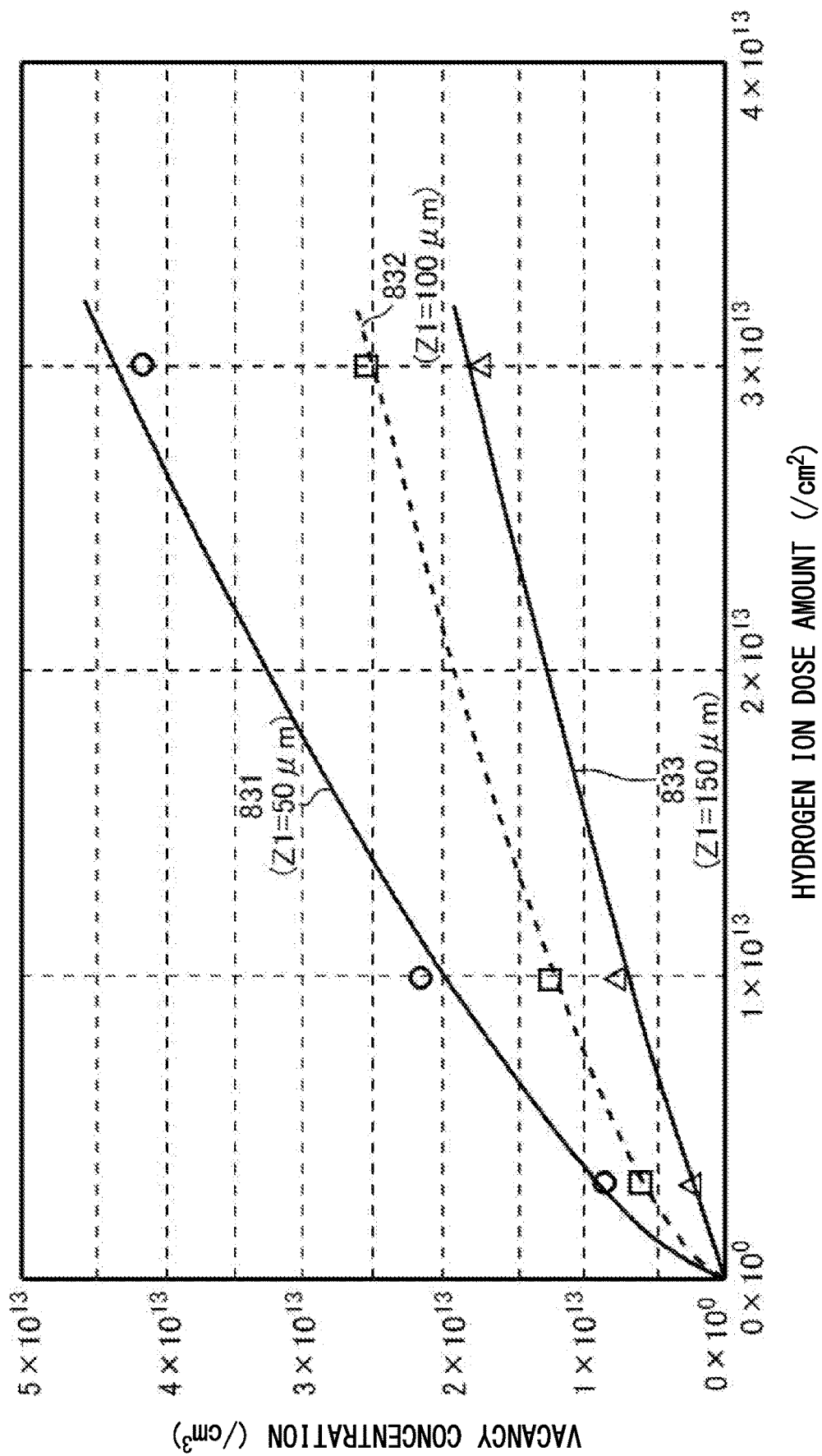
FIG. 28 is a diagram illustrating a relationship between the vacancy concentration $N_V$ and the hydrogen ion dose amount $D_H$ in a group having a small carbon chemical concentration $C_C$.

FIG. 28 is a diagram illustrating a relationship between the vacancy concentration $N_V$ and the hydrogen ion dose amount $O_H$ in the group having a small carbon chemical concentration $C_C$. Since the vacancy concentration $N_V$ is also a value in a case where there is no influence of the carbon chemical concentration, a value of the group having a small carbon chemical concentration $C_C$ is used. In FIG. 28, three kinds of characteristics of the semiconductor substrate 10 with the depth positions Z1 of 50 μm, 100 μm, and 150 μm are indicated by a curve 831, a curve 832, and a curve 833, respectively. Each curve is a curve obtained by approximating each plot with a power function, similar to the example of FIG. 8.

Each curve described in FIG. 26 to FIG. 28 is expressed by a power function. Therefore, Expression (2a) becomes Expression (13a).

$$N_{VOH} = c \times (D_H)^d + e \times (D_H)^f \times C_{OX} + g \times (D_H)^h \times C_C \qquad \text{Expression (13a)}$$

In addition, Expressions (1) to (13a) are represented by Expression (14a).

$$N_F - N_{B0} = c \times (D_H)^d + e \times (D_H)^f \times C_{OX} + g \times (D_H)^h \times C_C \qquad \text{Expression (14a)}$$

The final doping concentration $N_F$ is a set value and the bulk donor concentration $N_{B0}$ is known from the measured value or the specification value of the semiconductor wafer. The oxygen chemical concentration $C_{OX}$ and the carbon chemical concentration $C_C$ are obtained by measuring each concentration in the semiconductor substrate 10 by a SIMS method or the like. The parameters c, d, e, f, g, and h can be obtained experimentally in advance. Therefore, the variables of Expression (14a) are only the implantation amount of the charged particles (the dose amount $O_H$ of hydrogen ions in this example), and the right side of Expression (14a) is a constant that does not change with respect to the implantation amount.

By numerically solving Expression (14a), the dose amount of charged particles to be implanted into the semiconductor substrate 10 can be calculated with respect to the set value of the final doping concentration $N_F$. The implantation amount $D_H$ of the charged particles obtained from Expression (14a) may have a width (error) reflecting the variation in the value of each data in each fitting described in FIG. 26 to FIG. 28. That is, if the implantation amount $D_H$ of the charged particles is, for example, in a range of ±50% with respect to the value obtained from Expression (13a) or Expression (14a), it may be considered as a value obtained from Expression (13a) or Expression (14a).

Figure 29:
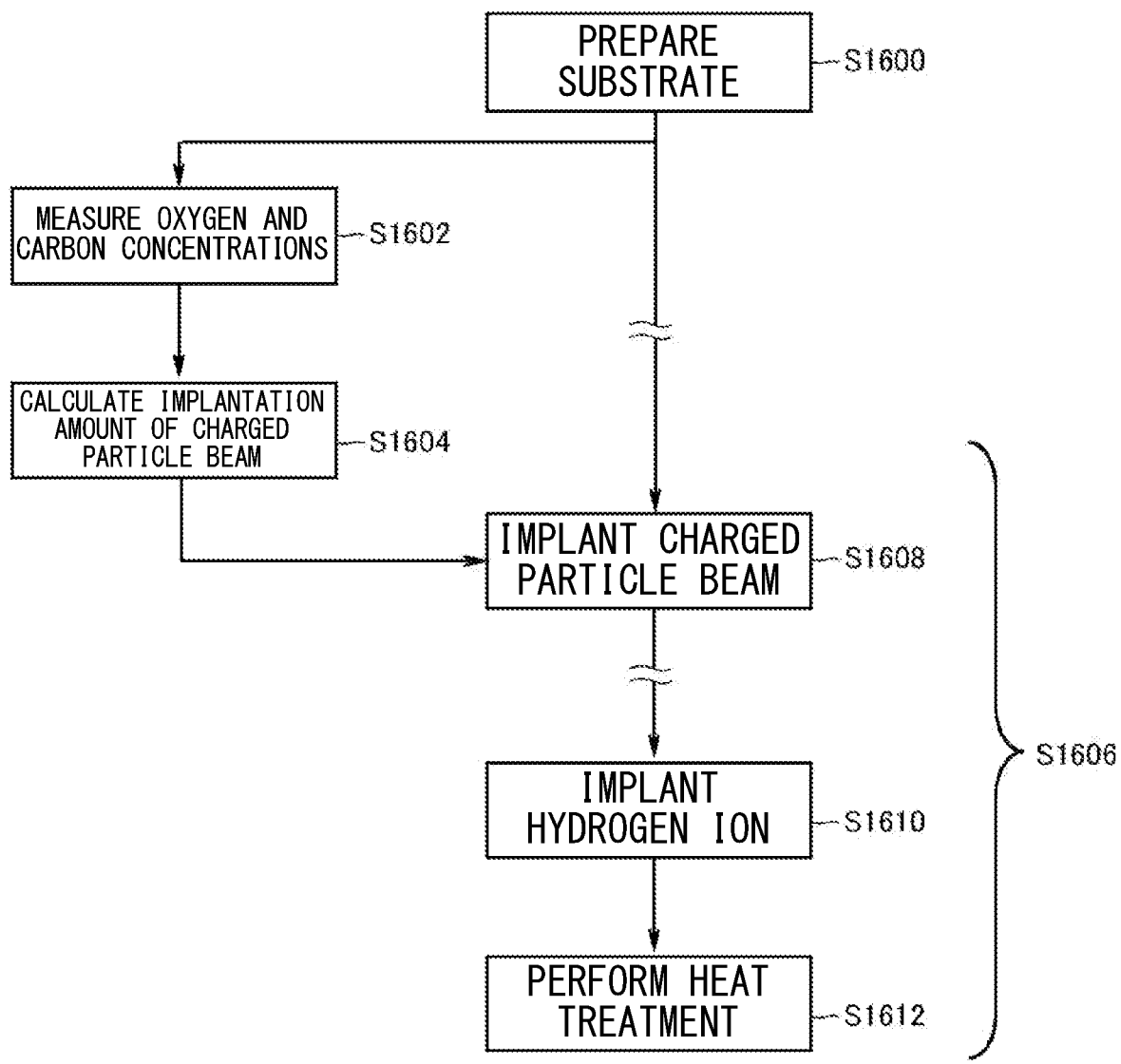
FIG. 29 is a diagram illustrating an example of a manufacturing method of the semiconductor apparatus 100.

FIG. 29 is a diagram illustrating an example of a manufacturing method of the semiconductor apparatus 100. The manufacturing method of this example is different from the example described in FIG. 18 in the processes in the concentration measuring step S1602 and the implantation amount calculating step S1604. The processed other than the concentration measuring step S1602 and the implantation amount calculating step S1604 are similar to those in the example of FIG. 18.

The concentration measuring step S1602 of this example is different from the concentration measuring step S1602 in FIG. 18 in further measuring the carbon chemical concentration $C_C$ of the semiconductor substrate 10 in addition to the oxygen chemical concentration $C_{OX}$. The other points are similar to the example described in connection with FIG. 18. In the concentration measuring step S1602, each concentration may be measured by an FTIR method (infrared absorption spectroscopy).

In the implantation amount calculating step S1604, the implantation amount of the charged particle beam to be implanted into the depth position Z1 is calculated on the basis of the oxygen chemical concentration and the carbon chemical concentration measured in S1602. As described above, the concentration of VOH defects to be formed can be controlled by the implantation amount of the charged particle beam. In the implantation amount calculating step S1604, the implantation amount may be calculated on the basis of Expression (13a) or Expression (14a). In S1604, the implantation amount of the charged particle beam may be calculated such that the substrate resistance value of the flat portion 150 described in FIG. 4 and the like becomes the set value of the final doping concentration $N_F$.

By such a method, even if the bulk donor concentration of the semiconductor substrate 10 varies, the resistance value of the flat portion 150 can be adjusted to a target value. At a predetermined depth position of the semiconductor substrate 10, the concentration of hydrogen donors to be generated is $N_{VOH1}$, and the concentration of the actually generated hydrogen donors is $N_{VOH2}$. The depth position may be included in the flat portion 150. The depth position may be the center in the depth direction of the semiconductor substrate 10.

The concentration of hydrogen donors to be generated $N_{VOH1}$ is represented by Expression (2a) to Expression (16). $N_{VOH1}$ represented by Expression (16) is an example of a third value.

$$N_{VOH1} = N_V + \xi C_{OX} + \eta C_C \qquad \text{Expression (16)}$$

As described above, the vacancy concentration $N_V$, the oxygen chemical concentration $C_{OX}$, the carbon chemical concentration $C_C$, the oxygen contribution ratio $\xi$, and the carbon contribution ratio $\eta$ can be acquired by measuring the semiconductor substrate 10. In addition, the actually generated hydrogen donor concentration $N_{VOH2}$ can be acquired from a difference between the donor concentration $N_{B0}$ of the semiconductor substrate 10 before the treatment by the above-described manufacturing method and the doping concentration $N_F$ of the semiconductor substrate 10 after the treatment. The difference in the donor concentration may be measured at the flat portion 150. The donor concentration $N_{B0}$ of the semiconductor substrate 10 is obtained by measurement of the SIMS or SR. According to the SIMS, the donor concentration $N_{B0}$ of the semiconductor substrate 10 can also be obtained from the semiconductor substrate 10 after the treatment.

Figure 30:
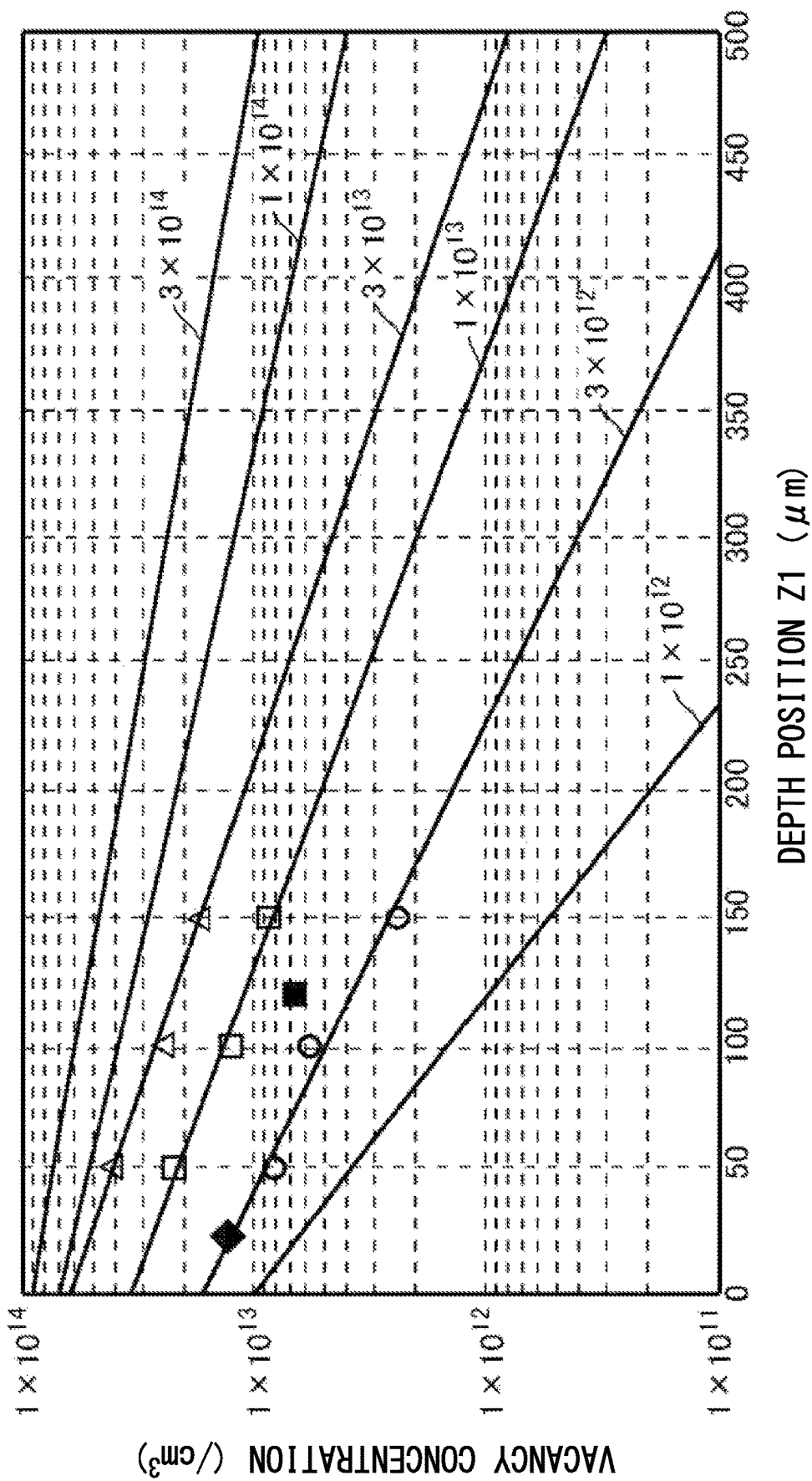
FIG. 30 is a diagram illustrating another example of the relationship between the vacancy concentration $N_V$ and the depth position Z1.

FIG. 30 is a diagram illustrating another example of the relationship between the vacancy concentration $N_V$ and the depth position Z1. FIG. 30 illustrates the relationship between the oxygen contribution ratio $\xi$ and the depth position Z1 for each of the cases where the hydrogen ion dose amount is $3 \times 10^{14}$ ions/cm², $1 \times 10^{14}$ ions/cm², $3 \times 10^{13}$ ions/cm², $1 \times 10^{13}$ ions/cm², $3 \times 10^{12}$ ions/cm², or $1 \times 10^{12}$ ions/cm². The relationship in this example is substantially (almost) the same as the relationship illustrated in FIG. 22. As an example, a case where the depth position Z1 is 120 μm and the dose amount $D_H$ is $5 \times 10^{12}$ ions/cm² is indicated by a black square in FIG. 30. In this case, the vacancy concentration $N_V$ is approximately $N_V = 6 \times 10^{12}$ ions/cm³. The value is defined as $N_V 2$. As another example, a case where the depth position Z1 is 23 μm and the dose amount $D_H$ is $3 \times 10^{12}$ ions/cm² is indicated by a black diamond in FIG. 30. In this case, the vacancy concentration $N_V$ is approximately $N_V = 1.3 \times 10^{13}$ ions/cm³. The value is defined as $N_V 2$.

Figure 31:
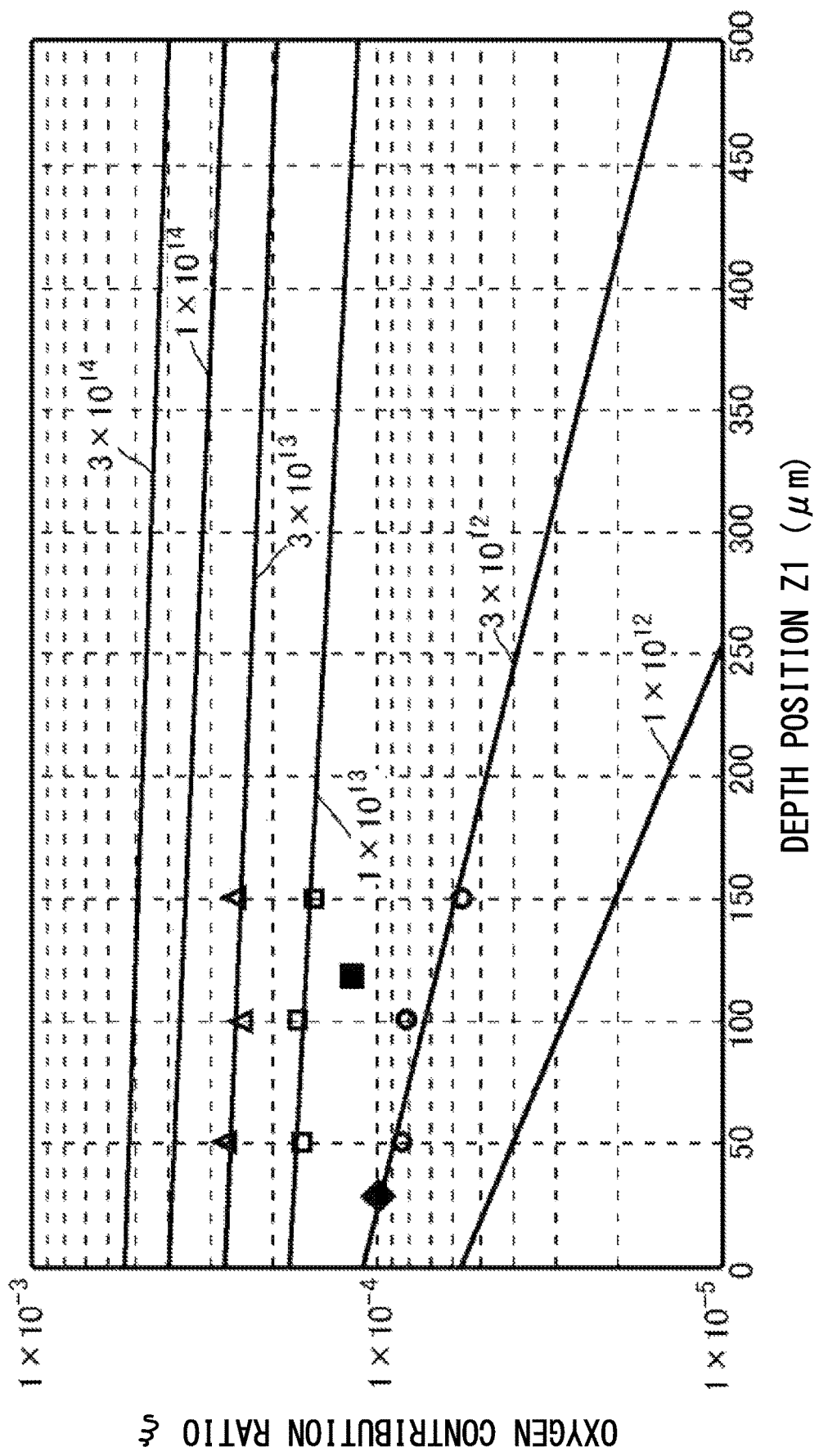
FIG. 31 is a diagram illustrating another example of the relationship between the oxygen contribution ratio $\xi$ and the depth position Z1.

FIG. 31 is a diagram illustrating another example of the relationship between the oxygen contribution ratio $\xi$ and the depth position Z1. FIG. 31 illustrates the relationship between the oxygen contribution ratio $\xi$ and the depth position Z1 for each of the cases where the hydrogen ion dose amount is $3 \times 10^{14}$ ions/cm², $1 \times 10^{14}$ ions/cm², $3 \times 10^{13}$ ions/cm², $1 \times 10^{13}$ ions/cm², $3 \times 10^{12}$ ions/cm², or $1 \times 10^{12}$ ions/cm². In this example, the dependency of the oxygen contribution ratio with respect to the depth position Z1 in the example in which the hydrogen ion dose amount is high is smaller than that in the example illustrated in FIG. 21. That is, the slope of the straight line illustrated in FIG. 31 is small. As an example, a case where the depth position Z1 is 120 μm and the dose amount $D_H$ is $5 \times 10^{12}$ ions/cm² is indicated by a black square in FIG. 31. In this case, the oxygen contribution ratio $\xi$ is approximately $=1.1 \times 10^{-4}$. The value is defined as $\xi 2$. As another example, a case where the depth position Z1 is 23 μm and the dose amount $D_H$ is $3 \times 10^{12}$ ions/cm² is indicated by a black diamond in FIG. 31. In this case, the oxygen contribution ratio $\xi$ is approximately $\xi = 1.0 \times 10^{-4}$. The value is defined as 3.

Figure 32:
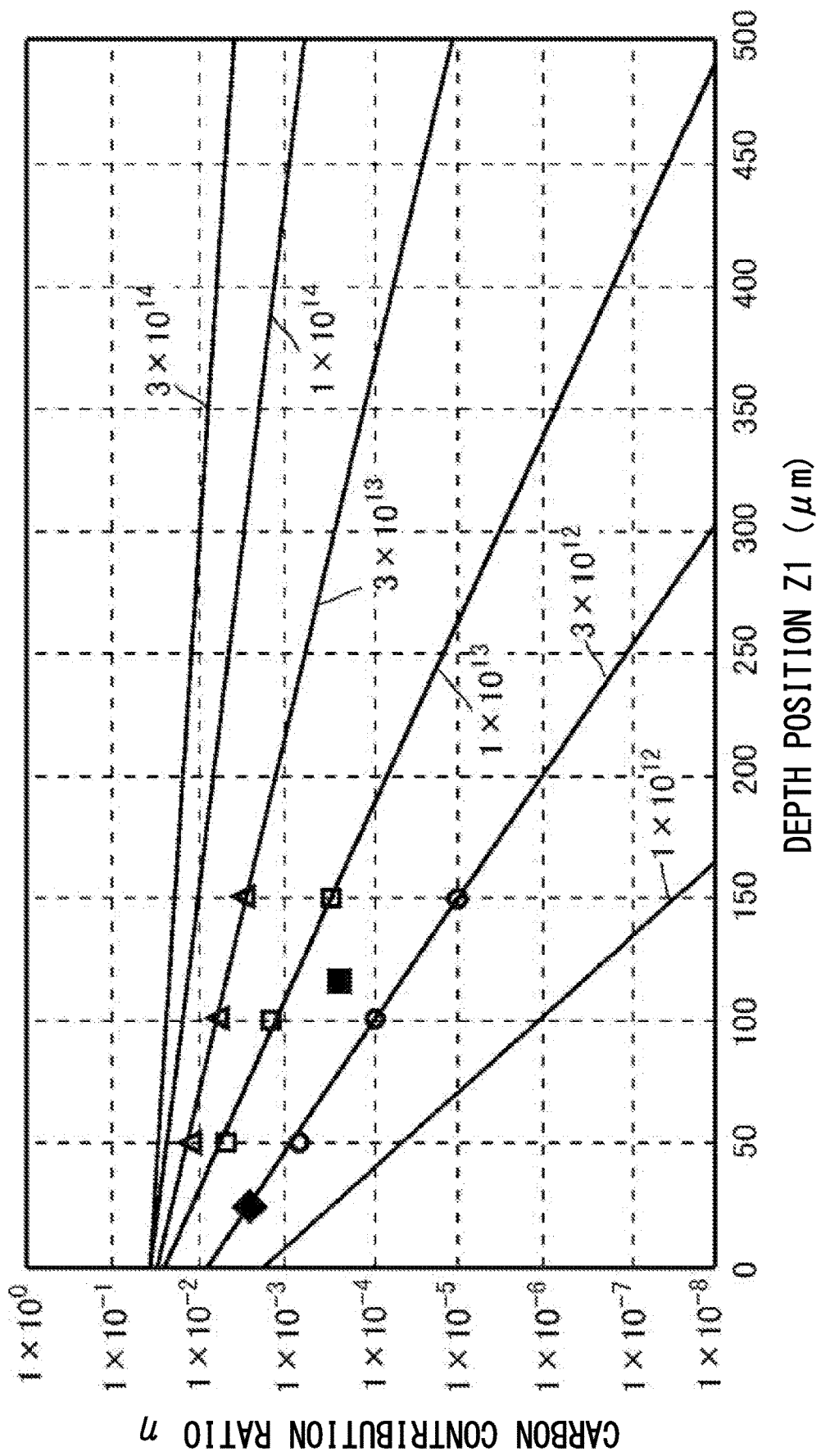
FIG. 32 is a diagram illustrating a relationship between the carbon contribution ratio $\eta$ and the depth position Z1.

FIG. 32 is a diagram illustrating a relationship between the carbon contribution ratio $\eta$ and the depth position Z1. Similar to the oxygen contribution ratio $\xi$, the carbon contribution ratio $\eta$ decreases exponentially as the depth position Z1 increases. The dependency of the carbon contribution ratio $\eta$ on the depth position Z1 is strong. In addition, if the hydrogen ion dose amount is high, the carbon contribution ratio $\eta$ increases. As an example, a case where the depth position Z1 is 120 μm and the dose amount $D_H$ is $5 \times 10^{12}$ ions/cm² is indicated by a black square in FIG. 32. In this case, the carbon contribution ratio $\eta$ is approximately $\eta = 2.1 \times 10^{-4}$. The value is defined as $\eta 2$. As another example, a case where the depth position Z1 is 23 μm and the dose amount $D_H$ is $3 \times 10^{12}$ ions/cm² is indicated by a black diamond in FIG. 32. In this case, the carbon contribution ratio $\eta$ is approximately $\eta = 3.0 \times 10^{-3}$. The value is defined as $\eta 3$.

As illustrated in FIG. 30 and FIG. 32, the dependency of the carbon contribution ratio $\eta$ on the depth position Z1 is as strong as the dependency of the vacancy concentration $N_V$ on the depth position Z1. Therefore, it is found that carbon has a large interaction with vacancies. As described in relation to Expression (15), FIG. 25, and the like, it is presumed that the donor is formed of at least vacancies (V), oxygen (O), hydrogen (H), and carbon (C) on the basis of the suggestion that the slope of the VOH defect concentration $N_{VOH}$-oxygen chemical concentration $C_{OX}$ characteristic increases due to a donor different from the VOH defect. As described above, the donor is referred to as a VOH-C defect. The VOH-C defects are an example of hydrogen donors.

As illustrated in FIG. 32, the carbon contribution ratio $\eta$ is large in a case where the depth position Z1 is shallow and the dose amount of the charged particles (hydrogen ions) is high. Therefore, in a case where the depth position Z1 is shallower than a predetermined value (for example, 100 μm), the charged particle dose amount may be set on the basis of the carbon chemical concentration $C_C$ as described in FIG. 29. The predetermined value may be 70 μm or 50 μm. In a case where the depth position Z1 is shallower than a predetermined value set in advance and the carbon chemical concentration $C_C$ is a predetermined value (for example, $1 \times 10^{13}$ atoms/cm³) or more, the dose amount of charged particles may be set on the basis of the carbon chemical concentration $C_C$. The predetermined value may be $5 \times 10^{13}$ atoms/cm³ or $1 \times 10^{14}$ atoms/cm³.

Example 1

An example in which the depth position Z1 is 120 μm and the hydrogen ion dose amount $D_H$ is $5 \times 10^{12}$ ions/cm² is considered. In addition, the oxygen chemical concentration $C_{OX}$ is $4.0 \times 10^{17}$ atoms/cm³, the carbon chemical concentration $C_C$ is $2.0 \times 10^{15}$ atoms/cm³, the final doping concentration $N_F$ is $7 \times 10^{13}$/cm³, and the bulk donor concentration $N_{B0}$ is $2 \times 10^{12}$/cm³.

As described above, the vacancy concentration $N_V$ is about $6 \times 10^{12}$/cm³, the oxygen contribution ratio $\xi$ is about $1.1 \times 10^{-4}$, and the carbon contribution ratio is about $2.1 \times 10^{-4}$ from the relationship between the black square and the black diamond in each of FIG. 30, FIG. 31, and FIG. 32 and the relationship illustrated in each drawing. The relationships illustrated in FIG. 30, FIG. 31, and FIG. 32 may be experimentally acquired in advance by measuring the plurality of semiconductor substrates 10.

From Expression (16), $N_{VOH1}$ can be calculated as in the following expression.

$$N_{VOH1}=6.0\times10^{12}+1.1\times10^{-4}\times4.0\times10^{17}2.1\times10^{-4}\times2.0\times10^{15}=5.04\times10^{13}/cm^3$$

In addition, $N_{VOH2}$ can be calculated as in the following expression.

$$N_{VOH2}=N_F-N_{B0}=7\times10^{13}-2\times10^{12}=6.8\times10^{13}/cm^3$$

Therefore, $N_{VOH1}/N_{VOH2}$ can be calculated as in the following expression.

$$N_{VOH1}/N_{VOH2}=5.04\times10^{13}/6.8\times10^{13}=0.74$$

Since falling within a range of $0.1 \leq N_{VOH1}/N_{VOH2} \leq 10$ described above, it can be determined that $N_{VOH1}$ and $N_{VOH2}$ sufficiently match in Example 1.

Example 2

An example in which the depth position Z1 is 23 μm and the hydrogen ion dose amount $D_H$ is $3\times10^{12}$ ions/cm$^2$ is considered. In addition, the oxygen chemical concentration $C_{OX}$ is $1.5\times10^{17}$ atoms/cm$^3$, the carbon chemical concentration $C_C$ is $5.1\times10^{14}$ atoms/cm$^3$, the final doping concentration $N_F$ is $1.4\times10^{14}$/cm$^3$, and the bulk donor concentration $N_{B0}$ is $7.4\times10^{13}$/cm$^3$.

From the relationships illustrated in FIG. 30, FIG. 31, and FIG. 32, the vacancy concentration $N_V$ is about $1.3\times10^{13}$/cm$^3$, the oxygen contribution ratio ξ is about $1.0\times10^{-4}$, and the carbon contribution ratio is about $3.0\times10^{-3}$. From Expression (16), $N_{VOH1}$ is $3.0\times10^{13}$/cm$^3$. $N_{VOH2}$ is $6.6\times10^{13}$/cm$^3$.

Therefore, $N_{VOH1}/N_{VOH2}$ can be calculated as in the following expression.

$$N_{VOH1}/N_{VOH2}=3.0\times10^{13}/6.6\times10^{13}=0.45$$

Since falling within a range of $0.1 \leq N_{VOH1}/N_{VOH2} \leq 10$ described above, it can be determined that $N_{VOH1}$ and $N_{VOH2}$ sufficiently match in Example 2.

In a case where $N_{VOH1}/N_{VOH2}$ falls within the range, it may be determined that the dose amount of the charged particles has been set on the basis of the measurement results of the oxygen chemical concentration $C_{OX}$ and the carbon chemical concentration $C_C$ as in the manufacturing method described in FIG. 29. Further, $N_{VOH1}/N_{VOH2}$ may be 0.2 or more, 0.3 or more, or 0.5 or more. $N_{VOH1}/N_{VOH2}$ may be 5 or less, 3 or less, or 2 or less.

The charged particle dose amount in consideration of the carbon contribution ratio η can be similarly calculated also in a case where the charged particles are not hydrogen ions. For example, in a case where the charged particles are helium ions, the parameters c to h of Expression (13b) are acquired in advance with respect to the depth position Z1 into which helium ions are implanted. $D_{He}$ is the helium ion dose amount (ions/cm$^2$) with respect to the depth position Z1.

$$N_{VOH}=c\times(D_{He})^d+e\times(D_{He})^f\times C_{OX}+g\times(D_{He})^h\times C_C \quad \text{Expression (13b)}$$

The parameter may be acquired for a plurality of types of depth positions Z1.

In addition, the oxygen chemical concentration $C_{OX}$ and the carbon chemical concentration $C_C$ of the semiconductor substrate 10 are measured and acquired before the start of the manufacturing process. Then, the helium ion dose amount $O_{He}$ corresponding to the set value of $N_{VOH}$ to be generated is calculated from Expression (13b).

Figure 33A:
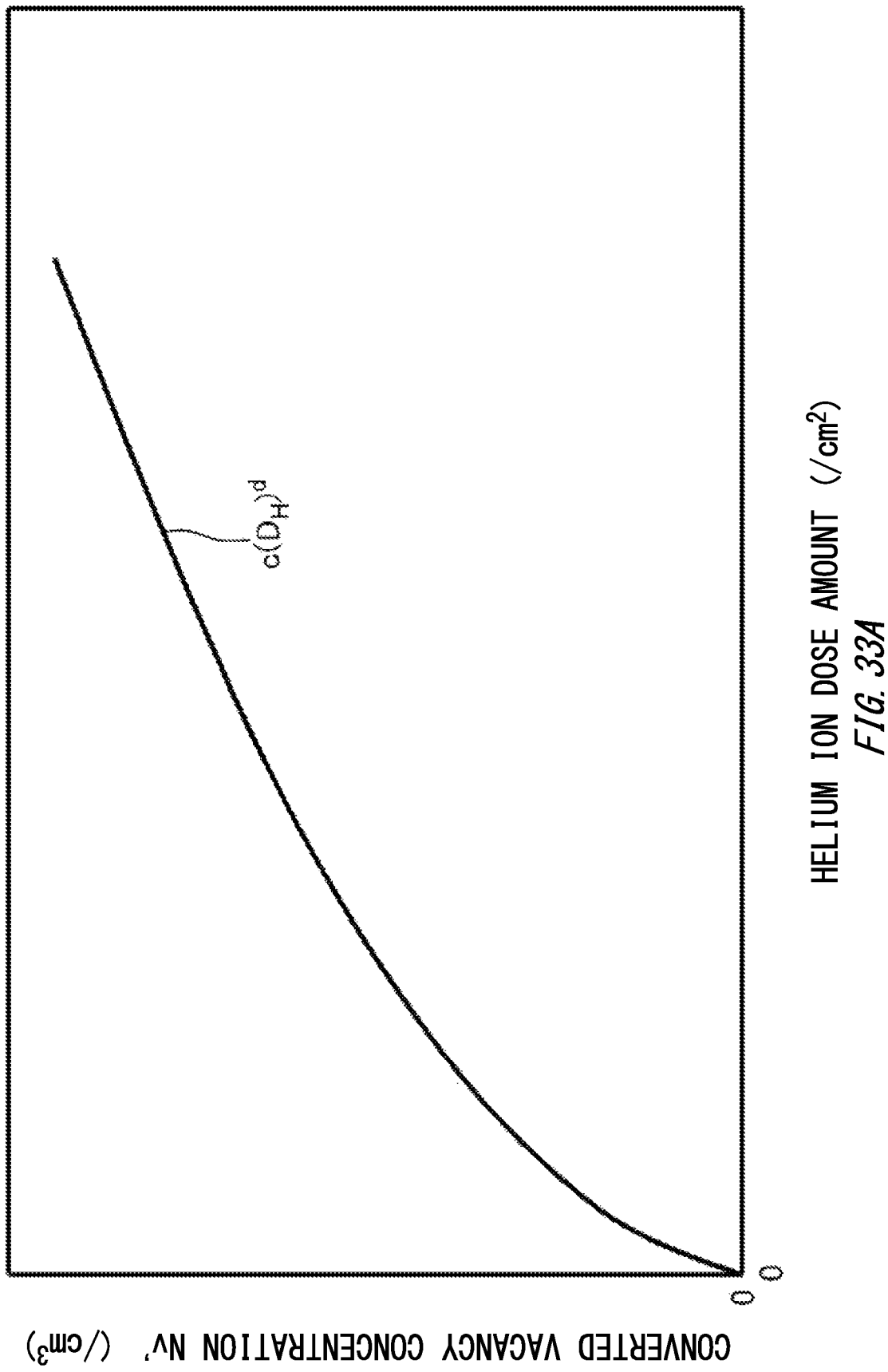
FIG. 33A is a graph illustrating a helium ion dose amount dependency of the vacancy concentration with respect to electrical target characteristics.
Figure 33B:
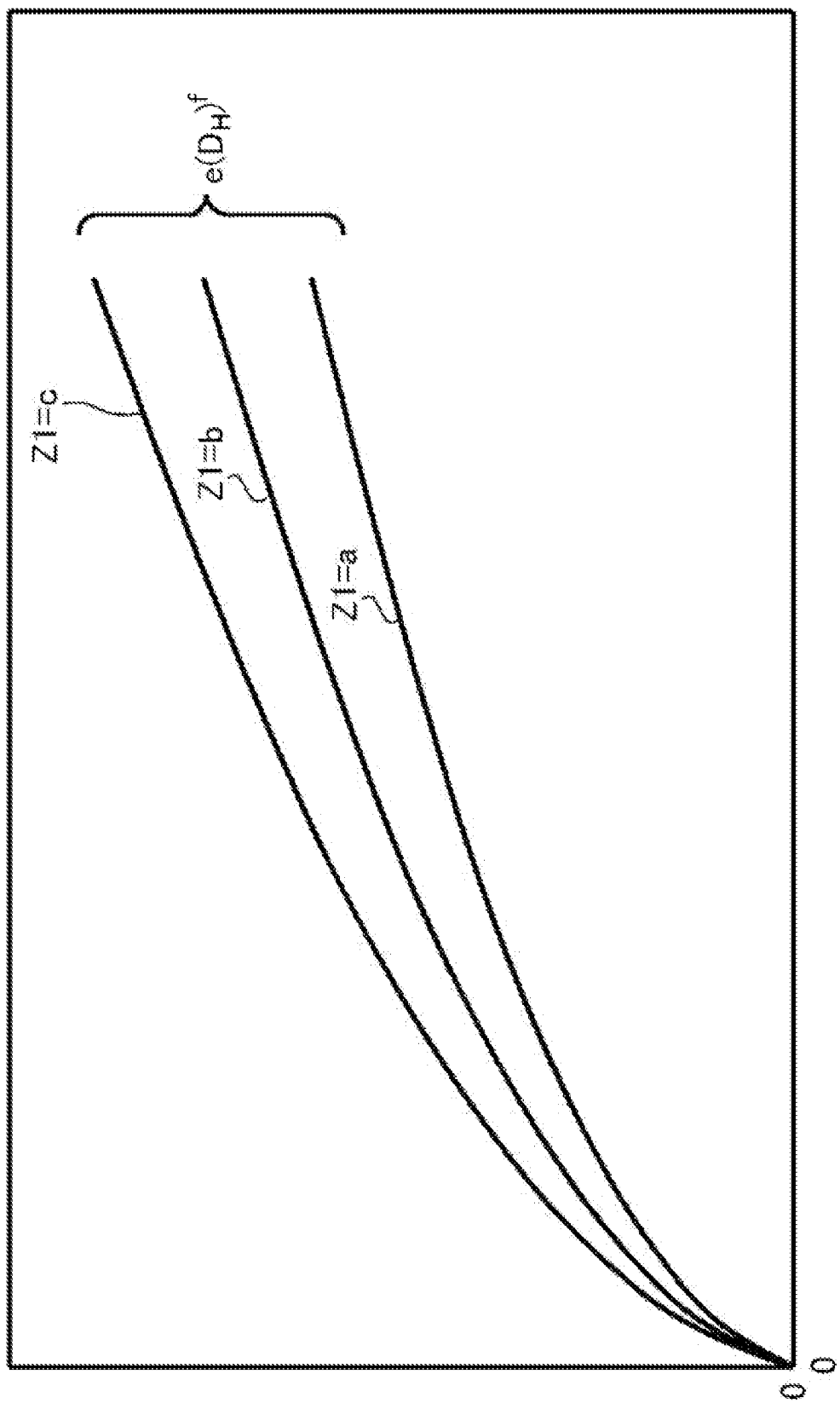
FIG. 33B is a graph illustrating a helium ion dose amount dependency of the oxygen contribution ratio to the electrical target characteristics.
Figure 33C:
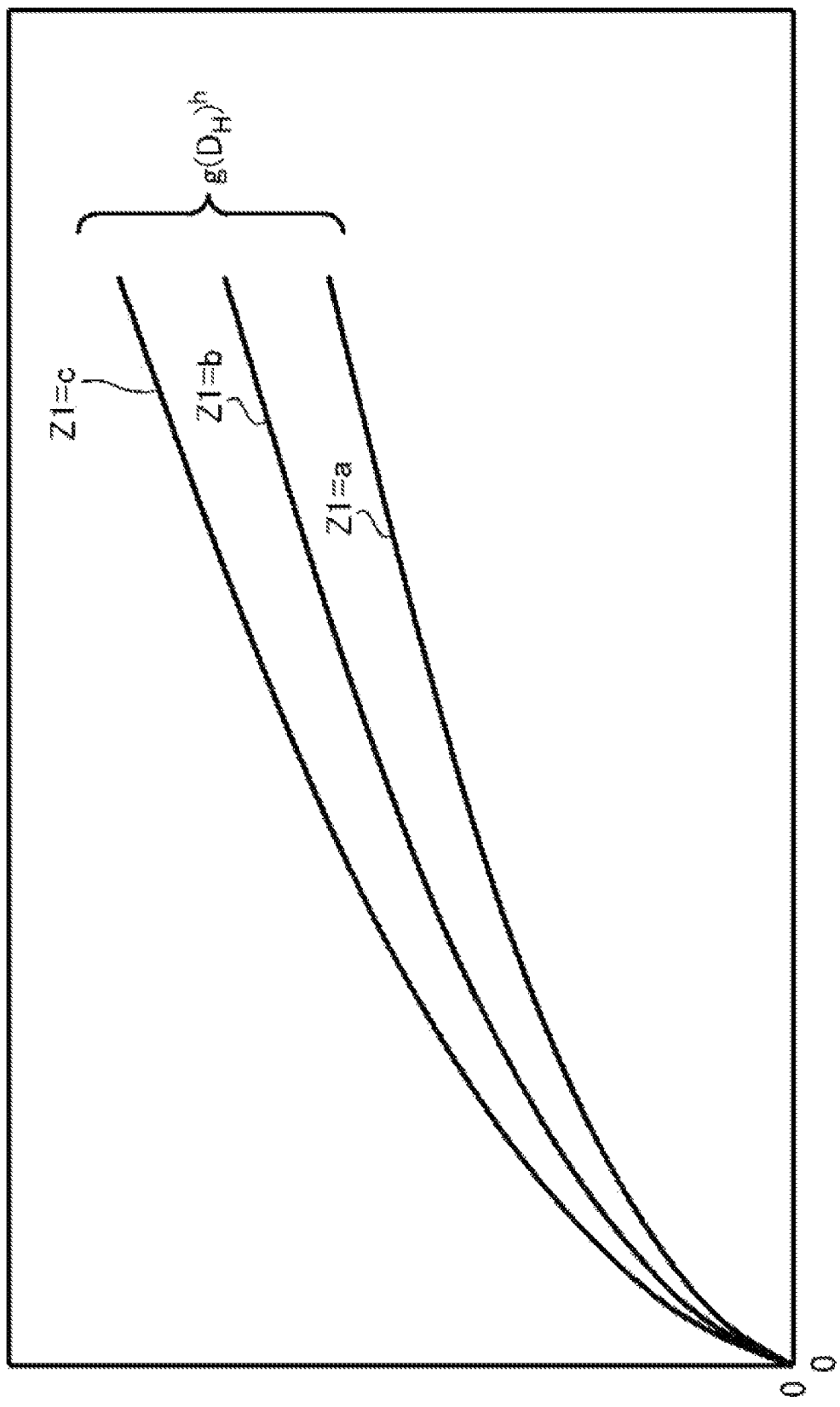
FIG. 33C is a graph illustrating a helium ion dose amount dependency of the carbon contribution ratio to the electrical target characteristics.

FIG. 33A, FIG. 33B, and FIG. 33C are graphs illustrating the helium ion dose amount dependency of the vacancy concentration, the oxygen contribution ratio, and the carbon contribution ratio with respect to the electrical target characteristics. FIG. 33B and FIG. 33C illustrate three examples in which the depth position Z1 at which helium ions are implanted is Z1=a, Z1=b, and Z1=c. Expressions (13), (13a), and (13b) can also be applied to target characteristics other than $N_{VOH}$ to be generated. The target characteristics are, for example, a breakdown voltage ($V_B$) of the semiconductor apparatus 100, an on voltage ($V_{CE}$) of the IGBT, a switching time ($t_{off}$), a forward voltage drop ($V_F$) of the diode, a reverse recovery time ($t_{rr}$), and the like.

In order to obtain the target characteristics, the semiconductor apparatus may be manufactured by a flow similar to that in FIG. 29. That is, the concentrations of oxygen and carbon are measured in advance in S1602, and the implantation amount (dose amount) of helium ions is calculated in S1604. Helium ions are implanted at the implantation amount in S1608. The hydrogen ion implantation in S1610 may or may not be performed. In these cases, assuming that the electrical target characteristic is F, for example, Expression (13b) can be transformed as the following expression.

$$F = Nv' + \xi' C_{OX} + \eta' C_C = \quad \text{Expression (15)}$$
$$c\times(D_{He})^d + e\times(D_{He})^f\times C_{OX} + g\times(D_{He})^h\times C_C$$

The first term on the right side is Nv' obtained by multiplying the vacancy concentration Nv formed by helium ion implantation and heat treatment by a coefficient to be converted into the electrical characteristic F. The coefficient portion of $C_{OX}$ of the second term is the oxygen contribution ratio ξ' to the target characteristic F, and is an amount obtained by multiplying the above-described oxygen contribution ratio ξ by a coefficient to be converted into the electrical characteristic F. The coefficient portion of $C_C$ in the third term is the carbon contribution ratio η' to the target characteristic F, and is an amount obtained by multiplying the above-described carbon contribution ratio η by a coefficient to be converted into the electrical characteristic F. Expression (15) is obtained in advance by creating at least one graph of FIG. 33A, FIG. 33B, and FIG. 33C for 2 to 3 or more types of depths of helium ions. That is, the parameters c, d, e, f, g, and h can be experimentally acquired in advance. Therefore, the variable of Expression (15) is only the implantation amount of helium ions, and the right side of Expression (15) is a constant that does not change with respect to the implantation amount.

The dose amount of helium ions to be implanted into the semiconductor substrate 10 can be calculated by numerically solving Expression (15). The implantation amount $D_{He}$ of helium ions obtained from Expression (15) may have a width (error) reflecting a variation in the value of each data in each fitting described below. That is, if the implantation amount $D_{He}$ of helium ions falls, for example, within a range of ±50% with respect to the value obtained from Expression (15), it may be considered as the value obtained from Expression (15).

The electrical target characteristic F can be deformed as in the following expression with respect to each characteristic of the above-described example.

$$V_B=c\times(D_{He})^d+e\times(D_{He})^f\times C_{OX}+g\times(D_{He})^h\times C_C$$

$$V_{CE}=c\times(D_{He})^d+e\times(D_{He})^f\times C_{OX}+g\times(D_{He})^h\times C_C$$

$$t_{off}=c\times(D_{He})^d+e\times(D_{He})^f\times C_{OX}+g\times(D_{He})^h\times C_C$$

$$V_F=c\times(D_{He})^d+e\times(D_{He})^f\times C_{OX}+g\times(D_{He})^h\times C_C$$

$$t_{rr}=c\times(D_{He})^d+e\times(D_{He})^f\times C_{OX}+g\times(D_{He})^h\times C_C$$

In these expressions, the parameters c to h have different values according to the target characteristics. The units of the parameters c to h may be units that can be matched with the unit of the target characteristic, the unit of the dose amount of helium ions, the unit of the oxygen chemical concentration, and the unit of the carbon chemical concentration.

Figure 34A:
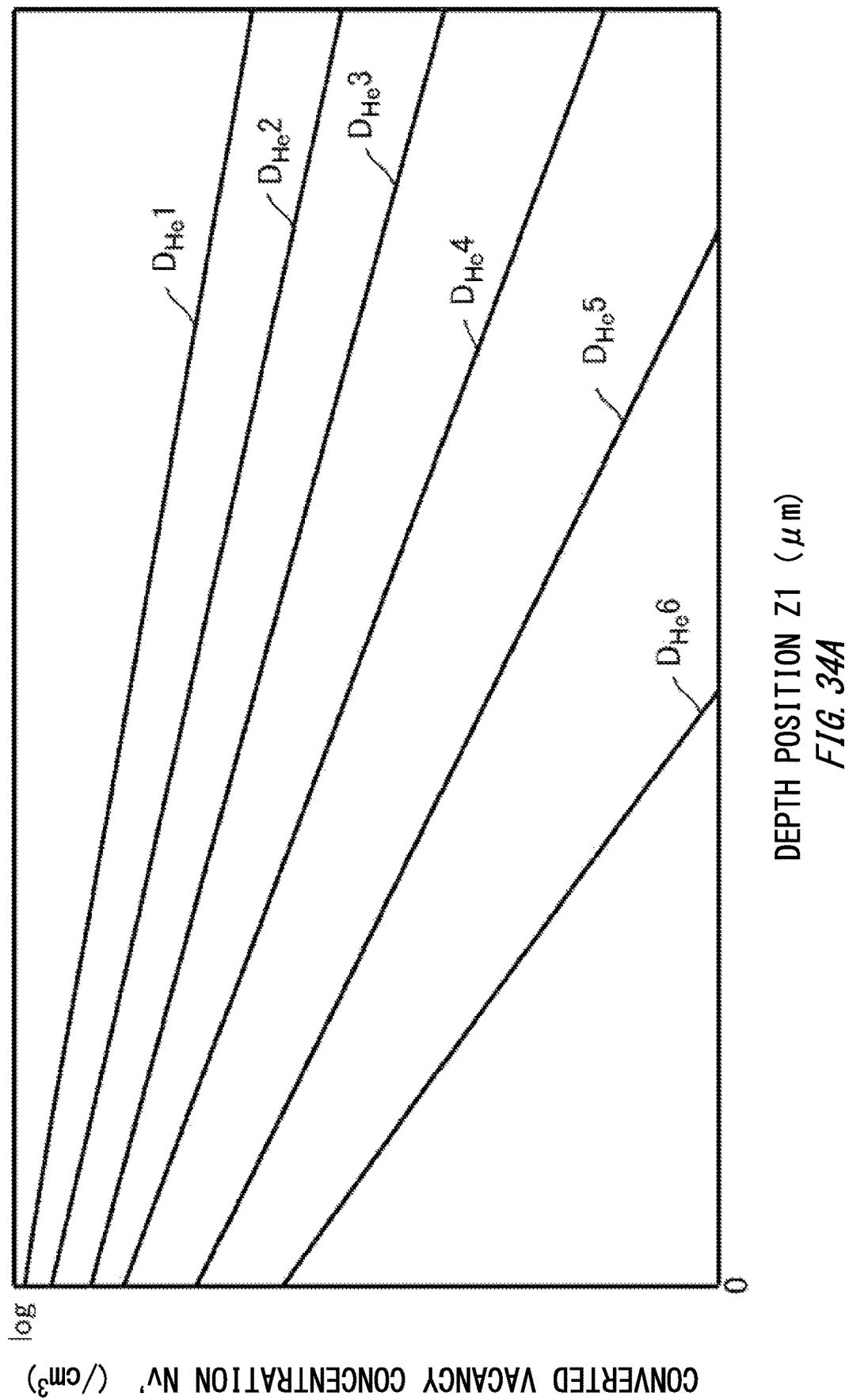
FIG. 34A is a graph illustrating a helium ion depth dependency of a converted vacancy concentration $N_{V'}$ in the electrical target characteristics.
Figure 34B:
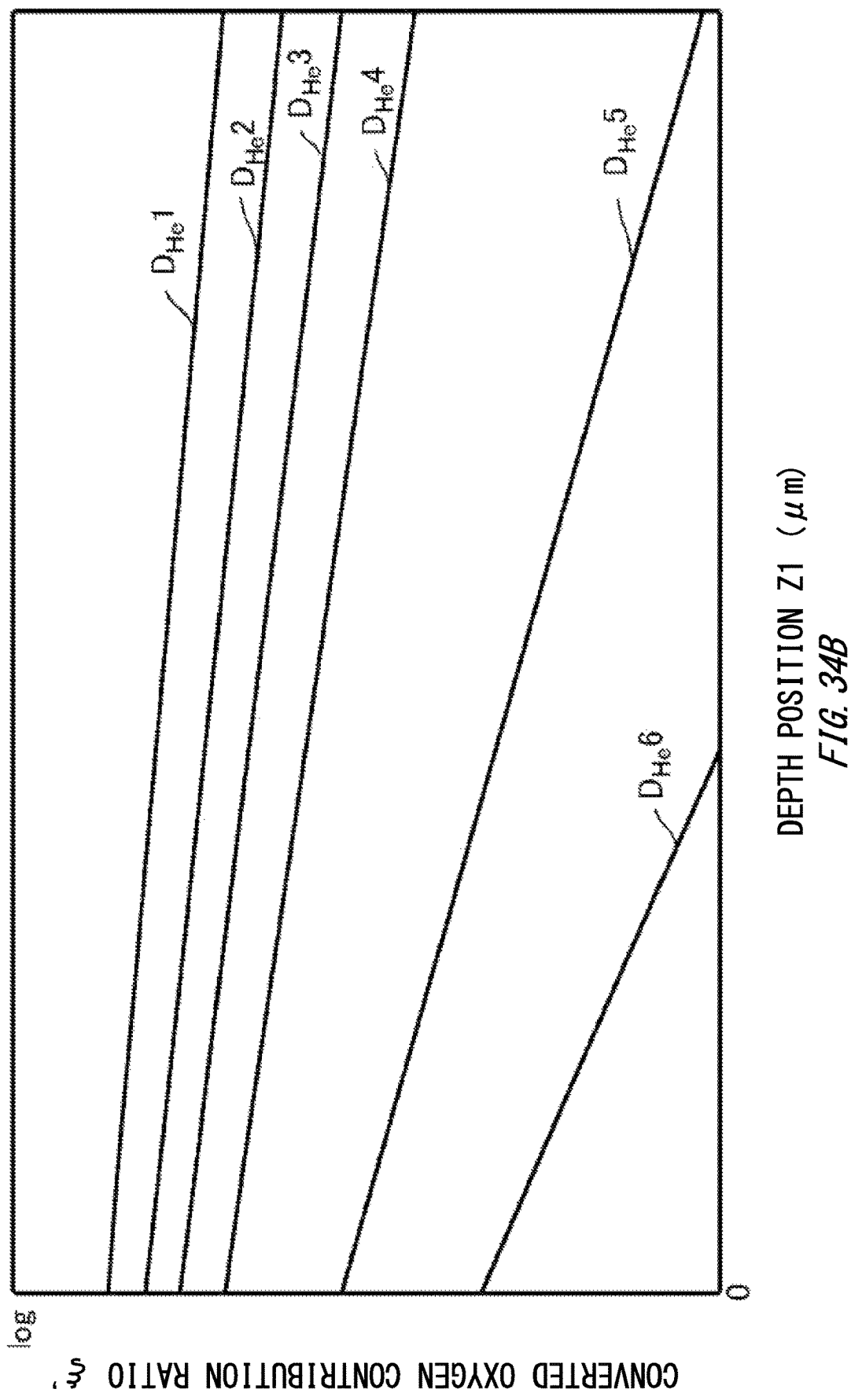
FIG. 34B is a graph illustrating a helium ion depth dependency of a converted oxygen contribution ratio $\xi'$ in the electrical target characteristics.

FIG. 34A, FIG. 34B, and FIG. 340 are graphs illustrating the helium ion depth dependency of each of the converted vacancy concentration Nv', the converted oxygen contribution ratio $\xi'$, and the converted carbon contribution ratio $\eta'$ in the electrical target characteristic. In each drawing, six examples in which the helium ion dose amounts to the depth position Z1 is $D_{He}1$, $D_{He}2$, $D_{He}3$, $D_{He}4$, $D_{He}5$, and $D_{He}6$ are illustrated. The converted vacancy concentration Nv', the converted oxygen contribution ratio $\xi'$, and the converted carbon contribution ratio $\eta'$ with respect to the helium ion depth can also be calculated in advance by the experimentally acquired parameters c, d, e, f, g, and h in advance. Using this graph, it can be seen whether the semiconductor apparatus has been manufactured on the basis of the flow of FIG. 29.

Figure 34C:
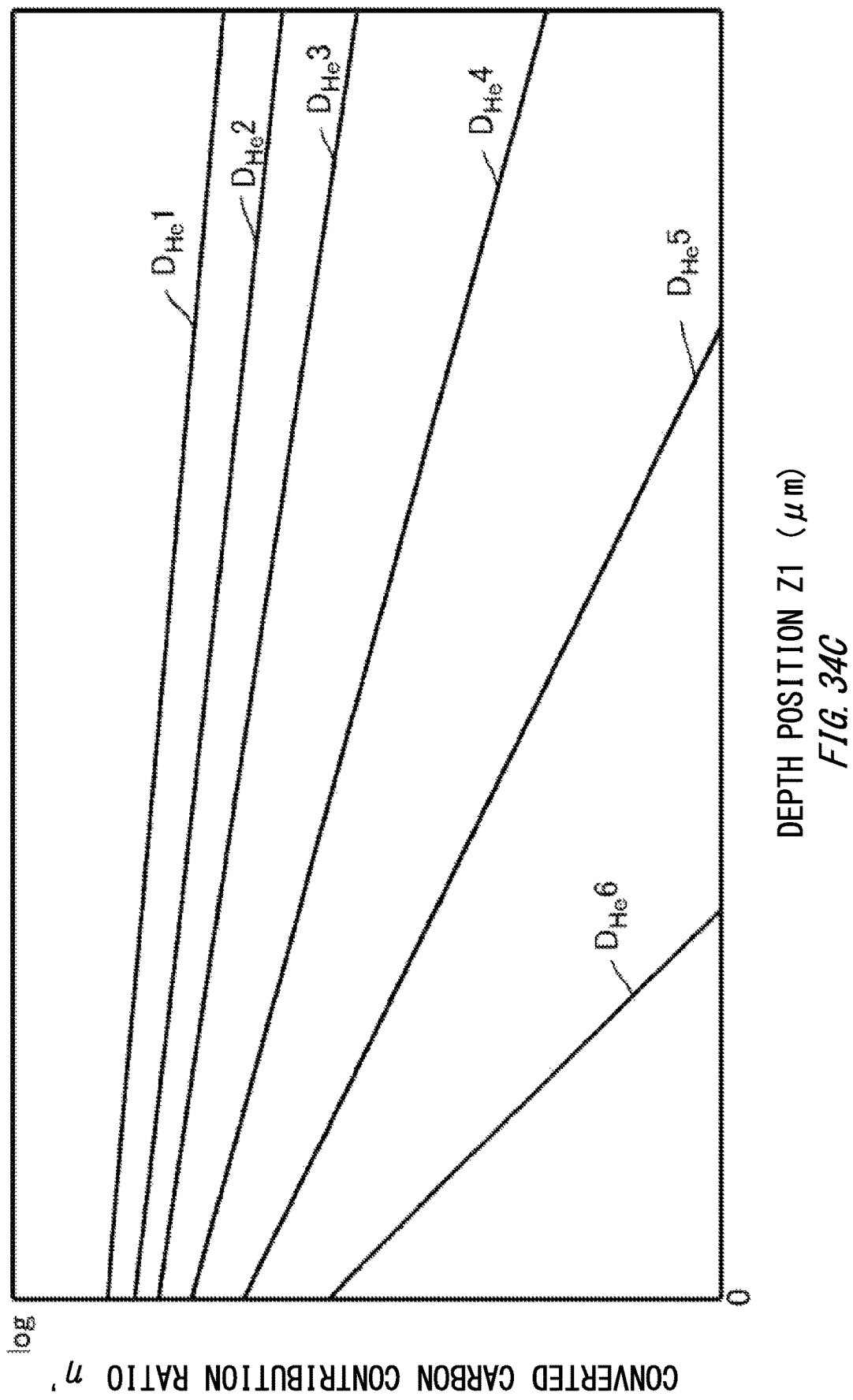
FIG. 34C is a graph illustrating a helium ion depth dependency of a converted carbon contribution ratio $\eta'$ in the electrical target characteristics.

The implantation depth Z1 of helium ions is a depth from an implantation surface of a peak value of an atomic density distribution (chemical concentration distribution) of helium atoms in the semiconductor substrate 10 measured by, for example, the SIMS. As the implantation surface, the main surface on which the chemical concentration distribution of helium atoms draws the tail deep from the peak position may be used as the implantation surface. The dose amount of helium ions may be an integral value obtained by integrating the measured chemical concentration distribution of helium atoms in the depth direction from the implantation surface. By interpolating the depth and the dose amount of helium ions calculated as described above in the graphs of FIG. 34A, FIG. 34B, and FIG. 34C, the converted vacancy concentration Nv', the converted oxygen contribution ratio $\xi'$, and the converted carbon contribution ratio $\eta'$ can be found. The chemical concentrations of oxygen and carbon can be determined by the SIMS. By substituting these values into Expression (15), the electrical characteristic value F1 is obtained.

On the other hand, an actual electrical characteristic F2 can be obtained by electrical measurement of the semiconductor apparatus 100. As a result, if the ratio between the calculated value F1 and the measured value F2 ranges from 0.1 to 10, it can be said that the semiconductor apparatus has been manufactured on the basis of the flow of FIG. 29. The first value or the third value described above is an example of the calculated value F1, and the second value is an example of the measured value F2.

Figure 35:
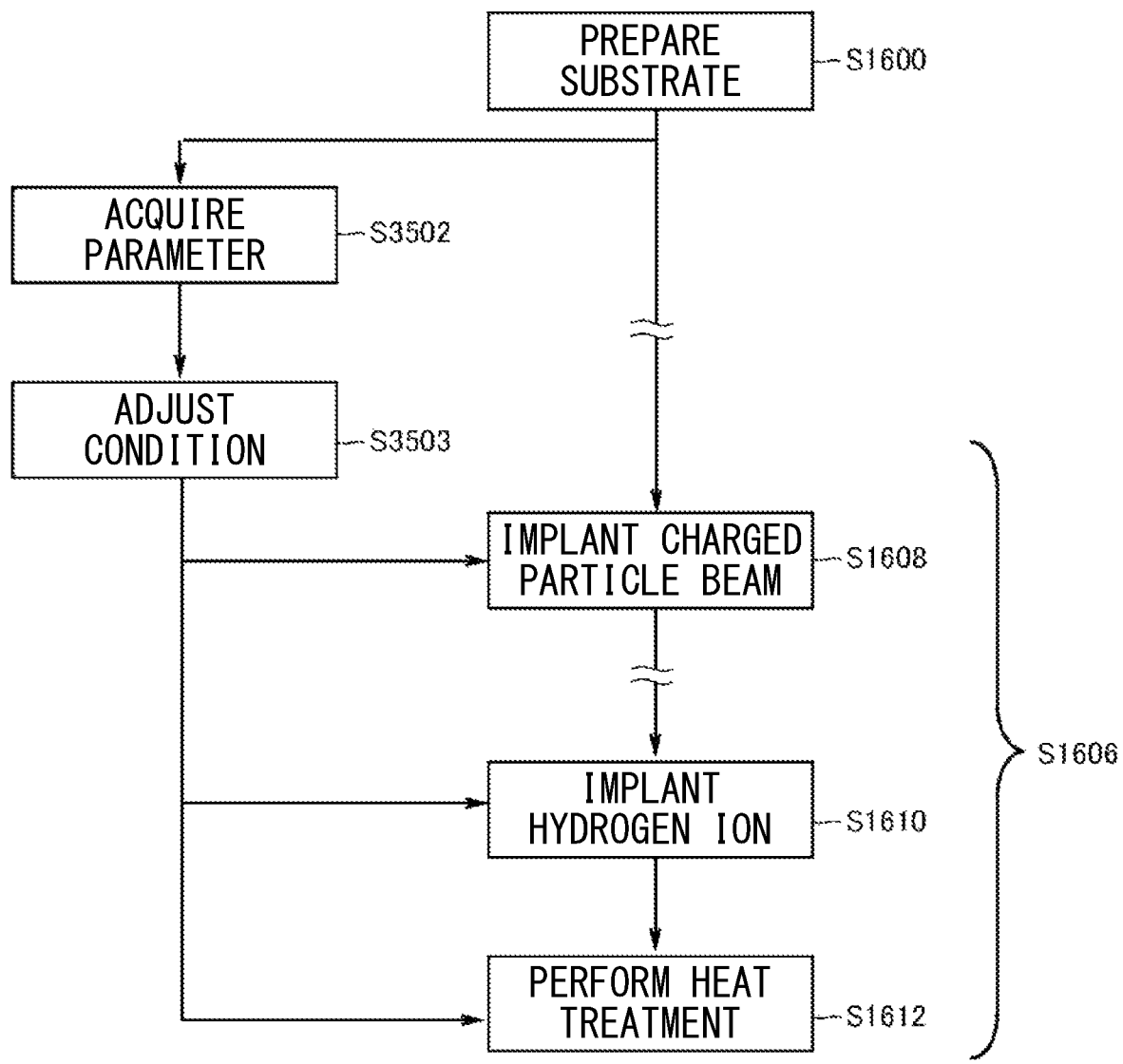
FIG. 35 is a diagram illustrating another example of the manufacturing method of the semiconductor apparatus 100.

FIG. 35 is a diagram illustrating another example of the manufacturing method of the semiconductor apparatus 100. The manufacturing method of this example is different in that a parameter acquiring step S3502 and a condition adjusting step S3503 are included instead of the concentration measuring step S1602 and the implantation amount calculating step S1604 in the example described in FIG. 16 to FIG. 34C. The other steps are similar to the examples described in FIG. 16 to FIG. 34C. Although the oxygen introducing step S1802 is not illustrated in FIG. 35, the manufacturing method of this example may or may not include the oxygen introducing step S1802 described in FIG. 18.

In the parameter acquiring step S3502, parameters related to the semiconductor substrate 10 prepared in the substrate preparing step S1600 are acquired. The concentration measuring step S1602 described in FIG. 16 and the like is an example of the parameter acquiring step S3502. The parameters may include a parameter such as the oxygen chemical concentration, the carbon chemical concentration, or the like described in FIG. 16 to FIG. 34C. In the parameter acquiring step S3502, a parameter related to the semiconductor substrate 10 may be measured, and a specification value, a design value, or the like of the semiconductor substrate 10 may be acquired. In the parameter acquiring step S3502, a parameter that affects the hydrogen donor concentration of the semiconductor substrate 10 or a parameter that affects the breakdown voltage of the semiconductor apparatus 100 may be acquired. In the parameter acquiring step S3502, at least one of the oxygen chemical concentration, the carbon chemical concentration, the oxygen contribution ratio $\xi$, and the carbon contribution ratio $\eta$ contained in the semiconductor substrate 10 may be acquired. These parameters may affect the hydrogen donor concentration and the breakdown voltage of the semiconductor apparatus 100. In the parameter acquiring step S3502, at least one of the thickness of the semiconductor substrate 10 and the bulk donor concentration may be acquired. These parameters may affect the breakdown voltage of the semiconductor apparatus 100.

In the condition adjusting step S3503, one or a plurality of conditions of the particle implantation condition in the particle implanting step S1608, the hydrogen implantation condition in the hydrogen implanting step S1610, and the heat treatment condition in the heat treatment step S1612 are adjusted on the basis of at least one parameter acquired in the parameter acquiring step S3502. In the condition adjusting step S3503, these conditions may be adjusted so that the hydrogen donor concentration of the semiconductor substrate 10 or the breakdown voltage of the semiconductor apparatus 100 approaches a predetermined target value. The implantation amount calculating step S1604 in FIG. 16 and the like is an example of the condition adjusting step S3503. The particle implantation condition includes at least one of the dose amount of charged particles and the implantation depth Z1 (see, for example, FIG. 2). The hydrogen implantation condition includes at least one of a dose amount of hydrogen ions and the implantation depth Z2 (see, for example, FIG. 2). The heat treatment condition includes at least one of a heat treatment temperature and a heat treatment time.

For example, in a case where the parameters acquired in the parameter acquiring step S3502 indicate a state in which it is difficult to generate a hydrogen donor in the semiconductor substrate 10, in the condition adjusting step S3503, the condition of each step is adjusted to a condition for promoting the generation of a hydrogen donor in the semiconductor substrate 10. For example, if the oxygen chemical concentration of the semiconductor substrate 10 is low, VOH defects are less likely to be generated. On the other hand, increasing the dose amount of the charged particle beam in the particle implanting step S1608, increasing the dose amount of hydrogen ions in the hydrogen implanting step S1610, increasing the heat treatment temperature in the heat treatment step S1612, and increasing the heat treatment time in the heat treatment step S1612 all promote the generation of VOH defects. The condition adjusting step S3503 may perform at least one of these processes. Similarly, if the oxygen chemical concentration of the semiconductor substrate 10 is high, VOH defects are likely to be generated. On the other hand, lowering the dose amount of the charged particle beam in the particle implanting step S1608, lowering the dose amount of hydrogen ions in the hydrogen implanting step S1610, lowering the heat treatment temperature in the heat treatment step S1612, and shortening the heat treatment time in the heat treatment step S1612 all suppress generation of VOH defects. In the condition adjusting step S3503, one of these processes may be performed, or a plurality of processes may be performed in combination. In addition, if the carbon chemical concentration of the semiconductor substrate 10 is high, VOH defects tend to be easily generated, and if the carbon chemical concentration is low, VOH defects tend to be hardly generated. The oxygen contribution ratio $\xi$ and the carbon contribution ratio $\eta$ are as described above. The condition adjusting step S3503 may perform the same processing as the oxygen chemical concentration on the basis of these parameters.

Further, in a case where the parameter acquired in the parameter acquiring step S3502 indicates a state in which the breakdown voltage of the semiconductor apparatus 100 decreases, the condition of each step is adjusted to a condition for improving the breakdown voltage of the semiconductor apparatus 100 in the condition adjusting step S3503. For example, if the thickness of the semiconductor substrate 10 is small, the breakdown voltage of the semiconductor apparatus 100 decreases. On the other hand, if the concentration of hydrogen donors generated in the semiconductor substrate 10 is lowered, for example, the doping concentration of the drift region 18 is lowered. As a result, the breakdown voltage of the semiconductor apparatus 100 is improved. By lowering the dose amount of charged particles or the dose amount of hydrogen ions, the concentration of hydrogen donors can be lowered. In addition, the concentration of hydrogen donors can be lowered by lowering the heat treatment temperature or shortening the heat treatment time. If the length of the pass-through region 106 in the semiconductor substrate 10 in the Z axis direction is reduced, the length of the high-concentration flat portion 150 (see FIG. 3) in the Z axis direction is reduced. As a result, the breakdown voltage of the semiconductor apparatus 100 is improved. The length of the pass-through region 106 can be shortened by bringing the implantation position Z1 of charged particles close to the lower surface 23. In the condition adjusting step S3503, one of these processes may be performed, or a plurality of processes may be performed in combination.

In addition, if the bulk donor concentration $N_{B0}$ of the semiconductor substrate 10 is high, the doping concentration of the drift region 18 increases, and the breakdown voltage of the semiconductor apparatus 100 decreases. In the condition adjusting step S3503, the same processing as the hydrogen donors of the semiconductor substrate 10 may be performed also on the bulk donor concentration $N_{B0}$.

In the condition adjusting step S3503, the condition of each step may be adjusted on the basis of a difference or a ratio between the acquired parameter and a preset reference value. How much the condition of each step should be adjusted with respect to the difference and the ratio may be determined in advance by an experiment or the like. As described above, the characteristics of the semiconductor apparatus 100 can be adjusted by adjusting the conditions of each step on the basis of the acquired parameters. In addition, variations in characteristics of the semiconductor apparatus 100 can be reduced.

Figure 36:
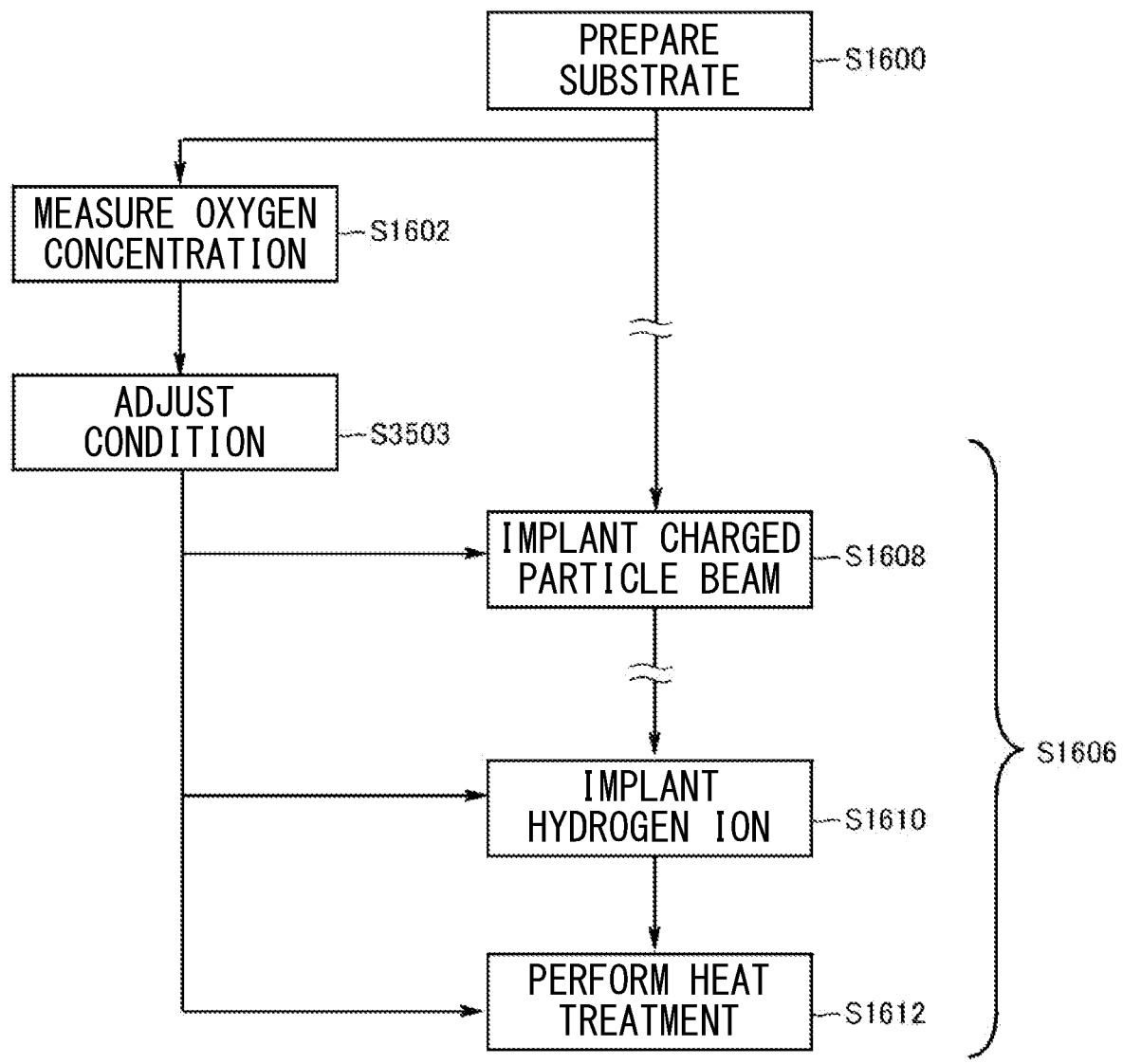
FIG. 36 is a diagram illustrating another example of the manufacturing method of the semiconductor apparatus 100.

FIG. 36 is a diagram illustrating another example of the manufacturing method of the semiconductor apparatus 100. In the manufacturing method of this example, the concentration measuring step S1602 is performed as a parameter acquiring step S3502 in FIG. 35. The other steps are the same as in the example of FIG. 35. In the concentration measuring step S1602, the oxygen chemical concentration of the semiconductor substrate 10 is measured as in the example of FIG. 16 and the like.

In the condition adjusting step S3503, at least one of the implantation condition of the charged particle beam in the particle implanting step S1608, the implantation condition of hydrogen ions in the hydrogen implanting step S1610, and the heat treatment condition in the heat treatment step S1612 is adjusted according to the oxygen chemical concentration. In the condition adjusting step S3503, the implantation condition of the charged particle beam may be adjusted similar to the example of FIG. 16 and the like.

In a case where the implantation condition of hydrogen ions in the hydrogen implanting step S1610 is adjusted, the dose amount of hydrogen ions may be adjusted. By adjusting the dose amount of hydrogen ions, the concentration of hydrogen diffusing into the pass-through region 106 can be adjusted, and the concentration of hydrogen donors generated in the pass-through region 106 can be adjusted. In the condition adjusting step S3503, the dose amount of hydrogen ions may be made lower than the hydrogen reference value in a case where the oxygen chemical concentration is higher than the oxygen reference value, and the dose amount of hydrogen ions may be made higher than the hydrogen reference value in a case where the oxygen chemical concentration is lower than the oxygen reference value. As a result, the influence of the variation in the oxygen chemical concentration can be reduced, and the doping concentration of the pass-through region 106 can be accurately adjusted.

In a case where the heat treatment condition in the heat treatment step S1612 is adjusted, at least one of the heat treatment temperature and the heat treatment time may be adjusted. By adjusting the heat treatment temperature or the heat treatment time, hydrogen diffusion into the pass-through region 106 can be adjusted, and generation of hydrogen donors can be adjusted. In the condition adjusting step S3503, the heat treatment temperature may be made lower than the temperature reference value in a case where the oxygen chemical concentration is higher than the oxygen reference value, and the heat treatment temperature may be made higher than the temperature reference value in a case where the oxygen chemical concentration is lower than the oxygen reference value. Similarly, in a case where the oxygen chemical concentration is higher than the oxygen reference value, the heat treatment time may be made shorter than the time reference value, and in a case where the oxygen chemical concentration is lower than the oxygen reference value, the heat treatment time may be made longer than the time reference value. As a result, the influence of the variation in the oxygen chemical concentration can be reduced, and the doping concentration of the pass-through region 106 can be accurately adjusted.

In the concentration measuring step S1602, the carbon chemical concentration of the semiconductor substrate 10 may be further measured as in the example of FIG. 29. In the condition adjusting step S3503, the condition of each step may be adjusted further on the basis of the carbon chemical concentration. The higher the carbon chemical concentration, the higher the concentration of hydrogen donors tends to be. In the condition adjusting step S3503, the condition may be adjusted so as to suppress the formation of the hydrogen donor in a case where the carbon chemical concentration is higher than the carbon reference value, and the condition may be adjusted so as to promote the formation of the hydrogen donor in a case where the carbon chemical concentration is lower than the carbon reference value.

In the condition adjusting step S3503, the implantation condition of hydrogen ions in the hydrogen implanting step S1610 and the heat treatment condition in the heat treatment step S1612 may be adjusted on the basis of the implantation depth Z1 of the charged particle beam in the particle implanting step S1608. The length of the pass-through region 106 changes according to the implantation depth Z1 of the charged particle beam, and the total amount of lattice defects formed inside the semiconductor substrate 10 changes. The total formation amount of hydrogen donors depends on the total amount of lattice defects. Therefore, the total formation amount of hydrogen donors changes according to the implantation depth Z1 of the charged particle beam. In the condition adjusting step S3503, at least one of the implantation condition of hydrogen ions and the heat treatment condition may be adjusted so that the total formation amount of hydrogen donors approaches a predetermined reference value. In the condition adjusting step S3503, the implantation condition of hydrogen ions or the heat treatment condition calculated according to the oxygen chemical concentration may be corrected on the basis of the implantation depth Z1 of the charged particle beam.

In the case of manufacturing the plurality of semiconductor apparatuses 100, the adjustment of the implantation condition in the particle implanting step S1608 and the adjustment of the implantation condition in the hydrogen implanting step S1610 may be performed for each semiconductor substrate 10 (for each semiconductor apparatus 100). In addition, the adjustment of the heat treatment condition in the heat treatment step S1612 may be performed in common for the plurality of semiconductor substrates 10. The heat treatment on the plurality of semiconductor substrates 10 may be performed in parallel by putting the plurality of semiconductor substrates 10 into a common heat treatment furnace. Implantation of charged particles or hydrogen ions into each semiconductor substrate 10 may be performed for each semiconductor substrate 10. By such processing, adjustment to the plurality of semiconductor substrates 10 can be efficiently performed.

Figure 37:
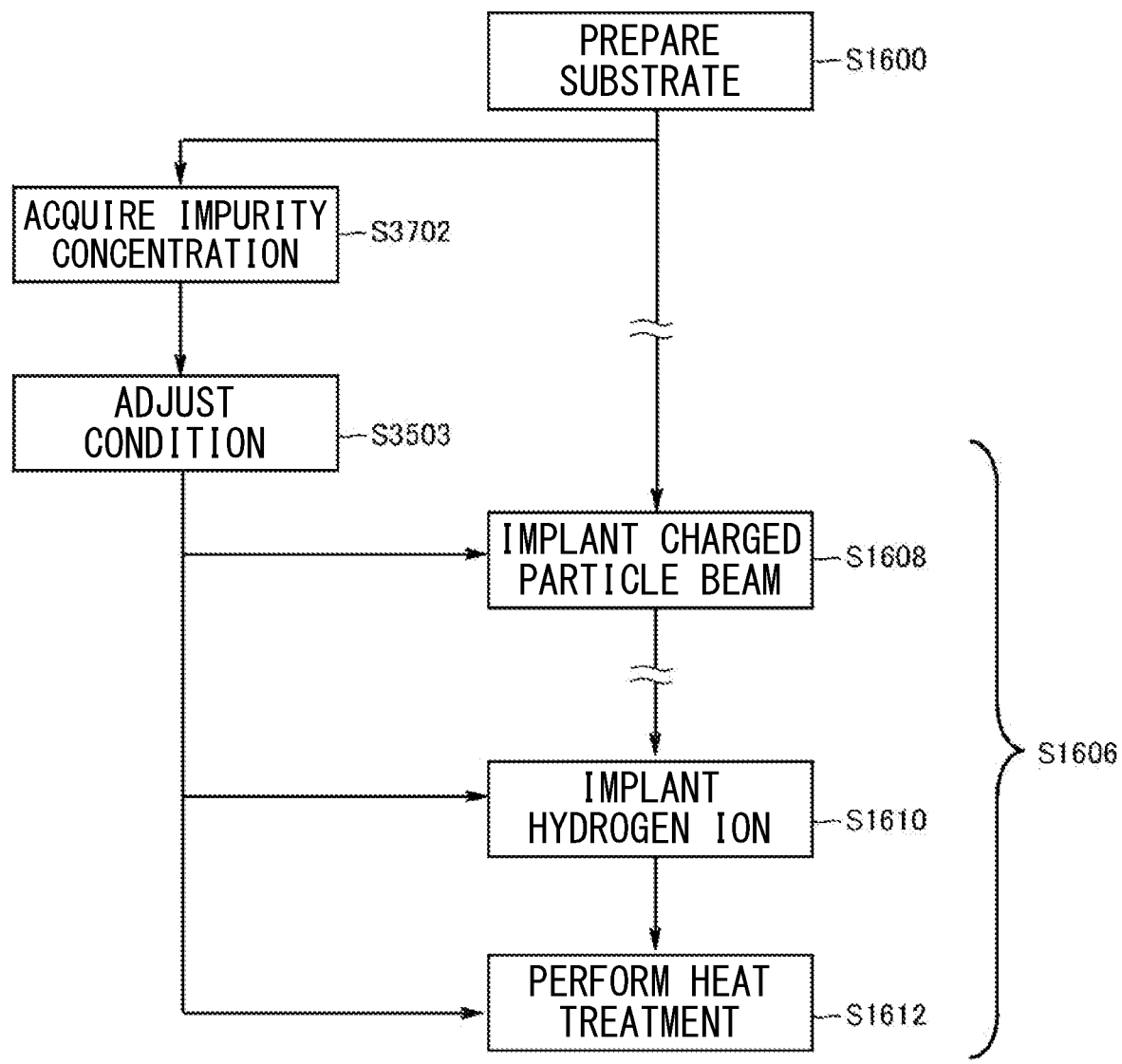
FIG. 37 is a diagram illustrating another example of the manufacturing method of the semiconductor apparatus 100.

FIG. 37 is a diagram illustrating another example of the manufacturing method of the semiconductor apparatus 100. In the manufacturing method of this example, a concentration acquiring step S3702 is performed as the parameter acquiring step S3502 in FIG. 35. The other steps are the same as in the example of FIG. 35 or FIG. 36.

In the concentration acquiring step S3702, information on the impurity concentration in a predetermined region of the semiconductor substrate 10 is acquired. In the concentration acquiring step S3702, the information may be acquired by measuring the semiconductor substrate 10, or a design value, a specification value, or the like of the information of the semiconductor substrate 10 may be acquired. The predetermined region of the semiconductor substrate 10 is, for example, a central position of the semiconductor substrate 10 in the depth direction, but is not limited thereto. The impurity concentration in the upper surface 21 or the lower surface 23 of the semiconductor substrate 10 may be acquired. In the concentration acquiring step S3702, the impurity concentration that affects the doping concentration of the drift region 18 at the time when the semiconductor apparatus 100 is completed may be acquired. As an example, in the concentration acquiring step S3702, at least one of the oxygen chemical concentration, the carbon chemical concentration, and the bulk donor concentration $N_{B0}$ is acquired. The processing of the condition adjusting step S3503 in a case where the oxygen chemical concentration or the carbon chemical concentration is acquired may be the same as in the example of FIG. 36.

In the condition adjusting step S3503 of this example, at least one of the implantation condition of the charged particle beam in the particle implanting step S1608, the implantation condition of hydrogen ions in the hydrogen implanting step S1610, and the heat treatment condition in the heat treatment step S1612 is adjusted on the basis of the bulk donor concentration $N_{B0}$.

The final doping concentration of the drift region 18 in a state where the manufacturing of the semiconductor apparatus 100 is completed depends on the bulk donor concentration $N_{B0}$ and the hydrogen donor concentration. Therefore, if the bulk donor concentration $N_{B0}$ varies, the final doping concentration also varies. In the condition adjusting step S3503, the condition of each step is adjusted so as to offset the deviation between the bulk donor concentration $N_{B0}$ and a predetermined bulk reference value. That is, in the condition adjusting step S3503, in a case where the bulk donor concentration $N_{B0}$ is smaller than the bulk reference value, the condition of each step is adjusted so that the production amount of hydrogen donors increases, and in a case where the bulk donor concentration $N_{B0}$ is larger than the bulk reference value, the condition of each step is adjusted so that the production amount of hydrogen donors decreases. The method for adjusting the production amount of hydrogen donors in each step is the same as in the examples of FIG. 35 and FIG. 36. This can reduce variations in final doping concentration.

In the condition adjusting step S3503, each condition may be adjusted so that the integral value of the doping concentration of the drift region 18 approaches a predetermined reference value. As an example, the condition adjusting step S3503 adjusts the implantation depth of the charged particle beam in the particle implanting step S1608 on the basis of the acquired impurity concentration. The length of the pass-through region 106 is adjusted by adjusting the implantation depth so that the integral value of the doping concentration of the drift region 18 can be adjusted.

In the condition adjusting step S3503, the condition of each step may be adjusted further on the basis of at least one of the oxygen contribution ratio $\xi$ and the carbon contribution ratio $\eta$. This makes it possible to more accurately adjust the formation amount of hydrogen donors.

Figure 38:
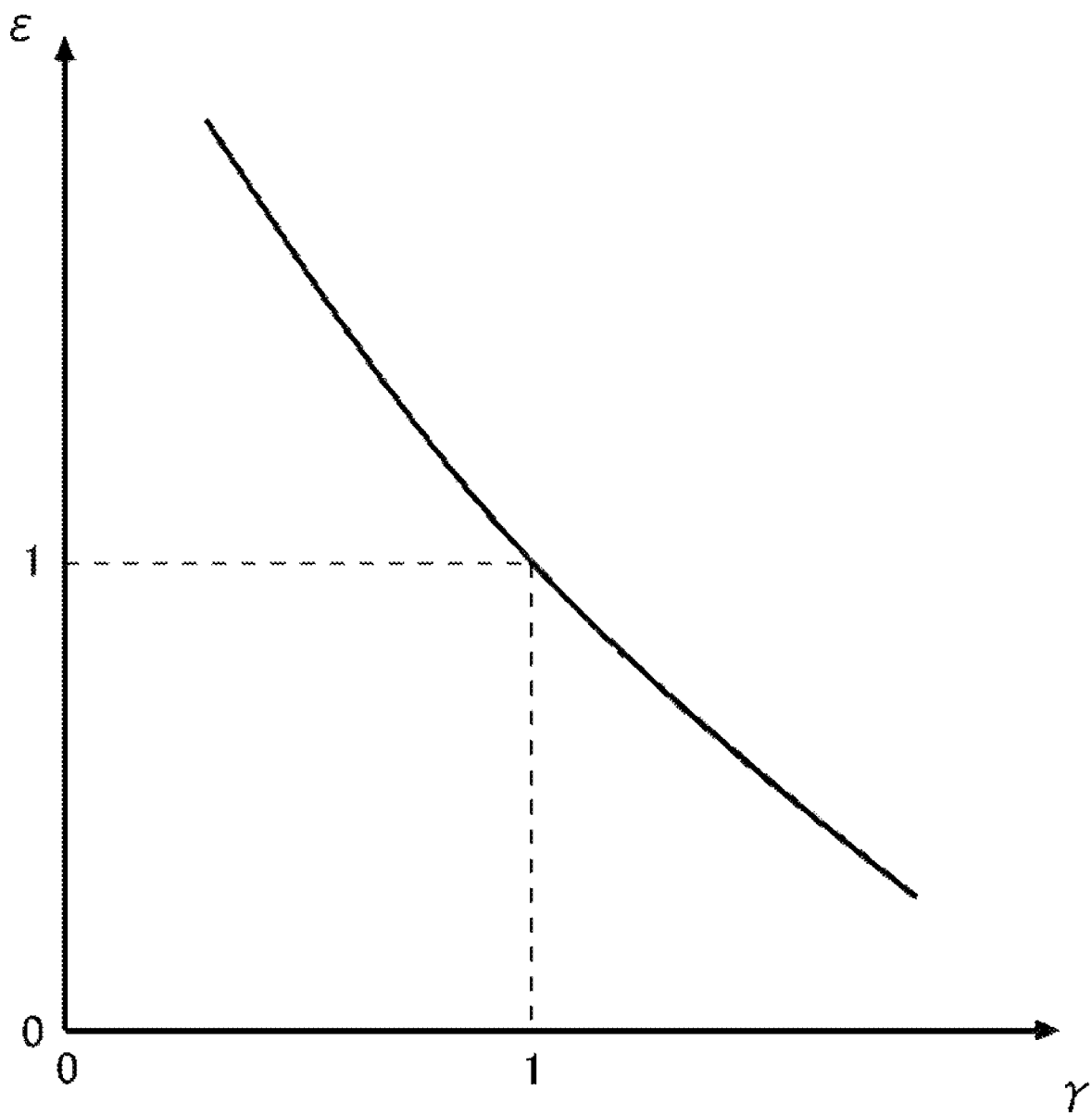
FIG. 38 is a diagram illustrating a relationship between a bulk donor concentration and an implantation depth Z1 of charged particles.

FIG. 38 is a diagram illustrating a relationship between the bulk donor concentration and the implantation depth Z1 of the charged particles. In this example, the bulk donor concentration acquired in the concentration acquiring step S3702 is set to $N_{B0}$, the bulk reference value is set to $N_{Br}$, and the ratio between $N_{B0}$ and $N_{Br}$ is set to $\gamma$. That is, $N_{B0}=\gamma \cdot N_{Br}$. In addition, the implantation depth of charged particles before condition adjustment is $Z1_r$, the implantation depth of charged particles after condition adjustment is $Z1$, and the ratio between $Z1$ and $Z1_r$ is $\varepsilon$. That is, $Z1=\varepsilon \cdot Z1_r$. The implantation depth Z indicates a distance from the lower surface 23 of the semiconductor substrate 10 to the implantation position.

As illustrated in FIG. 38, in the condition adjusting step S3503, the implantation depth Z1 of charged particles is adjusted such that $\varepsilon$ decreases as $\gamma$ increases. The bulk donor concentration $N_{B0}$ illustrated in FIG. 13 increases as $\gamma$ increases. For this reason, the doping concentration of the drift region 18 may increase, and the breakdown voltage of the semiconductor substrate 10 may decrease. On the other hand, by reducing E to approach the implantation depth Z1 and the lower surface 23, the length in which the high-concentration flat portion 150 is formed can be shortened, so that the integral value of the doping concentration in the drift region 18 can be reduced. This makes it possible to suppress a decrease in breakdown voltage of the semiconductor substrate 10.

Figure 39:
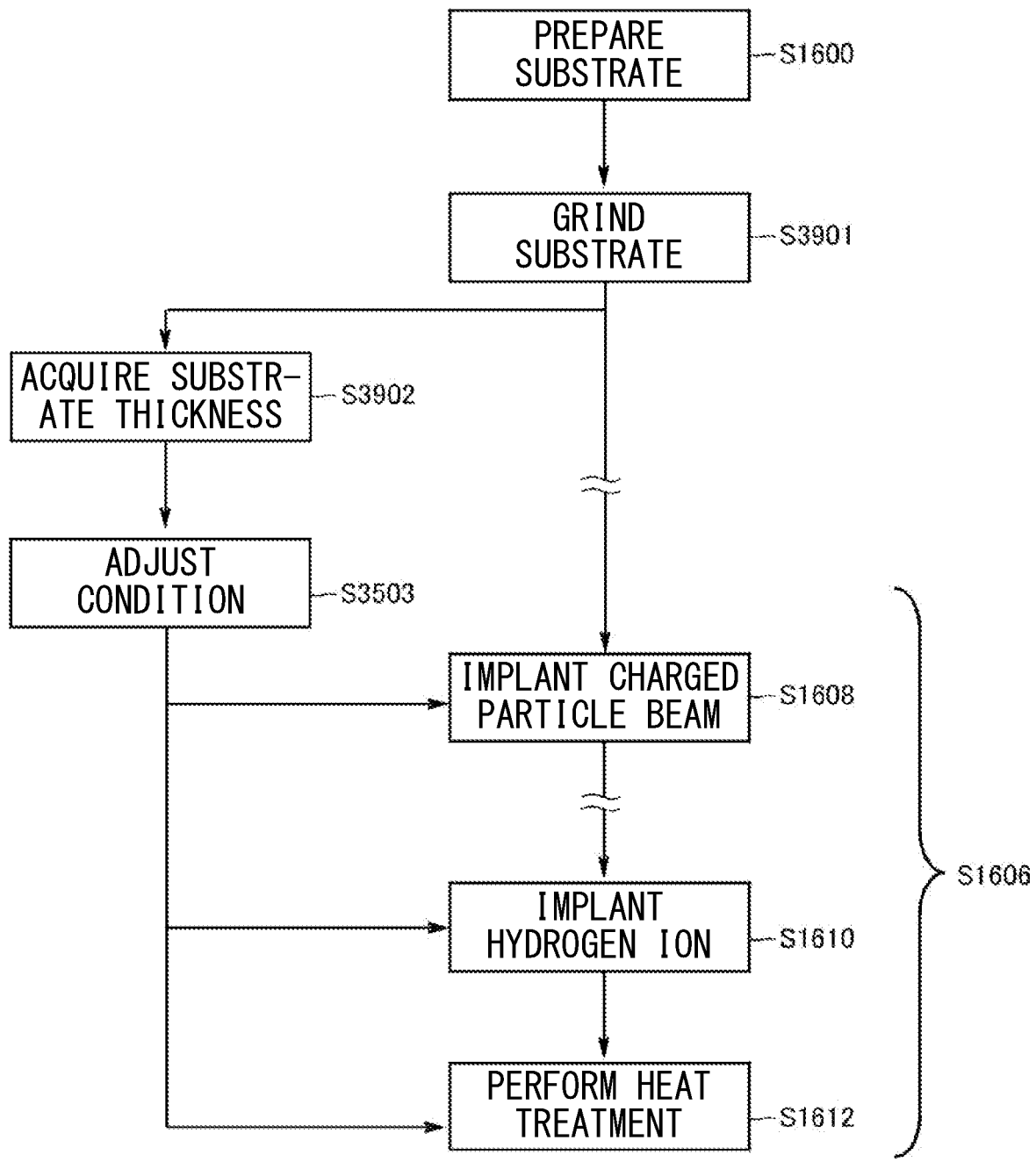
FIG. 39 is a diagram illustrating another example of the manufacturing method of the semiconductor apparatus 100.

FIG. 39 is a diagram illustrating another example of the manufacturing method of the semiconductor apparatus 100. In the manufacturing method of this example, a substrate thickness measuring step S3902 is performed as the parameter acquiring step S3502 in FIG. 35. In addition, a grinding step S3901 of grinding the semiconductor substrate 10 to adjust the thickness is provided before the substrate thickness measuring step S3902. The other steps are the same as in the example of FIG. 35, FIG. 36, or FIG. 37.

In the grinding step S3901, the thickness of the semiconductor substrate 10 may be adjusted according to the breakdown voltage that the semiconductor apparatus 100 should have. The grinding step S3901 may precede the particle implanting step S1608 or may precede the hydrogen implanting step S1610. In the grinding step S3901, the lower surface 23 of the semiconductor substrate 10 may be ground by CMP or the like.

In the substrate thickness measuring step S3902, the thickness in a predetermined region of the semiconductor substrate 10 is measured. In the substrate thickness measuring step S3902, an average value of thicknesses measured at a plurality of points may be used. In the substrate thickness measuring step S3902, the thickness in the active portion 160 may be measured, and the thickness in the edge termination structure portion 90 may be measured.

In the condition adjusting step S3503, at least one of the implantation condition of the charged particle beam in the particle implanting step S1608, the implantation condition of hydrogen ions in the hydrogen implanting step S1610, and the heat treatment condition in the heat treatment step S1612 is adjusted on the basis of the measured thickness of the semiconductor substrate 10.

If the thickness of the semiconductor substrate 10 varies, the breakdown voltage of the semiconductor apparatus 100 may vary. In the condition adjusting step S3503, the condition of each step is adjusted so as to offset the deviation between the thickness of the semiconductor substrate 10 and the predetermined thickness reference value. That is, in the condition adjusting step S3503, in a case where the thickness of the semiconductor substrate 10 is smaller than the thickness reference value, the condition of each step is adjusted so that the breakdown voltage increases, and in a case where the thickness of the semiconductor substrate 10 is larger than the thickness reference value, the condition of each step is adjusted so that the breakdown voltage decreases. The breakdown voltage of the semiconductor apparatus 100 can be increased by reducing the integral value of the doping concentration in the drift region 18, and the breakdown voltage of the semiconductor apparatus 100 can be decreased by increasing the integral value. The integral value of the doping concentration can be adjusted by the formation amount of hydrogen donors in the drift region 18. As described above, the formation amount of the hydrogen donor can be adjusted by the condition of each step.

In this example, the thickness of the semiconductor substrate 10 in the edge termination structure portion 90 may be measured to adjust each implantation condition for the edge termination structure portion 90. The active portion 160 and the edge termination structure portion 90 may have different implantation conditions of charged particles and hydrogen ions. As a result, the doping concentration and the breakdown voltage in the edge termination structure portion 90 can be accurately controlled.

Figure 40:
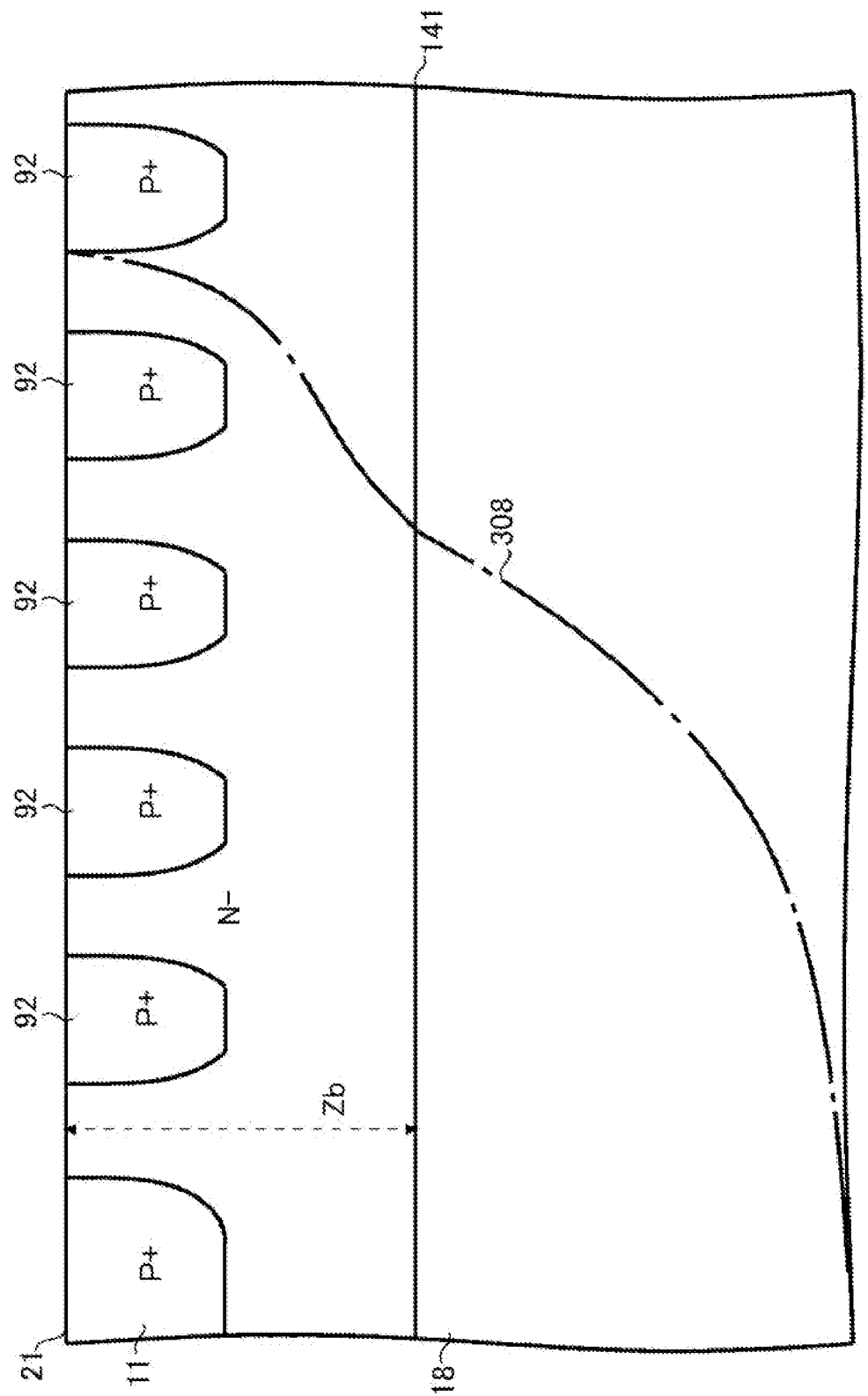
FIG. 40 is a diagram illustrating an example of an equipotential surface 308 in an edge termination structure portion 90.

FIG. 40 is a diagram illustrating an example of the equipotential surface 308 in the edge termination structure portion 90. The structure of the edge termination structure portion 90 is the same as in the example of FIG. 14. A region having a higher concentration than the bulk donor concentration is formed on the lower surface 23 side than the second peak 141. Therefore, the equipotential surface 308 changes in curvature in the vicinity of the second peak 141. As a result, the equipotential surface 308 spreads to the outer peripheral side of the semiconductor apparatus 100 in the vicinity of the upper surface 21 of the semiconductor substrate 10. Therefore, how much the equipotential surface 308 is widened to the outer peripheral side of the semiconductor apparatus 100 depends on a distance Zb between the upper surface 21 of the semiconductor substrate 10 and the second peak 141.

In the condition adjusting step S3503, the implantation depth Z1 of the charged particles into the edge termination structure portion 90 may be adjusted on the basis of the thickness of the semiconductor substrate 10 in the edge termination structure portion 90. As a result, the distance Zb can be accurately controlled. Therefore, it is possible to suppress the depletion layer in the edge termination structure portion 90 from being excessively widened in the lateral direction. Therefore, the length in the outer circumferential direction of the edge termination structure portion 90 can be shortened, and the area of the upper surface 21 of the semiconductor apparatus 100 can be reduced.

In the condition adjusting step S3503, each implantation condition for the edge termination structure portion 90 may be adjusted. As a result, the doping concentration below the second peak 141 can be accurately adjusted, so that the manner of widening the equipotential surface 308 can be further controlled.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that modes to which such changes or improvements are added can also be included in the technical scope of the present invention.

It should be noted that the order of execution of each processing such as operations, procedures, steps, and stages in the devices, systems, programs, and methods illustrated in the claims, the specification, and the drawings can be realized in any order unless "before", "prior to", or the like is specifically stated, and unless the output of the previous processing is used in the later processing. Even if the operation flow in the claims, the specification, and the drawings is described using "First,", "Next,", and the like for convenience, it does not mean that it is essential to perform in this order.

What is claimed is:

1. A semiconductor apparatus comprising:
   a semiconductor substrate having an upper surface and a lower surface and containing oxygen;
   a first peak of a hydrogen chemical concentration disposed on the lower surface side of the semiconductor substrate; and
   a flat portion disposed on the upper surface side of the semiconductor substrate with respect to the first peak, containing a hydrogen donor, and having a substantially flat donor concentration distribution in a depth direction of the semiconductor substrate,
wherein
an oxygen contribution ratio indicating a ratio of an oxygen chemical concentration contributing to generation of the hydrogen donor in the oxygen chemical concentration of the oxygen ranges from $1\times10^{-5}$ to $7\times10^{-4}$,
a concentration of the oxygen contributing to generation of the hydrogen donor in the flat portion is lower than the hydrogen chemical concentration, and
a hydrogen donor concentration in the flat portion ranges from $2\times10^{12}/cm^3$ to $5\times10^{14}/cm^3$.

2. The semiconductor apparatus according to claim 1, wherein
the semiconductor substrate contains a bulk donor, and
a donor concentration of the flat portion is higher than a bulk donor concentration.

3. The semiconductor apparatus according to claim 2, wherein
a sum of a value obtained by multiplying an oxygen chemical concentration in the flat portion by the oxygen contribution ratio and a vacancy concentration of the flat portion is defined as a first value of the hydrogen donor concentration,
a difference obtained by subtracting the bulk donor concentration from a donor concentration of the flat portion is defined as a second value of the hydrogen donor concentration, and
a ratio of the first value of the hydrogen donor concentration to the second value of the hydrogen donor concentration ranges from 0.1 to 10.

4. The semiconductor apparatus according to claim 1, further comprising:
a second peak of a chemical concentration of hydrogen or helium disposed on the upper surface side of the semiconductor substrate,
wherein the flat portion is disposed closer to the lower surface side of the semiconductor substrate than the second peak.

5. The semiconductor apparatus according to claim 1, wherein
a hydrogen contribution ratio indicating a ratio of the hydrogen chemical concentration contributing to generation of the hydrogen donor in the hydrogen chemical concentration ranges from 0.001 to 0.3.

6. The semiconductor apparatus according to claim 1, wherein
a vacancy concentration of the flat portion ranges from $1\times10^{11}/cm^3$ to $1\times10^{14}/cm^3$.

7. The semiconductor apparatus according to claim 1, wherein
the oxygen contribution ratio is $5\times10^{-4}$ or less.

8. The semiconductor apparatus according to claim 1, wherein
the oxygen contribution ratio is $1\times10^{-4}$ or more.

9. The semiconductor apparatus according to claim 4, wherein
the hydrogen chemical concentration of the first peak is higher than the hydrogen chemical concentration of the second peak.

10. The semiconductor apparatus according to claim 1, wherein
an oxygen chemical concentration in the flat portion is $1\times10^{17}$ atoms/$cm^3$ or more.

11. The semiconductor apparatus according to claim 1, wherein
a carbon chemical concentration in the flat portion ranges from $1\times10^{13}$ atoms/$cm^3$ to $1\times10^{16}$ atoms/$cm^3$.

12. A semiconductor apparatus comprising:
a semiconductor substrate having an upper surface and a lower surface and containing oxygen;
a first peak of a hydrogen chemical concentration disposed on the lower surface side of the semiconductor substrate; and
a flat portion disposed on the upper surface side of the semiconductor substrate with respect to the first peak, containing a hydrogen donor, and having a substantially flat donor concentration distribution in a depth direction of the semiconductor substrate,
wherein
the semiconductor substrate contains a bulk donor,
a donor concentration of the flat portion is higher than a bulk donor concentration,
a sum of a value obtained by multiplying an oxygen chemical concentration in the flat portion by an oxygen contribution ratio indicating a ratio of the oxygen chemical concentration contributing to generation of the hydrogen donor in the oxygen chemical concentration of the oxygen and a vacancy concentration of the flat portion is defined as a first value of a hydrogen donor concentration,
a difference obtained by subtracting the bulk donor concentration from a donor concentration of the flat portion is defined as a second value of the hydrogen donor concentration, and
a ratio of the first value of the hydrogen donor concentration to the second value of the hydrogen donor concentration ranges from 0.1 to 10.

13. A semiconductor apparatus comprising:
a semiconductor substrate having an upper surface and a lower surface and containing oxygen and carbon;
a first peak of a hydrogen chemical concentration disposed on the lower surface side of the semiconductor substrate; and
a flat portion disposed on the upper surface side of the semiconductor substrate with respect to the first peak, containing a hydrogen donor, and having a substantially flat donor concentration distribution in a depth direction of the semiconductor substrate,
wherein
the semiconductor substrate contains a bulk donor,
a donor concentration of the flat portion is higher than a bulk donor concentration,
a sum of a value obtained by multiplying an oxygen chemical concentration in the flat portion by an oxygen contribution ratio indicating a ratio of the oxygen chemical concentration contributing to generation of the hydrogen donor in the oxygen chemical concentration of the oxygen, a value obtained by multiplying a carbon chemical concentration in the flat portion by a carbon contribution ratio indicating a ratio of the carbon chemical concentration contributing to generation of the hydrogen donor in the carbon chemical concentration of the carbon, and a vacancy concentration of the flat portion is defined as a third value of a hydrogen donor concentration,
a difference obtained by subtracting the bulk donor concentration from the donor concentration of the flat portion is defined as a second value of the hydrogen donor concentration, and a ratio of the third value of the hydrogen donor concentration to the second value of the hydrogen donor concentration ranges from 0.1 to 10.

* * * * *